US008985810B2

(12) United States Patent
Woodgate et al.

(10) Patent No.: US 8,985,810 B2
(45) Date of Patent: Mar. 24, 2015

(54) ILLUMINATION APPARATUS

(75) Inventors: Graham John Woodgate, Henley-on-Thames (GB); Jonathan Harrold, Warwick (GB)

(73) Assignee: Optovate Limited, Oxfordshire (GB)

( * ) Notice: Subject to any disclaimer, the term of this patent is extended or adjusted under 35 U.S.C. 154(b) by 680 days.

(21) Appl. No.: 12/922,841

(22) PCT Filed: Oct. 1, 2009

(86) PCT No.: PCT/GB2009/002340
§ 371 (c)(1),
(2), (4) Date: Sep. 15, 2010

(87) PCT Pub. No.: WO2010/038025
PCT Pub. Date: Apr. 8, 2010

(65) Prior Publication Data
US 2011/0038150 A1    Feb. 17, 2011

(30) Foreign Application Priority Data

Oct. 1, 2008   (GB) .................................. 0817917.8
Apr. 18, 2009  (GB) .................................. 0906714.1

(51) Int. Cl.
*H01L 27/00* (2006.01)
*G02B 19/00* (2006.01)
(Continued)

(52) U.S. Cl.
CPC ............ *G02B 19/0066* (2013.01); *F21K 9/135* (2013.01); *H01L 24/85* (2013.01); *G02B 19/0071* (2013.01); *G02B 19/0028* (2013.01); *H01L 24/78* (2013.01); *H01L 24/95* (2013.01); *F21Y 2101/02* (2013.01); *F21Y 2105/001* (2013.01); *F21Y 2111/005* (2013.01); *H01L 24/75* (2013.01); *H01L 24/83* (2013.01); *H01L 33/58* (2013.01); *H01L 33/60* (2013.01); *H01L 2224/75* (2013.01); *H01L 2224/83801* (2013.01);
(Continued)

(58) Field of Classification Search
CPC . G02B 17/8092; G02B 13/08; G02B 13/0085
USPC ........................................ 362/249.02, 311.02
See application file for complete search history.

(56) References Cited

U.S. PATENT DOCUMENTS 5,317,170 A    5/1994  Paoli
5,337,074 A    8/1994  Thornton
(Continued)

FOREIGN PATENT DOCUMENTS

EP    1 418 628 A1    5/2004
EP    1 515 368 A2    8/2004
(Continued)

OTHER PUBLICATIONS

International Search Report for PCT/GB2009/002340 mailed Apr. 13, 2010.
(Continued)

*Primary Examiner* — Sharon Payne
(74) *Attorney, Agent, or Firm* — Ingrassia Fisher & Lorenz, P.C.

(57) ABSTRACT

An illumination apparatus and method of manufacture of the same in which an array of light-emitting elements is aligned to an array of optical elements to achieve a thin and efficient light source that can also be arranged to provide directional and/or programmable illumination.

58 Claims, 18 Drawing Sheets

(51) Int. Cl.
*F21K 99/00* (2010.01)
*H01L 23/00* (2006.01)
*F21Y 101/02* (2006.01)
*F21Y 105/00* (2006.01)
*F21Y 111/00* (2006.01)
*H01L 33/58* (2010.01)
*H01L 33/60* (2010.01)
*F21V 5/00* (2006.01)

(52) U.S. Cl.
CPC ............... *H01L 2924/01025* (2013.01); *H01L 2924/01057* (2013.01); *H01L 2924/01079* (2013.01); *H01L 2924/01021* (2013.01); *F21V 5/007* (2013.01); *F21V 5/008* (2013.01); *H01L 2224/85186* (2013.01); *H01L 2224/48091* (2013.01); *H01L 2224/49107* (2013.01); *H01L 2924/10253* (2013.01); *H01L 2224/78* (2013.01)
USPC .............................. 362/249.02; 362/311.02

(56) References Cited

U.S. PATENT DOCUMENTS

| | | | |
|---|---|---|---|
| 5,592,578 | A | 1/1997 | Ruh |
| 6,043,481 | A | 3/2000 | Tan et al. |
| 6,547,423 | B2 | 4/2003 | Marshall et al. |
| 6,961,993 | B2 | 11/2005 | Oohata |
| 7,557,367 | B2 | 7/2009 | Rogers et al. |
| 2002/0140918 | A1 | 10/2002 | Nakamura |
| 2004/0099868 | A1 | 5/2004 | Silverbrook |
| 2004/0161871 | A1 | 8/2004 | Omori |
| 2005/0008052 | A1 | 1/2005 | Nomura et al. |
| 2005/0067944 | A1 | 3/2005 | Masuda et al. |
| 2005/0269947 | A1 | 12/2005 | Kobayashi |
| 2007/0090350 | A1 | 4/2007 | Lee et al. |
| 2007/0256453 | A1 | 11/2007 | Barnes et al. |
| 2008/0043466 | A1 | 2/2008 | Chakmakjian et al. |
| 2008/0157114 | A1 | 7/2008 | Basin et al. |
| 2008/0225523 | A1 | 9/2008 | De Samber et al. |

FOREIGN PATENT DOCUMENTS

| | | |
|---|---|---|
| JP | 56-17384 | 2/1981 |
| JP | 59040543 A | 3/1984 |
| JP | 2007201259 A | 8/2007 |
| WO | 2004068182 A2 | 8/2004 |
| WO | 2006114670 A2 | 11/2006 |
| WO | 2008032275 A1 | 3/2008 |
| WO | 2009003435 A1 | 1/2009 |

OTHER PUBLICATIONS

Search Report for GB0906714.1 conducted Jul. 16, 2009.
Search Report for GB0917237.0 conducted Dec. 3, 2009.
Search Report for GB0917237.0 conducted Jan. 21, 2010.
Search Report for GB0817917.8 conducted Nov. 4, 2008.
SIPO, Chinese Office Action for Application No. 200980139118 dated Mar. 22, 2013.
SIPO, Chinese Office Action for Application No. 200980139118 dated Nov. 2, 2014.

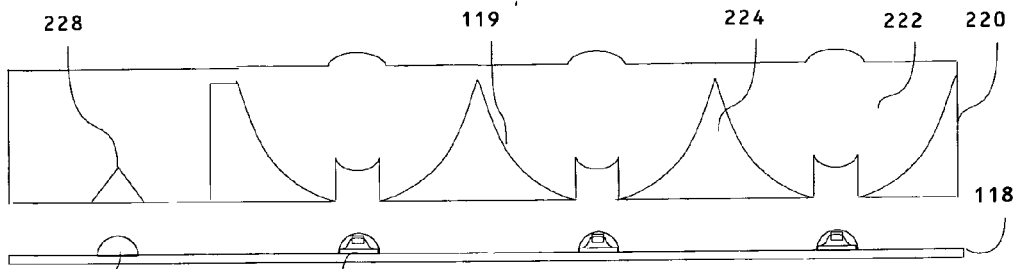
FIG.25a
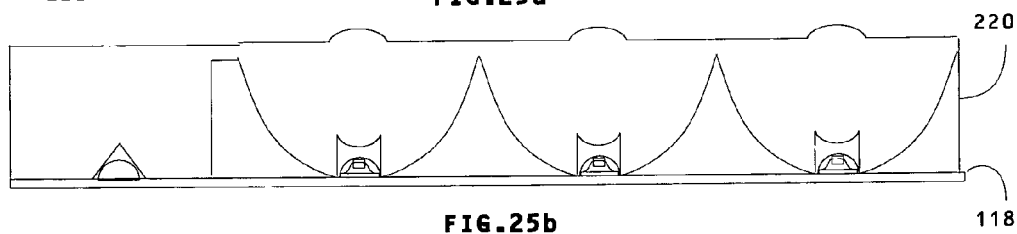
FIG.25b
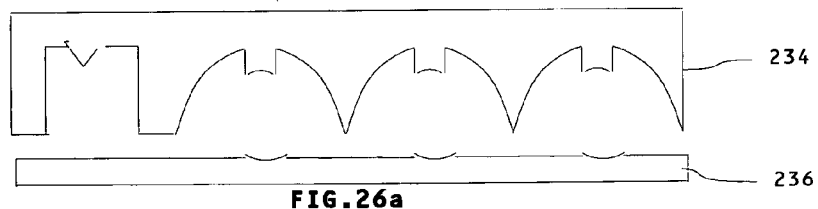
FIG.26a
FIG.26b
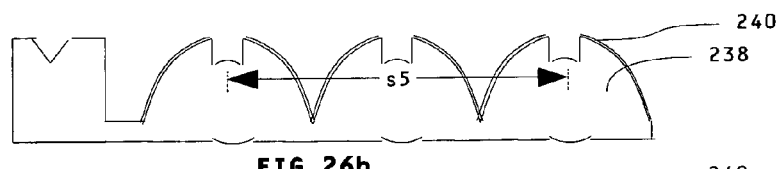
FIG.26c
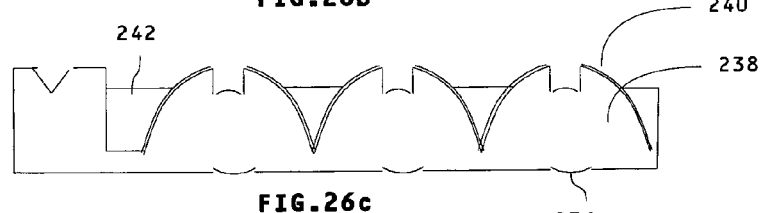
FIG.26d
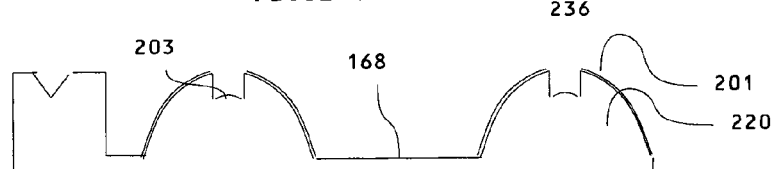
FIG.26e
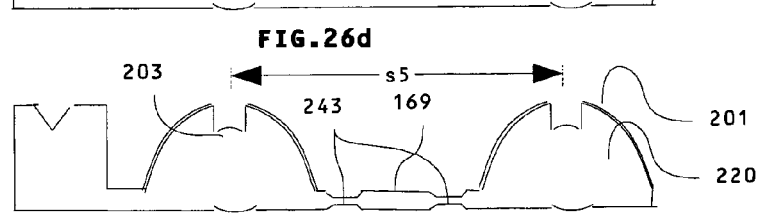

ILLUMINATION APPARATUS

CROSS-REFERENCE TO RELATED APPLICATIONS

This application is a U.S. National-Stage entry under 35 U.S.C. §371 based on International Application No. PCT/GB2009/002340, filed Oct. 1, 2009, which was published under PCT Article 21(2) and which claims priority to Great Britain Application No. 0817917.8, filed Oct. 1, 2008 and Great Britain Application No. 0906714.1, filed Apr. 18, 2009, which are all hereby incorporated in their entirety by reference.

TECHNICAL FIELD

The present invention relates to an illumination apparatus comprising a plurality of light-emitting elements aligned to a plurality of optical elements; and a method for fabrication of the illumination apparatus. Such an apparatus may be used for domestic or professional lighting, for liquid crystal display backlights and for general illumination purposes.

BACKGROUND

Incandescent light sources produce a near black-body optical spectrum, are low cost and can have high reliability. However, such light sources have low efficiency, and are relatively large requiring large light fittings. High intensity discharge lamps are capable of producing high luminous flux from small arc sources and are suitable for projection applications and directional illumination but are bulky. Fluorescent lamps in which a gas discharge generates ultraviolet wavelengths which pumps a fluorescent material to produce visible wavelengths, have improved efficiency compared to incandescent sources, but similarly suffer from a large source size.

Light-emitting diodes (LEDs) formed using semiconductor growth onto monolithic wafers can demonstrate significantly higher levels of efficiency. The source size is defined by the area of LED die, and so in principle can be made of arbitrary size up to the size of the wafer. LEDs are particularly attractive as they offer high levels of efficiency with acceptable CIE Colour Rendering Indices (CRI). Organic light-emitting Diodes (OLEDs) promise similar benefits to wafer type LEDs, and can be formed on arbitrarily large substrates. In this specification LED refers to an unpackaged LED die (chip) extracted directly from a monolithic wafer, i.e. a semiconductor element. This is different from packaged LEDs which have been assembled into a package to facilitate subsequent assembly and may further incorporate optical elements such as a hemispherical structure which increases its size but increases light extraction efficiency.

In lighting applications, the light from the emitter is directed using a luminaire structure to provide the output directionality profile. The angular variation of intensity is termed the directional distribution which in turn produces a light radiation pattern on surfaces in the illuminated environment and is defined by the particular application. Lambertian emitters enable light to the flood a room with light. Such use of light can be inefficient as the light is distributed to parts of the room that may not require illumination, and also can be perceived as providing a wasteful and visually undesirable illumination source. Lambertian emitters can be perceived as providing a flat lighting environment lacking in sparkle which is unattractive to designers.

Non-Lambertian, directional light sources use a relatively small source size lamp such as a tungsten halogen type in a reflector and/or reflective tube luminaire, in order to provide a more directed source. Such lamps efficiently use of the light by directing it to areas of importance. These lamps also produce higher levels of visual sparkle, in which the small source provides specular reflection artefacts, giving a more attractive illumination environment. Further, such lights have low glare, in which the off-axis intensity is substantially lower than the on-axis intensity so that the lamp does not appear uncomfortably bright when viewed from most positions. However, such a lamp combined with its luminaire may have size of order 5 to 10 cm depth and further require a bulky low voltage supply. Such a lamp disadvantageously can require architectural design choices to be made requiring relatively deep recesses. Further, the materials cost of such bulky lamp systems can be high. Further, such sources have low efficiency compared to LED sources.

To further enhance usage efficiency, it would be desirable to be able to adjust the pointing direction of directional light sources. For conventional directional lamps, this typically requires a manual movement of the lamp. This can often be difficult because of the location and surface temperature of the lamp. The alignment of the lamp typically is thus typically set once at installation. To deal with the changing usage patterns in the room, multiple directional lamps are installed giving an inefficient over-illumination of a room.

The colour temperature and CRI of a lamp is an important factor in its use. The colour output is typically fixed at manufacture, and by its operating conditions, such as peak running temperature and lifetime. This means that the adjustment of the white point of a room is typically not possible through the period of a day, in order to match the demands of the activity. For example, it is reported that high colour temperatures can be used to encourage office worker efficiency while lower colour temperatures are well suited to more relaxed room usage, such as evening domestic lighting. Further, the eye is sensitive to small white point changes in an illuminated area so that illumination systems typically need to be selected to a fixed colour temperature in any given environment.

Natural lighting can produce time varying illumination, for example sunlight through a tree canopy providing relatively high resolution time varying patterns. If a room is illuminated by a single time varying source, then this will merely be seen as intensity fluctuations. It would be desirable if the time varying component of intensity varies in structure as opposed to globally. Such an approach would provide dappled illumination.

Liquid crystal display backlights typically use arrays of packaged LEDs or fluorescent lamps coupled to the panel by means of optical waveguiding elements combined with light recirculating films. Further, the directionality of the display can be enhanced by means of brightness enhancement films, such as prismatic layers. Such systems can be 5 mm or less thickness. However, the structures are designed to distribute light uniformly over a large area from small sources, and as such do not function well as compact directional illumination sources. It would be desirable to provide high efficiency directional illumination for example for use as a privacy filter, or to provide high brightness outdoor display function.

Directional LED elements can use reflective optics (including total internal reflective optics) or more typically catadioptric (or tulip) optic type reflectors, as described for example in U.S. Pat. No. 6,547,423. Catadioptric elements employ both refraction and reflection, which may be total internal reflection or reflection from metallised surfaces. A known catadioptric optic system is capable of producing a 6 degree cone half angle (to 50% peak intensity) from a 1×1 mm square light source, with an optical element with 13 mm final output diameter. The increase in source size arises from conservation of brightness (étendue) reasons. Further, such an optical element will have a thickness of approximately 11 mm, providing a bulky illumination apparatus. Increasing the cone angle will reduce the final device area and thickness, but also produces a less directional source.

US2008/0157114 describes a replication system in which multiple hemispherical structures are embossed in a single replication step.

White LED lighting sources can be of separate spectral bands such as red, green, blue and yellow, each created by a separate LED element. Such sources enable users to resolve the separate colours, and with the separation of the sources in the lamp which can create coloured illumination patches. It would be desirable if the sources were homogenized so that their separation was less than the visual resolution limit.

Alternatively, white LEDs can be blue emitters combined with yellow phosphor to produce the desired white output. To achieve the required total luminous output, it is well known that an array of LEDs can be used. For example, a 4×4 array of 1 mm devices separated by 0.3 mm will give a total array size of 4.9×4.9 mm with a Lambertian output. Such a source suffers from the need to have complex heatsinking and cooling arrangements, leading to high device cost and thickness. If this is used in a 6 degree cone angle catadioptric optic, then the output aperture and thickness may be expected to approach 75 mm, similar to that of incandescent lamps. If this is combined with the heat sink, it is clear that directional LED arrays will disadvantageously have substantial bulk. In order to reduce thickness and thus materials cost, such arrays may use one catadioptric optic per LED rather than over a group of LEDs. Prior art systems such as 'pick and place' machines align each LED to each catadioptric optic followed by packing of the catadioptric optic illuminators.

By way of comparison, prior art light sources use small numbers of high flux illumination sources. If one of the sources fails, this produces a noticeable reduction in output flux. In directional sources, this will result in missing areas of illumination. It would be desirable to reduce the visibility of failed sources, thus improving system yield and lifetime. High efficiency prior art LED sources have very high luminance levels from small areas of source. Such high brightness can be uncomfortable to look at directly.

By way of comparison, to produce acceptable illuminance for directional lighting systems, known LEDs are of macroscopic scale; that is they use LEDs typically of size 1×1 mm or greater. Each LED is arranged with a catadioptric optical element to reduce the output solid angle of illumination. Known optical elements have output apertures of size of 13 mm or greater, and thickness of 11 mm or greater for a 6 degrees cone half angle. In this specification, light-emitting element width is the maximum width along one edge for the light emitting regions of square or rectangular light-emitting elements. Light emitting element diameter is the maximum diameter of light-emitting regions for circular or elliptical light-emitting elements.

SUMMARY

The inventors have considered that it might be possible to achieve superior performance for directional lighting systems with arrays of microscopic scale elements; that is using individual light-emitters of width or diameter of less than 300 micrometers, preferably less than 200 micrometers and more preferably less than 100 micrometers, would provide many advantages as will be described. In particular, output aperture sizes and thicknesses of order 1 mm or less may be achieved.

The inventors have appreciated that high precision array fabrication process methods suitable for the light-emitting element arrays and aligned optical element arrays are required to achieve such microscopic directional lighting and illumination apparatus. In contrast, in conventional "macroscopic" directional lighting systems, LEDs with width or diameter lower than about 600 micrometers would not provide sufficient brightness without requiring an impractical number of alignment steps.

According to a first aspect of the present invention, there is provided a method of manufacturing an illumination apparatus; the method comprising: forming a monolithic array of light-emitting elements; selectively removing a plurality of light-emitting elements from the monolithic array in a manner that preserves the relative spatial position of the selectively removed light-emitting elements; forming a non-monolithic array of light-emitting elements with the selectively removed light-emitting elements in a manner that preserves the relative spatial position of the selectively removed light-emitting elements; and aligning the non-monolithic array of light-emitting elements with an array of optical elements; wherein the plurality of light-emitting elements that are selectively removed from the monolithic array are selected such that, in at least one direction, for at least one pair of the selectively removed light-emitting elements in the at least one direction, for each respective pair there is at least one respective light-emitting element that is not selected that was positioned in the monolithic array between the pair of selectively removed light-emitting elements in the at least one direction.

The relative spatial positions of the optical elements in the array of optical elements may be provided when the optical elements are formed. The array of optical elements may be a monolithic array of optical elements. The optical elements of the array of optical elements and a substrate may form an integrated body, the forming of the integrated body comprising attaching at least the optical elements to the substrate in a manner that preserves the relative spatial positions of the optical elements. The optical elements of the array of optical elements and a substrate may form an integrated body, the forming of the integrated body comprising forming at least the optical elements on the substrate. The step of aligning the non-monolithic array of light-emitting elements with the array of optical elements may be performed at the same time the optical elements are formed by forming the respective optical elements in an aligned fashion with respect to respective light-emitting elements.

The step of selectively removing a plurality of light-emitting elements from the monolithic array in a manner that preserves the relative spatial position of the selectively removed light-emitting elements may further comprise removing the plurality of light-emitting elements from the monolithic array in a manner that preserves the relative orientation of the selectively removed light-emitting elements. The optical elements may be such that an optical element of the array of optical elements that is aligned with a light-emitting element of the non-monolithic array of light-emitting elements directs light emitted by the light-emitting element into a smaller solid angle than that at which the light is emitted by the light-emitting element. The area of the output aperture of at least one optical element may be at least four times the area of the light emitting aperture of the respective light-emitting element with which the optical element is aligned and preferably at least ten times the area of the respective light emitting aperture. At least some of the optical elements may be reflective. At least some of the optical elements may be catadioptric optical elements.

Each optical element may have an output aperture of maximum width or diameter less than or equal to 4 mm preferably less than or equal to 3 mm and more preferably less than or equal to 2 mm. Each light-emitting element may have a maximum width or diameter less than or equal to 300 micrometers, preferably less than or equal to 200 micrometers and more preferably less than or equal to 100 micrometers. Each optical element may have a maximum height of less than or equal to 5 mm, preferably less than or equal to 3 mm or more preferably less than or equal to 1.5 mm.

The array of optical elements may be flexible. The flexibility of the array of optical elements may be achieved at least in part by forming at least some of the optical elements with sacrificial elements therebetween connecting respective optical elements whilst the relative positions are being provided, and after formation breaking at least some of the sacrificial elements. The non-monolithic array of light-emitting elements may be flexible. The method of manufacture may further comprise, after the step of aligning the non-monolithic array of light-emitting elements with the array of optical elements, bending the array of optical elements and/or the array of light-emitting elements, whereby the non-monolithic array of light-emitting elements remains aligned with the array of optical elements even if the relative positions between respective light-emitting elements and/or between respective optical elements has changed due to the bending step.

Some of the light-emitting elements may have different shapes of light emitting aperture to others of the light-emitting elements, arranged to allow provision of a switchable output beam shape in cooperation with switching of the respective light-emitting elements.

The illumination apparatus may provide a high glare region and a low glare region and the light-emitting elements are driven so as to provide a display function that is visible in the low glare region. Prism elements may be aligned with the output aperture of the optical elements to provide deflection of the light emitted by the light-emitting elements and redirected by the optical elements.

The method of manufacture may further comprise forming an array of electrode connections and aligning the array of electrode connections with the non-monolithic array of light-emitting elements. A combined non-monolithic array of light-emitting elements may be formed from a combination of a plurality of non-monolithic arrays of light-emitting element arrays. The non-monolithic array of light-emitting elements may be formed using a first and a second monolithic array, wherein some of the light emitting elements used in the non-monolithic array of light-emitting elements are selectively removed from the first monolithic array of light emitting elements and some of the light emitting elements used in the non-monolithic array of light-emitting elements are selectively removed from the second monolithic array of light emitting elements.

According to a second aspect of the present invention, there is provided an illumination apparatus, comprising: a plurality of light-emitting elements from a monolithic wafer arranged in an array with their original monolithic wafer positions and orientations relative to each other preserved; and a plurality of optical elements arranged in an array; wherein the light-emitting element array is aligned with the optical element array such that the light-emitting elements are aligned with the optical elements; wherein in at least one direction, for at least one pair of the plurality of light-emitting elements in the at least one direction, for each respective pair there was at least one respective light-emitting element in the monolithic wafer that was positioned in the monolithic wafer between the pair of light-emitting elements in the at least one direction and that is not positioned between them in the array of light-emitting elements. The relative spatial positions of the optical elements in the array of optical elements may have been provided when the optical elements were formed.

At least the optical elements of the array of optical elements and a substrate may form an integrated body, the forming of the integrated body having comprised attaching at least the optical elements to the substrate in a manner that preserved the relative spatial positions of the optical elements. At least the optical elements of the array of optical elements and a substrate may form an integrated body, the forming of the integrated body having comprised forming at least the optical elements on the substrate. An array of light-emitting elements may have been aligned with the array of optical elements at the same time the optical elements were formed by forming the respective optical elements in an aligned fashion with respect to respective light-emitting elements.

The optical elements may be such that an optical element of the array of optical elements that is aligned with a light-emitting element of the array of light-emitting elements directs light emitted by the light-emitting element into a smaller solid angle than that at which the light is emitted by the light-emitting element. The area of the output aperture of at least one optical element may be at least four times the area of the light emitting aperture of the respective light-emitting element with which the optical element is aligned and preferably at least ten times the area of the respective light emitting aperture. At least some of the optical elements may be reflective. At least some of the optical elements may be catadioptric optical elements.

Each optical element may have an output aperture of maximum width or diameter less than or equal to 4 mm, preferably less than or equal to 3 mm and more preferably less than or equal to 2 mm. Each light-emitting element may have a maximum width or diameter less than or equal to 300 micrometers, preferably less than or equal to 200 micrometers and more preferably less than or equal to 100 micrometers. Each optical element may have a maximum height of less than or equal to 5 mm, preferably of less than or equal to 3 mm and more preferably of less than or equal to 1.5 mm.

The flexibility of the array of optical elements may have been achieved at least in part by forming at least some of the optical elements with sacrificial elements therebetween connecting respective optical elements whilst the relative positions were being provided, and after formation at least some of the sacrificial elements were removed. The array of light-emitting elements may be flexible. After the array of light-emitting elements may have been aligned with the array of optical elements, the array of optical elements and/or the array of light-emitting elements may have been bent, whereby the array of light-emitting elements remained aligned with the array of optical elements even if the relative positions between respective light-emitting elements and/or between respective optical elements had changed due to the bending.

Some of the light-emitting elements may have different shapes of light emitting aperture to others of the light-emitting elements, arranged to allow provision of a switchable output beam shape in cooperation with switching of the respective light-emitting elements.

The illumination apparatus may provide a high glare region and a low glare region and the light-emitting elements may be arranged to be driven so as to provide a display function that is visible in the low glare region. Prism elements may be aligned with the output aperture of the optical elements to provide deflection of the light emitted by the light-emitting elements and redirected by the optical elements.

The apparatus may further comprise an array of electrode connections aligned with the array of light-emitting elements. The apparatus may further comprise a combined array of light-emitting elements formed from a combination of a plurality of arrays of light-emitting element arrays. The array of light-emitting elements may have been formed using a first and a second monolithic wafer, wherein some of the light emitting elements used in the array of light-emitting elements are from the first monolithic wafer and some of the light emitting elements used in the array of light-emitting elements are from the second monolithic wafer.

According to a third aspect of the present invention, there is provided an illumination apparatus, comprising: a plurality of light-emitting elements arranged in an array; and a plurality of optical elements arranged in an array; wherein the light-emitting element array is aligned with the optical element array such that the light-emitting elements are aligned with the optical elements; wherein each light-emitting element has a maximum width or diameter less than or equal to 300 micrometers.

Each light-emitting element may have a maximum width or diameter less than or equal to 200 micrometers. Each light-emitting element may have a maximum width or diameter less than or equal to 100 micrometers. The separation of at least two pairs of adjacent light-emitting elements within the light-emitting array may be the same. The orientation of at least two of the light-emitting elements within the light-emitting array may be the same. There may exist at least two different orientations of the light-emitting elements with respect to the orientation of the array of light-emitting elements. In at least one direction the separation of the centres of the light-emitting elements may be greater than twice the size of the light-emitting elements. The light-emitting elements further comprise a light wavelength conversion layer. The colour of emission from some of the light-emitting elements is different to the colour of emission from some others of the light emitting elements. The different colours of emission may use different spectral distributions of white emission. The light-emitting elements may be inorganic light-emitting diodes. The light-emitting elements may be organic small-molecule light-emitting diodes or organic polymer light-emitting diodes. The apparatus may further comprise at least one drive circuit wherein the drive circuit comprises row and column drive circuits are arranged to individually control the emission of each light-emitting element. The apparatus may further comprise a controller arranged to provide a temporal variation of light output from of at least some of the light-emitting elements different from some other of the light-emitting elements so as to provide a time varying directional illumination output. The apparatus may further comprise a projection lens arranged to receive light from at least some of the output apertures of the optical element array and to provide an image of the respective output apertures.

It is known that the external quantum efficiency of LEDs increases as their area is reduced. In LED devices, the high refractive indices of the materials used trap a significant proportion of photons within the structure. Wafer materials such as GaN have relatively high absorption coefficients, so that light generated in the active optical layer can travel only short distances within the wafer before being reabsorbed. If the LED device is small (on the microscopic scale) the mean path length of internally reflected photons required to reach the edge of the device is reduced compared to macroscopic scale devices so that a higher proportion can escape from the edge of the device, increasing device efficiency. Techniques such as thin film flip chip are used to increase the output coupling efficiency for LED devices by increasing the coupling from the top surface of the device, thus reducing internal photon path length. Such techniques can be expensive to implement. The inventors have appreciated that for directional lighting systems, arrays of microscopic LEDs may have higher efficiency than the equivalent total area single macroscopic LEDs and at lower cost.

In order to increase the total luminous output from efficient but small devices, an array of elements would be required. Arrays of LEDs are well known. By way of comparison with present embodiments, LED arrays could in principle be formed by mounting pre-cut LED elements (optionally with a mounted hemispherical refractive structure) onto a substrate, for example by means of a pick-and-place machine well known in the printed circuit board industry. Such machines can achieve positional accuracies of 30 micrometers over the area of the device, but would require a large number of individual mounting steps, increasing device cost. For example, the efficiency of a 10×10 array of 100 micrometer square LEDs can be used instead of a single 1 mm LED to achieve higher external quantum efficiency. Such a device uses substantially the same area of wafer, but would require 99 more mounting operations. Such a device may have a prohibitive number of process steps and thus cost. Advantageously, an array of small LEDs is formed in which the mounting cost is substantially the same as for a single device.

An array of small LEDs is from a monolithic wafer with the positions and orientations in the monolithic wafer preserved which achieves the result that an array of small LEDs can be mounted with high spatial precision. Such a high precision array of small LEDs has many unexpected advantages when combined with optical element arrays to achieve non-Lambertian, directional outputs. The array of small LEDs can be combined with an array of reflective prisms, to increase the forward coupling efficiency of edge emitted light. If the LEDs were not precisely positioned, then the forward coupled light would not have a uniform intensity profile which would produce undesirable illumination characteristics. Further, during assembly, it would not be possible to accurately position each LED within its respective reflector. Advantageously, the high spatial precision of the LED array can be combined with a high precision optical element array to improve uniformity of illumination and packaging yield. Further the directional distribution from the source can be reliably controlled as the light-emitting elements have the same orientation as in the monolithic wafer.

The sum of the LED active areas is small compared to the area covered by the gap between the light-emitting elements. For example, the ratio of LED area to heatsink area is 1% of the array of 1 mm devices. Such an arrangement means that it may be possible to use thinner and cheaper heatsinks. Further current crowding effects are reduced in smaller devices, so that the device can more efficiently generate light uniformly over its entire active area. Further, current densities can be increased within each light-emitting element so that the total output per unit area of emitter can further be increased. Advantageously, the device cost can be reduced. Electrode connection to a large number of individual small elements is advantageously achieved by aligning precision arrays of electrode connectors to the array of light-emitting elements, so that the cost of connecting the elements is reduced.

In many illumination devices, a degree of directionality is desirable. Étendue considerations mean that the area of the output of the optical element is proportional to the reduction in solid angle. By way of comparison, a macroscopic, 1×1 mm area LED will be directed to a 6 degree cone angle by means of a 13 mm output aperture diameter catadioptric optical element. Such an element will also have a thickness of greater than 11 mm. In combination with the large heatsink, total package thicknesses of 10-50 mm may be expected, thus adding significant bulk and materials cost to the system.

Microscopic light-emitting element arrays and aligned optical element arrays can be much smaller than the equivalent macroscopic optical elements and thus are thinner and cheaper to manufacture, while achieving similar or better optical performance. A 10×10 array of 100×100 micrometer area light-emitting devices may each be directed by an optic of less than 1.5 mm diameter, with 1.5 mm thickness while achieving higher efficiency. In this case, the total area of the array of output apertures will be substantially the same as for the macroscopic LED. Thus, the total device area is not affected by changing the size of the individual light-emitting elements for a given directionality. Further, the size of the light source can be increased for an equivalent total light flux while achieving high device efficiency. High brightness small sources disadvantageously can cause visual discomfort if a user happens to look directly at them due to glare. The source is distributed over a larger area so that the brightness seen by an observer from a light-emitting element array is reduced. If a user happens to look directly at the light source, the luminance is reduced and thus is more comfortable to see. In prior art systems this could be overcome by the use of diffusers, but these tend to suffer from light losses due to, for example, back scatter, and so reduce device efficiency.

If the pitch of the 100 micrometer elements were incorrect by 30 micrometers due to machine placement tolerance, then a pointing error would be produced by each lens array and over the width of the device it would not be possible to correctly position the LEDs within the input aperture of the collecting optical elements. The uniformity of the array is increased so that the cosmetic appearance of the light source is enhanced both when switched on, and when switched off. Such arrays can advantageously be incorporated in luminaire structures so that they can be fitted into existing lamp housings.

The supporting substrate can be made deformable so that the light source can be adjusted to direct light into the required area of a lit environment. The light-emitting element array can advantageously be made programmable so that lighting effects can be achieved by control of the addressing circuitry. The colour output of the device can also be adjusted to suit the environment. The optical output can be time varying to achieve dappled illumination. Glare from the light source can be spatially multiplexed for example to be used for signage applications such as emergency signage or advertising. Such elements can advantageously be used to enhance the performance of backlighting apparatus for display apparatus including edge lit waveguides, local area dimming backlights, projection display and privacy backlights.

Compared to known illumination apparatus the illumination apparatus of the present embodiments advantageously provide:

Low luminaire cost;
Low profile enabling mounting in locations not previously possible, for example wall uplighters;
Reduced cooling cost and complexity;
Higher LED efficiency;
Higher brightness;
Reduced current crowding effects;
Wider white point bin tolerances;
Variable directionality;
Steerable directionality;
Colour tunability.

Reduced system power consumption;
Increased lighting sparkle;
Reduced installation costs;
Temporal and directional illumination modulation (such as dappling);
Time varying illumination structures;
Improved colour mixing;
Increased redundancy and yield;
Reduced source brightness for increased comfort of direct viewing of the light source.

BRIEF DESCRIPTION OF THE DRAWINGS

Embodiments of the present invention will now be described, by way of example only, with reference to the accompanying drawings in which:

FIG. 25*a* shows an alignment apparatus for an illumination array apparatus;

FIG. 25*b* shows an aligned illumination array apparatus;

FIG. 26*a* shows a replication apparatus for an optical element array;

FIG. 26*b* shows a replicated catadioptric optic array;

FIG. 26*c* shows a support element for a catadioptric optic array;

FIG. 26*d* shows a further catadioptric optic array;

FIG. 26*e* shows a further catadioptric optic array;

DETAILED DESCRIPTION

The following detailed description of the invention is merely exemplary in nature and is not intended to limit its application and uses. Furthermore, there is no intention to be bound by any theory presented in the preceding background or summary or the following detailed description of the invention.

Figure 1:
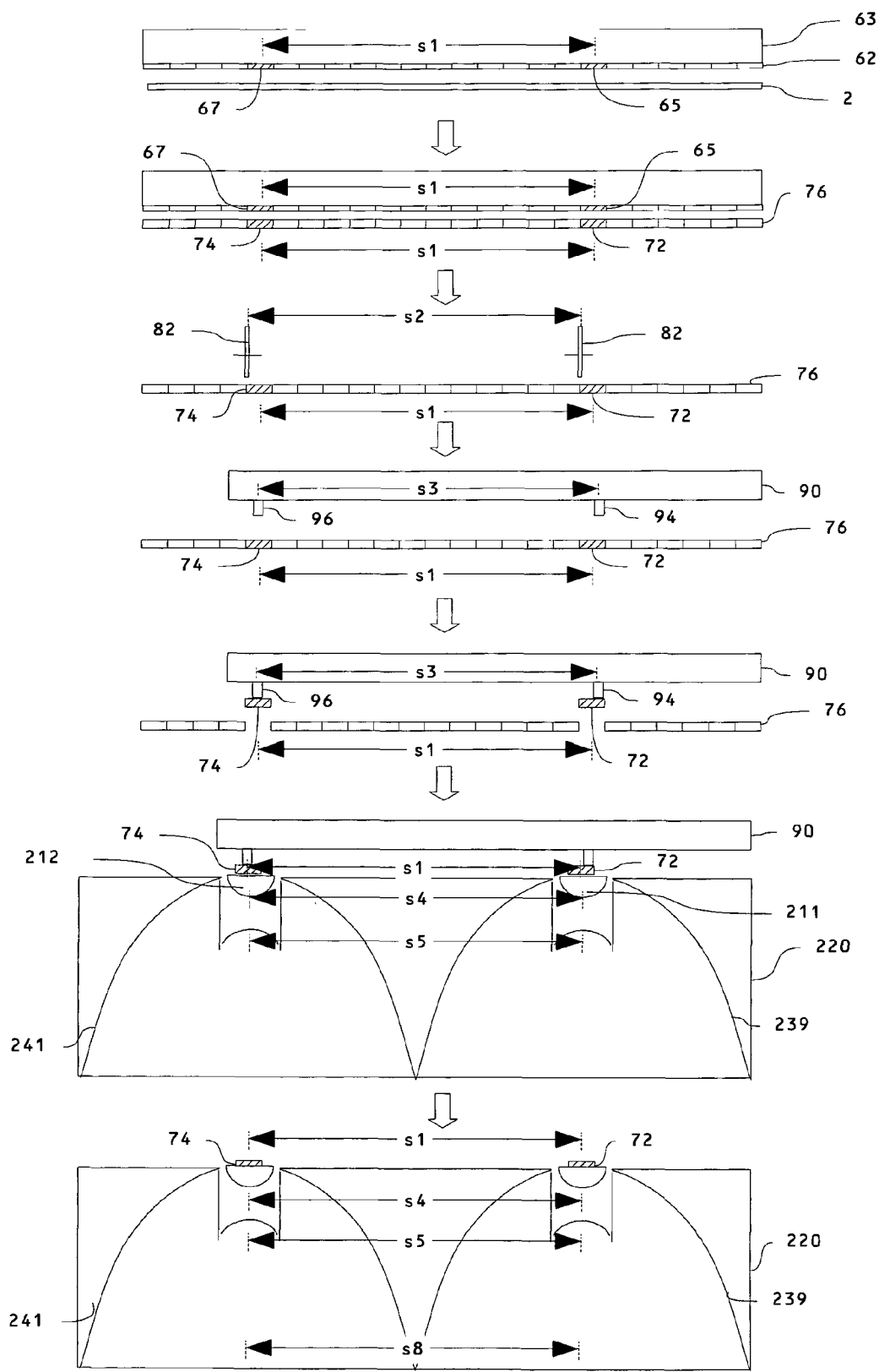
FIG. 1 shows a method to form an illumination apparatus.

A method to form a microscopic illumination apparatus is shown in a first embodiment in FIG. 1. In a first step at least one mask 62 mounted on a substrate 63 is used to illuminate a monolithic light-emitting element wafer 2. For the purposes of the present specification, the term monolithic refers to consisting of one piece; solid or unbroken.

In a second processing step, an array 76 of light-emitting elements is formed in the monolithic wafer 2. Each element has a position and orientation defined by the mask 62. The mask is composed of an array of regions, each region defining the structure of at least one layer of an LED chip. Regions 65 and 67 represent first and second LED chips and have separation s1 as shown. During exposure through the mask onto the wafer 2, elements 72 and 74 are formed from regions 65 and 67 of the mask. The separation s1 of the elements 72, 74 is substantially the same as the separation of the mask regions 65, 67 and the orientation of the elements 72, 74 is the same as the orientation of the respective mask regions 65, 67. The integrity of separation s1 and orientation of elements 72, 74 is preserved through the subsequent processing steps.

Multiple masks may be used to photolithographically form the complete LED structure in the manner described, each with regions with the separation s1. Alternatively, the LED chips may be formed by means of nanoimprint lithography or other known lithography method. Such processes preserve a separation and orientations of elements 72 and 74.

In a third step, the array 76 of light-emitting elements is cut by means of a cutting device 82, which may for example be a scribe, cutting wheel, laser or saw. The separation s2 of the cut lines for a respective edge of elements 72, 74 would ideally be the same as the separation s1. However, in practice such a precise separation is very difficult to achieve. Advantageously the embodiment does not require the separation s2 to be identical to the separation s1.

In a fourth step, a tool 90 has fingers 94, 96 with separation s3 is aligned to the array 76. The separation s3, orientation and placement of the fingers would ideally be the same as the separation s1, orientation and placement of the light-emitting elements of the array. However, in practice such a separation, orientation and placement may be difficult to achieve. Advantageously the embodiment does not require the separation s3 to be identical to the separation s1, or the orientation and placement of the fingers to be identical to the orientation and placement of the light-emitting elements 72, 74.

In a fifth step the fingers 94, 96 are attached to the elements 72, 74 respectively and used to extract the elements from the array 76. It can be seen that while the separation s3 and orientation of the fingers 94,96 is not identical to the separation s1 and orientation of the elements 72, 74, the integrity of the separation s1 and orientation of the elements 72 and 74 is nevertheless preserved in this extraction step.

In a sixth step, the tool 90 with elements 72 and 74 attached is aligned to an array 220 of microscopic optical elements comprising catadioptric optical elements 239, 241. The array 220 may be monolithic and the relative spatial positions of the optical elements may be provided when the optical elements are formed. The elements 72, 74 are further attached to an array of refractive optical elements 211, 212 comprising hemispherical structures. Thus the non-monolithic light-emitting element array and the optical element array are aligned such that a given optical element is aligned with a respective light-emitting element. The light-emitting element is positioned substantially in the input aperture (entrance pupil) of the respective optical element.

In a seventh step, the elements 72, 74 are attached to the array 220 of optical elements 239, 241 and array of optical elements 211, 212.

The elements 239, 241 of the optical element array 220 each have an output aperture (exit pupil) greater in area than the area of the respective light-emitting element in the input aperture such that the respective optical element of the array of optical elements that is aligned with a light-emitting element of the non-monolithic light-emitting element array directs light emitted by the light-emitting element into a smaller solid angle than that at which the light is emitted by the light-emitting element.

The optical elements 239, 241 have input apertures with a separation s5. Separation s1 of the light-emitting elements 72, 74 and separation s5 of the input apertures of optical elements 239, 241 will typically be substantially the same. Further, the separation s8 of the output apertures of elements 241, 239 is substantially the same as separations s1 and s5, so that the output light cone from elements 72, 239 is substantially parallel to the output light cone from elements 74, 241. Further, the step of selectively removing a plurality of light-emitting elements from the monolithic array in a manner that preserves the relative spatial position of the selectively removed light-emitting elements may further comprise removing the plurality of light-emitting elements from the monolithic array in a manner that preserves the relative orientation of the selectively removed light-emitting elements. Advantageously this achieves a highly uniform directional beam as the illumination profile of the output beam can be substantially identical for respective elements with the same orientation of light-emitting elements.

The separation of the individual optical elements 239, 241 in the array 220 can advantageously be preserved across the width of the optic. The alignment is therefore preserved for all light-emitting elements with all optical elements of the microscopic optical element array while providing the desired directionality properties of the array with a highly uniform directional output beam for large numbers of light-emitting elements. Further, the elements 72, 74 may be aligned to an array of refractive optical elements 211, 212, such as hemispherical structures with separation s4, typically similar to the separation s5 so as to provide efficient light extraction into air from the light-emitting elements 72, 74.

This provides a non-monolithic light-emitting element array comprising microscopic light-emitting elements 72 and 74 which have been selectively removed from the monolithic light-emitting element array and provided in the non-monolithic light-emitting element array in a manner that preserves the relative spatial position of the elements 72 and 74. In the direction between the elements 72 and 74, there were a plurality of other light-emitting elements (in other embodiments this may be just one other light-emitting element) between the elements 72 and 74 in the monolithic light-emitting element array that were not selectively removed. This provides what may be termed a sparse array. One advantage of this is that optical elements that are significantly wider than the light-emitting elements may be aligned with the light-emitting elements, whilst still achieving a high density for the manufacture of light-emitting elements at the monolithic light-emitting element array stage (the non-selected elements can be selected later for example). Although not shown in FIG. 1, the same approach is taken for the direction in the array perpendicular to the direction between the elements 72 and 74, however in other embodiments this need not be the case. The microscopic light-emitting element arrays may further be organic LEDs such as small molecule or polymer LEDs formed as a monolithic array (for example on a glass substrate) such that they can be formed into non-monolithic light-emitting element arrays as described for the inorganic light-emitting elements of FIG. 1.

Hemispherical structures 211, 212 operate by providing an intermediate refractive index material between the light-emitting active layer 1 and air, reducing Fresnel reflections, and with reduced total internal reflection losses compared to the active layer 1 placed directly in air. Thus they improve the extraction efficiency of light into air but do not provide a useful reduction of solid angle of the light from the light-emitting elements and are by themselves not suitable for directional illumination apparatus.

Microscopic optical element arrays 220 suitable for thin directional illumination apparatus with large numbers (say 10×10 or greater) of microscopic light-emitting elements (of width or diameter typically less than 300 micrometers) can be formed in arrays using fabrication methods such as those described below. In that case the separations s5 and s8 of the input and output apertures can be achieved to a high degree of precision, similar that to obtained by photolithography methods. The array of microscopic non-monolithic light-emitting elements and array of monolithic microscopic optical elements are formed with equivalent accuracy and resolution. Advantageously the processes are of similar precision and can be referenced to a common calibration standard. By way of comparison, it is noted that macroscopic components of the prior art do not demonstrate the same pitch preservation characteristics.

Thus an illumination apparatus embodiment comprises a plurality of light-emitting elements arranged in an array; and a plurality of optical elements arranged in an array; wherein the light-emitting element array is aligned with the optical element array such that the light-emitting elements are aligned with the optical elements; wherein each light-emitting element has a maximum width or diameter less than or equal to 300 micrometers, preferably less than or equal to 200 micrometers and more preferably less than or equal to 100 micrometers.

The non-monolithic light-emitting element array and optical element array are aligned such that the input aperture of a given optical element is aligned with a respective light emitting aperture. The maximum light throughput is obtained when the light-emitting element is aligned in three dimensions. In particular, the light-emitting element should ideally be in the plane of the input aperture which is the plane that provides for maximum throughput efficiency in a defined solid angle of output.

Preferably the light emitting area of the light-emitting element lies completely within the area of the input aperture. Specifically, for a given point in each light-emitting element there is a corresponding point in the input aperture of the respective optical element array that is aligned for at least a first group of elements in the array. The point in the light-emitting element may for example be the centre of mass of the light-emitting area or may be the position of an electrode and is defined lithographically. The point in the input aperture of the optical element may be the optical centre of the input aperture, from which light is directed substantially perpendicular to the output surface of the optical element array.

Errors in the position of the light-emitting elements within the input aperture of the optical elements of the optical element array will increase the output cone angle from the device. To compensate for this, it is necessary to increase the thickness and output aperture size of the optical element, thus increasing cost. It is therefore desirable to minimise the position error of each light-emitting element in the aperture. The present embodiments advantageously achieve very tight tolerance of relative alignment. The relative position of each light-emitting element of the non-monolithic light-emitting element array with respect to the respective input aperture of the optical element array should be within a tolerance of plus or minus 50%, preferably within a tolerance of plus or minus 25% and more preferably within a tolerance of plus or minus 10% of the width or diameter of the light-emitting area of the light-emitting element to minimise the increase in solid angle from the output of the optical element array. Advantageously the present invention provides for such alignment tolerances over large numbers of elements.

The separations s4, s5 and s8 of the optical elements in the optical element arrays can be the same as the separation s1 of the elements 72, 74 of the array of light-emitting elements. Alternatively, the separations s4, s5 and s8 of the optical elements can be a different but known quantity compared to the separation s1 of the elements 72, 74. Such a configuration has many significant advantages as will be described.

Thus an array of light-emitting elements is formed in which intermediate light-emitting elements that were present in the monolithic light-emitting element wafer are not in the array of light-emitting elements that is accurately aligned with the array of optical elements. The array of optical elements may comprise optical functions including lens elements, prism elements, mirror elements (which may comprise planar, prismatic or curved mirrors), catadioptric elements, diffractive elements (which may be volume holograms), colour changing elements (which may comprise phosphors), light absorbing elements, transmitting apertures, or switchable optical elements (such as liquid crystal optical elements). Embodiments of such optical elements will be described below.

This is particularly important when substantially Lambertian output light-emitting elements are combined with an optical element array to reduce the output solid angle of the output beam compared to the solid angle of the light from the light-emitting element itself. To obtain sufficient reduction of solid angle the output aperture of the optical element array (such as a catadioptric array) has to have a large enough output aperture area compared to the area of the input aperture. The input aperture size can be defined by the emitting aperture size of the light-emitting element when placed in the input aperture plane of the respective optical element. The size of the input aperture may be further increased by light extraction optical elements (for example hemispherical structures 211, 212), tolerance of alignment between the light-emitting elements and input aperture and mounting considerations. Thus the input aperture size may be considerably smaller than the physical aperture in which the light emitting element is placed at the input aperture plane.

The light-emitting element array may be spaced in a single direction with 4 light-emitting elements that were present in the monolithic light-emitting element wafer removed from between each light-emitting element in that direction. Such an element is capable of reducing the solid angle by up to a factor of 5 while substantially preserving the light flux throughput. Alternatively, the light-emitting elements may have 9 or 14 intermediate light-emitting elements removed so as to provide up to 10 or 15 reduction in solid angle in a single axis. If the reduction of solid angle is required in both axes, then the spacing in both directions will be required and for example only 4% of the light-emitting elements that were in the monolithic light-emitting element wafer will be employed. Such an array is capable of reducing the solid angle by up to a factor of 25.

In practice, optical degradations such as aberrations and mismatch between the light-emitting element size and optical element input aperture size mean that the reduction in solid angle is not as great as the reduction in area of the light source, so that to achieve a required solid angle the output aperture must have its size and therefore distance between the light-emitting elements increased further.

By way of comparison, in one example of a prior art arrangement, a light source with a beam cone angle of 6 degrees to 50% of peak intensity in all polar angles uses an array of seven 1×1 mm light-emitting elements each separately aligned to an optical element with 13 mm diameter output aperture. The input aperture size for this solid angle is defined approximately by the LED chip size assuming that the LED is placed at the input aperture of the optical element. Such an optical element has a thickness of greater than 11 mm.

It is one purpose of the present embodiments to achieve a significant reduction in the thickness of directional illuminators by means of reduction of light-emitting element size and optical element size while achieving a small tolerance of alignment of the respective elements. In one embodiment, an equivalent array output power and output solid angle to the above system uses a 100 micrometer width light-emitting element and a 1.3 mm diameter output aperture of each optical element of the optical element array. The embodiment advantageously provides approximately a 1.1 mm thick optical element array with a single alignment step and a utilisation of wafer and therefore cost similar to that provided by the 1×1 mm devices. The number of output apertures increases to 700 while the total area of the optical element array is substantially the same as the total area of the seven 13 mm diameter output aperture optical elements of the prior art system.

By way of comparison, if a single monolithic light-emitting element array were to be used, such an output solid angle would require the wastage of about 99.6% of the monolithic light-emitting element wafer area and would thus be very expensive. Further if individual alignment steps were required for each individual light-emitting element as required by the prior art, then up to 700 separate alignment steps would be required, again which could be prohibitively expensive. Advantageously, the 1 mm thick microscopic optical element array uses less material than the prior art 10 mm thick device and has the same area, and so advantageously will have a lower material cost.

Thus the thickness (or separation of the input and output apertures) of the elements of the optical element array (ignoring any stabilising substrates external to the optical function of the device) is less than or equal to 5 mm, preferably less than or equal to 3 mm and more preferably less than or equal to 1.5 mm.

Each optical element has an output aperture diameter that has a maximum width or diameter less than or equal to 4 mm, preferably less than or equal to 3 mm and more preferably less than or equal to 2 mm. The actual output aperture area will be determined by the solid angle of the output beam required; the larger the solid angle, the smaller the area of the output aperture. Further, such small output aperture sizes can be used to provide display functionality as will be described below. The height of the optical elements can be defined as the separation between the input aperture and output aperture. Thus the height of support substrates such as substrate 426 and mounting substrates such as substrate 118 are typically not included, although transparent support substrates may be integrated into the optical structure with optical element arrays positioned on either side of the substrate. The height will be dependent on the output solid angle required and the size of the light-emitting elements. However, the present embodiments achieve much lower heights than macroscopic elements. Each optical element may have a maximum height of less than or equal to 5 mm, preferably less than equal to 3 mm and more preferably less than or equal to 1.5 mm In order to achieve the reduction in optical element thickness and increase in resolution of the output apertures, each light-emitting element has a maximum width or diameter of less than or equal to 300 micrometers, preferably less than or equal to 200 micrometers and more preferably less than or equal to 100 micrometers.

In at least one direction the separation of the centres of the light-emitting elements may be greater than twice the size of the light-emitting elements. The area of output aperture may be at least four times, and preferably at least ten times the area of the input aperture. The input aperture size may be defined as at least the emitting area of the light-emitting element needed to achieve a desired reduction of the solid angle of the output cone angle but may further include light extraction optics and alignment tolerances of the light-emitting elements. For small cone angles such as 6 degrees, the ratio of area of input and output apertures may be significantly greater.

Figure 2:
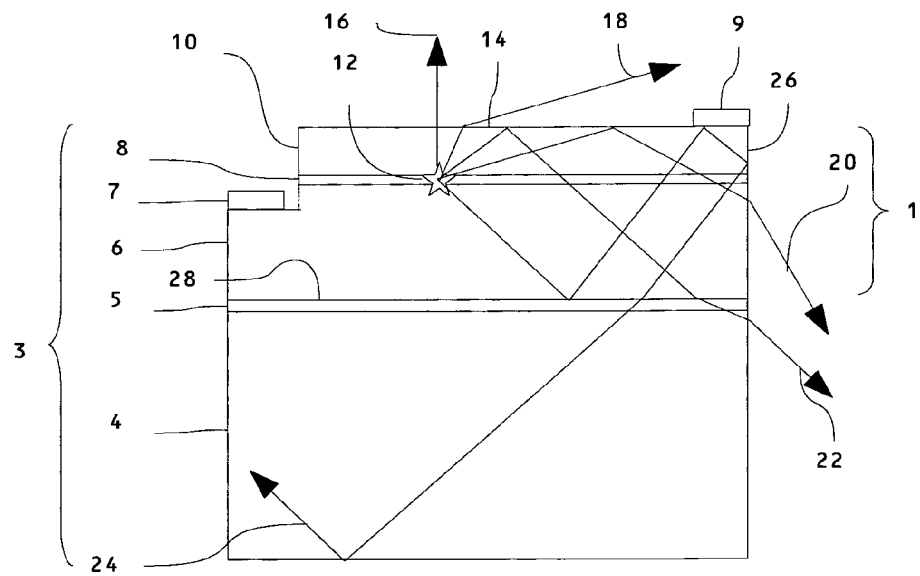
FIG. 2 shows a prior art LED device.

A known light-emitting diode (LED) device 3 is shown in FIG. 2. A substrate 4, such as sapphire has an n-type Gallium Nitride (GaN) layer 6 layer formed on its surface, typically with intermediate functional layer 5 such as a lattice matching layer or a release layer. A multiple quantum well layer 8 and p-type GaN layer 10 are formed over the substrate 6. The active layer 1 thus comprises the layers 6,8,10 and perhaps part of layer 5 and may further comprise electrode contacts and other functional elements as part of the LED structure.

In this specification, the term LED is used to include semiconductor LEDs including inorganic LED, organic LEDs and polymer LEDs.

When a voltage is applied across the device by means of electrodes 7, 9, emission 12 occurs within the layer 8. Light rays 16, 18 transmitted close to normal to the outer surface 14 are transmitted. However, light rays 20, 22, 24 are internally reflected due to the relatively high refractive indices within the device 3. Light rays 20, 22 can exit through the edge 26 of the device. Such devices have relatively high internal absorption coefficients to light passing through the layers 6,8,10, resulting in loss of efficiency and increased device heating. As the dimensions of the device increases, the path length of many of the internally reflected light rays 20, 22, 24 increases and so the proportion of light rays that can escape from the device decreases, resulting in decreasing external efficiency for larger devices as size increases. In order to improve the external efficiency, surface roughening or photonic bandgap structures are added to the top surface 14. In thin film flip chip devices, the substrate 4 is further removed so as to improve external light coupling. In this case, the surface 28 is modified. Further the edges of the device may be formed by an etching process prior to cutting to provide improved facet quality.

Figures 3, 4A, 4B:
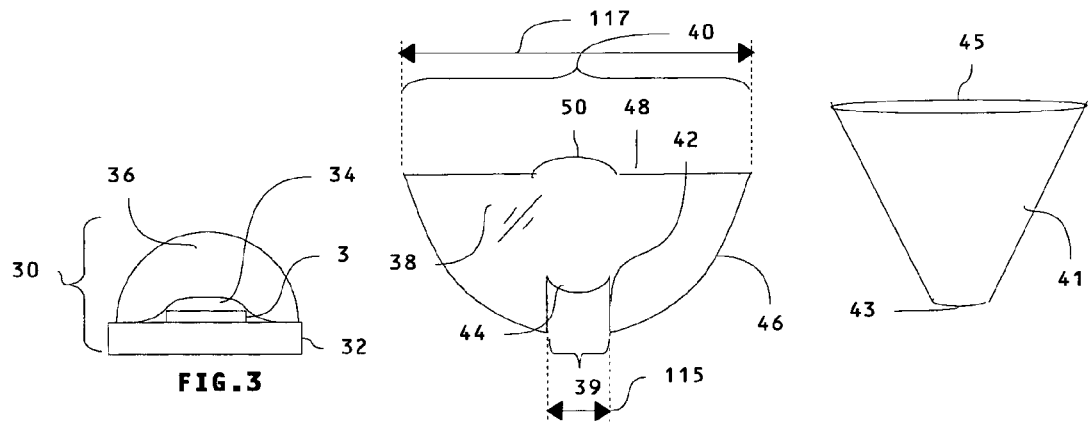
FIG. 3 shows an LED device mounted with phosphor layer and hemispherical structure.
FIG. 4a shows a catadioptric optic device.
FIG. 4b shows a reflective optic device.

FIG. 3 shows the mounting of the device 3 onto a substrate 32 to form a substantially Lambertian output device 30. Electrical connections (not shown) are made and in the case of white emission devices, a phosphor layer 34 is added. Further, a hemispherical refractive structure 36 is added to increase the forward optical coupling efficiency of the device. Alternatively, in thin film flip-chip, structures, the device 1 may be used in which the substrate 4 has been removed. The structure 36 serves in particular to couple the light output from the light-emitting element into air by providing an index matching function, reducing Fresnel losses and total internal reflection losses at the surface of the light-emitting element and at the surface of the structure. The structure 36 does not serve to provide any substantial light directing function so that if the light emitting element has a Lambertian output then the output of the hemispherical structure will also be substantially Lambertian.

By way of comparison with embodiments of the present embodiments, FIG. 4a shows a known macroscopic catadioptric light directing optical single element 38 comprising a physical input aperture 40, output aperture 39, input walls 42, lens surface 44, reflective surface 46, and front surface 48. Surface 48 may comprise several features. For example, a lens surface 50, a diffuser, lenticular arrays or other optical function may be incorporated. Such an element operates by means of reflective and refractive optical structures (catadioptric). Further, some of the surfaces may be metallised so that reflections are by means of total internal reflection and/or metallised reflection. Typical structures may be compound parabolic collectors (CPC) or refractive-reflective-internal reflective (RXI) elements. FIG. 4b shows an embodiment of a reflective macroscopic light directing optical element comprising a physical input aperture 43 and output aperture 45, separated by reflective walls 41. The element may be hollow (air filled) in which case the walls may be metallised, or may operate by means of total internal reflection in a similar manner to FIG. 4a in which case the element may be formed from a moulded plastic optical element for example.

The shape of the reflective and refractive surfaces can be modified to optimise coupling efficiency into a certain solid angle, for example by the edge ray method. Thus the surfaces of FIG. 4b may be easier to manufacture at small sizes than those of FIG. 4a, but will not typically confine the light in as narrow a beam solid angle. To compensate for this, the output aperture size and device thickness can be increased.

The input aperture 39 of the element 38 has a width or diameter 115 and the output aperture 40 has a width or diameter 117. Specifically the output aperture 40 has an area greater than the area of the input aperture 39 so that the width or diameter 117 is greater than the width or diameter 115. The optical element 38 thus provides a reduction in the solid angle of the output beam from the output aperture 40 compared to the solid angle of the input beam at the input aperture 39. In operation, the optical input aperture is defined by the size of the respective aligned light-emitting element and so the (effective) optical input aperture is smaller than the physical input aperture 115.

By way of comparison with the present embodiments, the macroscopic elements shown in FIG. 4a and FIG. 4b when used with light-emitting elements such as 1 mm×1 mm LEDs are on a relatively large scale with output aperture sizes and thickness of greater than 10 mm being typical. Such macroscopic optical elements may be mastered by means of diamond turning the form of a single element which is then replicated to produce individual macroscopic optical elements. Each of these is then aligned to at least one LED, typically using a pick-and-place process. Such techniques do not use interferometric type precision of placement of input and output apertures of the optical elements or of the light-emitting elements in the array. Such techniques are not suitable for microscopic array directional illumination systems.

Figures 5A, 5B:
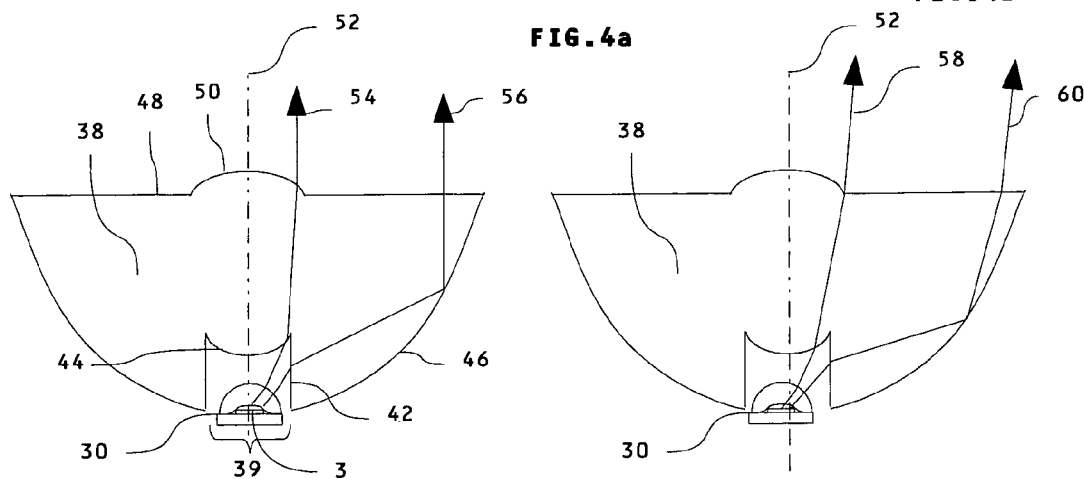
FIG. 5a shows a directional LED device.
FIG. 5b shows an offset directional LED device.

FIG. 5a shows the operation of the macroscopic light directing element 38 with the mounted device 30. The device 30 is aligned centrally with the input aperture 40 and the optical axis 52. Light ray 54 passes through the surfaces 44, 50 and is directed parallel to the optical axis 52. Light ray 56 passes through the surface 42 and undergoes total internal reflection at the surface 46. Alternatively the surface 46 may be coated with a reflective material. FIG. 5b shows schematically the effect of a displacement of the device 30 from the optical axis of the element 38. In this case, the rays 58, 60 are no longer parallel to the optical axis 52, and the centre of the final output beam comprising rays 58, 60 is angularly displaced with respect to the output directions 54, 56. Further, the final luminance structure of the angular output may be modified. In an array of such macroscopic optical elements it is desirable that the light-emitting elements are aligned with the optical centre of the optical elements so that all the output beams are parallel. If this is not the case then the final output solid angle will be increased for the array compared to the solid angle for a single device.

Figure 6:
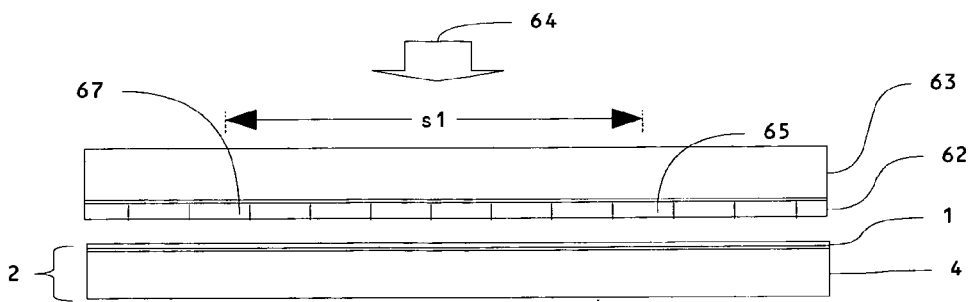
FIG. 6 shows a masking step for the fabrication of a monolithic LED array.

FIG. 6 shows the first step of the formation of an array of microscopic light emitting elements of FIG. 1 in further detail. A monolithic light-emitting element wafer 2 is formed by growth of an epitaxial structure comprising active layer 1 on a substrate 4. The monolithic light-emitting element wafer is a single piece from which the individual LED elements are formed. A mask 62 comprises features used to define the individual LED elements. The mask 62 may be for example a physical contact mask illuminated by a collimated light source 64. Alternatively, the mask 62 may be a projection mask. In that case, the mask is imaged at or near the plane of the layer 1. Optionally the mask 62 may be formed by: deposition of active material by for example screen or ink jet printing; laser scanning in which case the mask is a temporal variation of laser beam intensity and position; or nanoimprint lithography or any combination of the above.

Typically the mask is mastered using high precision scanning techniques, using interferometric stages so as to provide tight tolerance of position of features within the mask.

Figure 7:
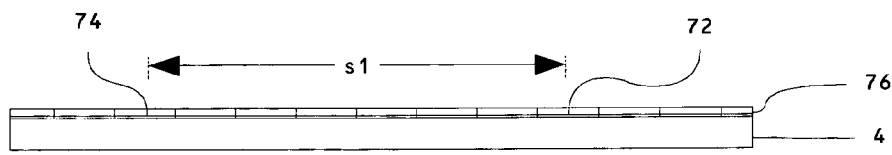
FIG. 7 shows the cross section of a monolithic LED array.

FIG. 7 shows the monolithic light-emitting element wafer formed by the array 76 of light-emitting elements in the active layer. The separation s1 of any two individual regions 65, 67 of the mask 62 is reproduced in the monolithic light-emitting element array of layer 1 as shown in FIG. 7 by an array of individual elements 72, 74 which are examples of light-emitting elements. These have the same separation and orientation as in the monolithic light-emitting element array 76 formed by the mask 62. The light-emitting elements are not emitting when in the monolithic light-emitting element wafer, but will emit when separated from the wafer with the appropriate electrical connections and drive electronics. However, for convenience they are referred to as light-emitting elements in this specification. In the figures, two light-emitting elements 72, 74 are shown for illustrative convenience but the array may extend in both the x and y directions such that there are many light-emitting elements in the array.

Typically, each of the light-emitting elements will also have the same pitch, in which the light-emitting elements have identical size and spacing. However, it is possible that the separation of the individual light-emitting elements may vary across the width of the wafer. However, the separation s1 of two light-emitting elements 72, 74 remains the same as on the monolithic light-emitting element array 76 and as between the features 68, 70 on the mask image separation s1. Further, multiple masks may be used to form the elements 72, 74. In general the separation s1 and alignment of each of the individual masks 62 will be identical other than for small manufacturing tolerances.

Figure 8:
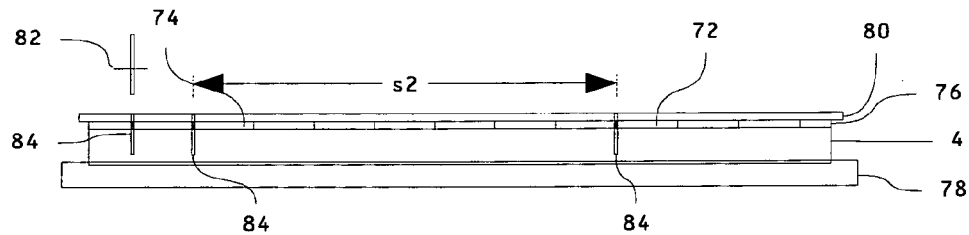
FIG. 8 shows a cutting step for a monolithic LED array.

FIG. 8 shows that after formation of the array 76, the substrate 4 is attached to a substrate 78 which may be flexible. A further protective layer 80 may be optionally attached to or formed on the top surface of the array 76. A cutting device 82 provides cuts 84 in at least part of the array 76 and/or substrate 4. The cutting means may be by means of a diamond scribe, saw, laser or other cutting method. Preferably the cutting method provides a minimum kerf to minimise wafer wastage during cutting of the microscopic light-emitting elements. The cutting process may be by means of a cut through the wafer; by means of a scribe or shallow cut and break; or may be by means of a cut or scribe through the active layers of the monolithic wafer, while the substrate is unbroken.

Figure 9:
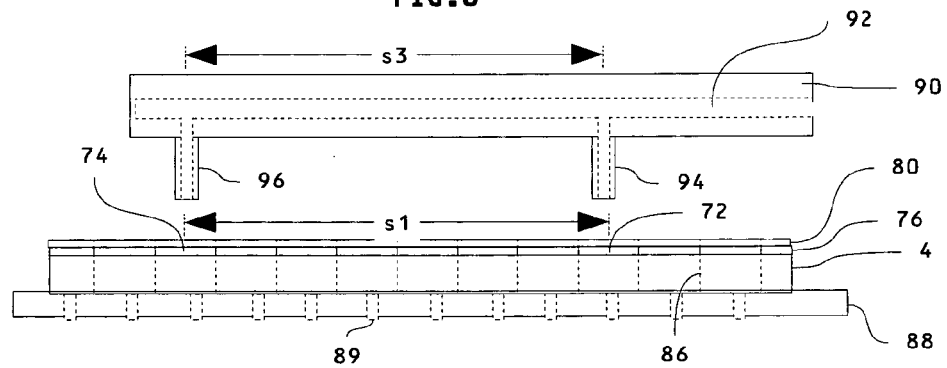
FIG. 9 shows one separation apparatus in cross section.

After cutting, the substrate is broken by temporary deformation on the substrate 78 to provide break lines 86 as shown in FIG. 9. The position of the breaks 86 is aligned to the edge of the LED features, so that the cut elements 72, 74 have substantially the same separation s1 as the mask 62.

FIG. 9 shows one apparatus to select and transfer the elements 72, 74 from the monolithic light-emitting element wafer 76 while preserving the separation s1. The film 80 may be removed and the stacks 4, 76, 80 are transferred to a support substrate 88 which may comprise an array of holes 89 to provide vacuum mounting. A tool 90 with vacuum supply apertures 92 is provided with fingers 94, 96 with separation s3 nominally the same as or an integer multiple of the separation s1.

Figure 10A:
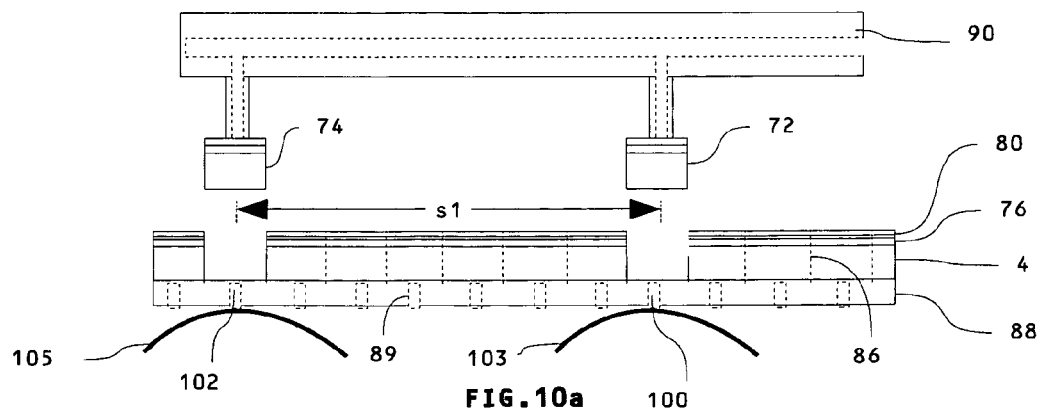
FIG. 10a shows a first separated LED array in cross section.

The tool 90 is first aligned with elements 72, 74 and used to selectively remove them from the monolithic light-emitting element array 76 as shown in FIG. 10a. The holes 100,102 corresponding to the elements 72, 74 respectively have the vacuum released while the remainder of the holes 89 have the vacuum held during the lift-off procedure. Further, the substrates and layers 88,4,76,80 may be slightly bent to ease the release process, for example by means of a pressure point applied near the apertures 100,102. Further pressure may be applied in the region of the element, for example by means of hard rubber curved surfaces 103, 105.

Thus, the plurality of light-emitting elements from the monolithic light-emitting element wafer are arranged in an array with their original monolithic light-emitting element wafer positions and orientations preserved; so that the orientation of at least two of the light-emitting elements 72, 74 within the light-emitting array may be the same. Further the separation of at least two pairs of adjacent light-emitting elements within the light-emitting array may be the same. Advantageously the light-emitting elements 72, 74 are removed in a single step. This reduces the number of processing steps in the assembly of a display apparatus so that the complexity, cost, and time of assembly of the array of light-emitting elements is reduced. To provide a thin structure with the advantages of the present embodiments, the microscopic light-emitting elements 72, 74 have a width or diameter less than 500 micrometers and can be expected to have width or diameter of less than 300 micrometers, preferably less than 200 micrometers and more preferably less than 100 micrometers.

Thus the present embodiments provide an illumination apparatus comprising: a plurality of light-emitting elements arranged in an array; and a plurality of optical elements arranged in an array; wherein the light-emitting element array is aligned with the optical element array such that the light-emitting elements are aligned with the optical elements; wherein each light-emitting element has a maximum width or diameter less than or equal to 300 micrometers, preferably less than or equal to 200 micrometers and more preferably less than or equal to 100 micrometers.

Advantageously, such an apparatus provides an array of non-monolithic light-emitting elements, with individual elements smaller than known arrays of light-emitting elements with precise position and orientation such that the arrays can conveniently be aligned to optical and electronic array elements with high precision and low cost.

The array of light-emitting elements 72, 74 is a sparse array compared to the dense monolithic light-emitting element array of light-emitting element array 76. Light-emitting elements 72, 74 are non-monolithic light-emitting elements, in that they are no longer part of a single piece. In this way, an array of light-emitting elements 72, 74 is from the monolithic light-emitting element array preserving the separation s1 between the elements. Further, the orientation of the light-emitting elements 72, 74 is preserved. This procedure is illustrated for two fingers but could use many more as will be illustrated below. This has many advantages for alignment of the array of light-emitting elements with arrays of optical elements as well as arrays of electrical connections. In particular the thickness and cost is reduced and optical uniformity improved.

Figure 10B:
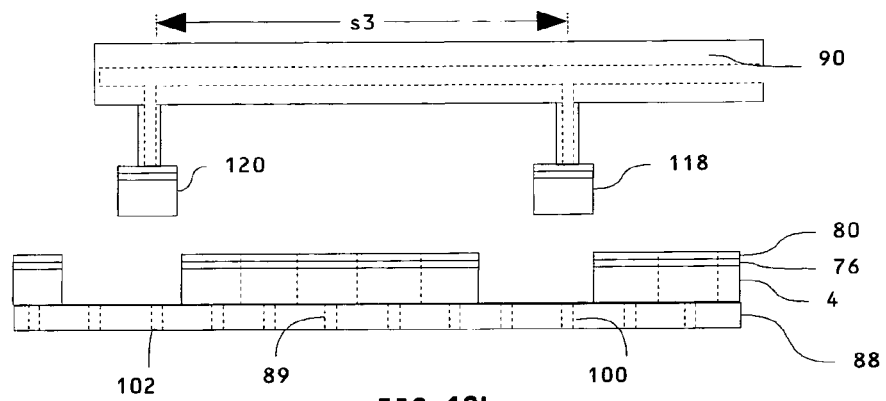
FIG. 10b shows a second separated LED array in cross section.

After the first elements 72, 74 have been selectively removed for the first non-monolithic light-emitting element array, the process repeats for the unused elements on the monolithic light-emitting element wafer, as shown in FIG. 10b. In this case, light-emitting elements 118 and 120 are selectively removed from the monolithic light-emitting element wafer 76. The process may be repeated so that all of the elements from the monolithic light-emitting element wafer 76 are incorporated into one or more non-monolithic illumination array devices. Advantageously such a process achieves an array of many widely spaced microscopic light-emitting elements to be selectively removed from a monolithic array of light-emitting elements. The cost of the elements has a significant contribution from the materials cost of the wafer and thus the area utilisation of the monolithic light-emitting element wafer is similar to that for macroscopic devices so that the array device cost is similar.

Figure 10C:
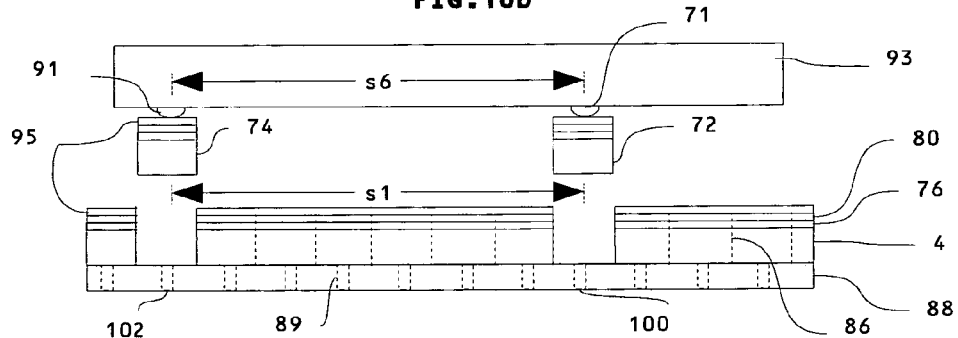
FIG. 10c shows a further separation apparatus in cross section.

The removal tool may alternatively comprise an adhesive separation means, for example as shown in FIG. 10c. In this case, adhesive dots 71, 91 are distributed over the substrate 93, for example by means of a high precision printing method so that the separation s6 of the dots 71, 91 is substantially the same as separation s1. A further sacrificial layer 95 is positioned on the top surface of the layer 80, or layer 80 may function as a sacrificial layer. The dots 91 are cured, for example by UV cure when the substrate 93 is in contact over the array elements 72, 74, and the devices selectively removed. In this way the separation of the elements 74, 72 remains the same as the mask. Advantageously such arrangements can provide high precision alignment of the adhesive 71,91 to the light-emitting elements 72, 74 with a single alignment step so that the correct elements are selectively removed from the monolithic light-emitting element array 76 at low cost.

Figure 10D:
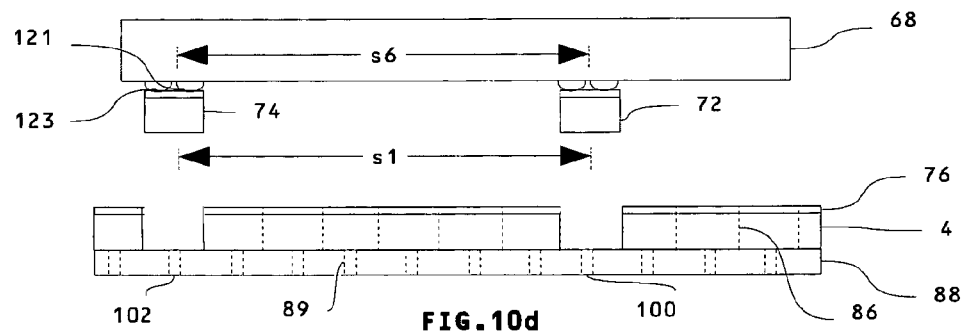
FIG. 10d shows a further separation apparatus in cross section.

Alternatively as shown in FIG. 10d, the substrate 68 may be a non-monolithic light-emitting element array support substrate and the adhesive may be contacts 121,123 comprising solder and/or thermal adhesive so as to provide electrode connections and thermal contact between the non-monolithic array elements 72, 74 and the substrate 68. Thus there may further comprise the steps of forming an array of electrode connections 121, 123 and aligning the array of electrode connections with the non-monolithic array of light-emitting elements 72, 74. The substrate 68 may thus be the electronic backplane of the LED array. The light-emitting elements may comprise thin film flip chip devices with electrode connections on the top surface. Solder elements 121,123 for connection to n-type and p-type layers are patterned onto the substrate 68. The solder may for example be solder balls. Alternatively the solder may comprise a further UV curable adhesive. On illumination through either the substrate 4 or substrate 68, the elements may be cured onto the substrate 68.

Alternatively, the solder balls may be selectively laser melted through a mask or by scanning to provide selective attachment of the elements 72, 74 to the substrate 68. Substrate 68 may further comprise a semiconductor wafer such as a silicon wafer with functional components to enable integrated control of the array device. Advantageously, the silicon wafer can comprise addressing circuitry to address the light-emitting elements. Advantageously the apparatus of FIG. 10d removes the need for an intermediate tool 90 so that the number of process steps is reduced and the elements 72, 74 are automatically aligned directly onto the electrode array. Alternatively the substrate 68 may further comprise an array of mounting surfaces such as an array of ceramic carriers mounted on a support substrate, or a single ceramic carrier. The light-emitting elements 72, 74 from the monolithic light-emitting element wafer 76 of FIG. 10d advantageously have the pitch and orientation relative to each other preserved. This means that the tolerance of alignment of the adhesive elements 121,123 can match the alignment of the elements 72, 74 across the whole of the non-monolithic light-emitting element array for a single alignment step. If one of pitch or orientation were not preserved, errors would occur in the placement of electrodes with respect to the contact regions in the device. Further, the electrode connections to electrodes in each device can be precisely arranged onto the electrode array such that precise alignment is achieved across the array for a single alignment step, thus increasing yield and reducing cost.

Figure 10E:
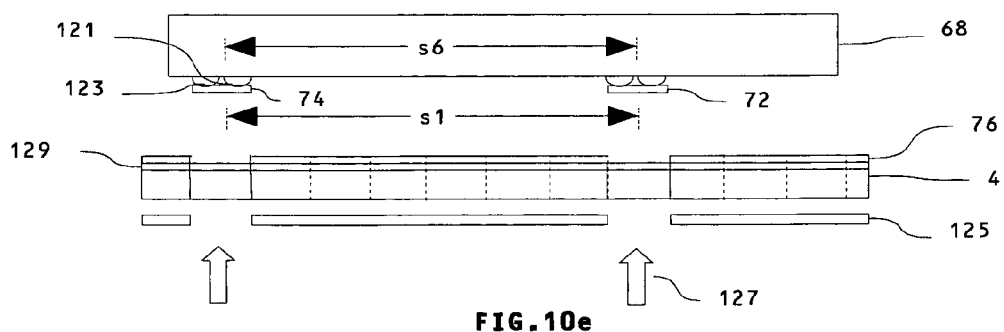
FIG. 10e shows a further separation apparatus in cross section.

FIG. 10e shows a further embodiment in which the separation of the light-emitting elements from the wafer is further defined by a laser removal step. An optional mask 125 is positioned behind the transparent substrate 4. A release layer 129 is positioned between the substrate 4 and array 76 such that when illuminated by light 127, for example from a laser, the element may be detached from the substrate 4. The laser may be masked as shown, or scanned across the layer to provide selective separation from the substrate 4. In this manner, by selective illumination of the layer 129 it is possible to provide selective removal of the elements 72, 74 onto the substrate 68 by means of the adhesive elements 121, 123. Such an approach can advantageously increase the reliability of separation of the non-monolithic light-emitting elements 72, 74.

Following removal of non-monolithic light-emitting elements 72, 74 such as shown in FIG. 10e for example, a further step of surface roughening of the non-monolithic light-emitting element array may be used to increase the coupling efficiency from the top surface of each light-emitting element 72, 74. As the elements are mounted on the substrate 68, this may be undertaken in parallel to reduce cost.

Figure 10F:
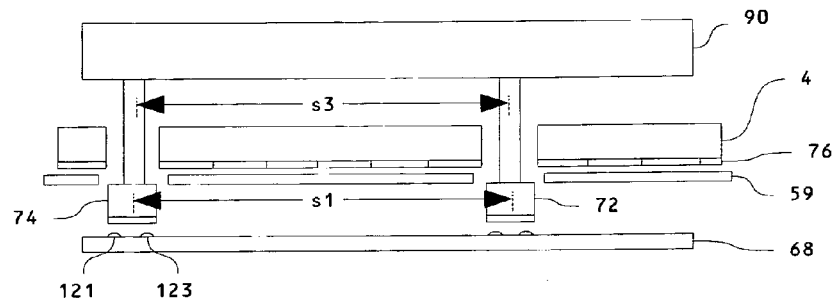
FIG. 10f shows a further separation apparatus in cross section.

FIG. 10f shows in cross section a further separation arrangement in which a tool 90 is arranged to push the cut elements 72, 74 through the wafer plane onto a receiving substrate 68 with adhesive elements 121, 123. A further support layer 59 is positioned to provide mechanical rigidity for the remainder of the structure during the separation step. The elements 72, 74 may be cut together with the remainder of the elements of the wafer by for example a cutting wheel or laser as described elsewhere. Alternatively the elements may be cut separately to the other elements of the wafer by for example a scanning or masked pulsed laser system. In this case, the elements can more conveniently be separated independently of the elements that remain in the monolithic light-emitting element wafer.

In further embodiments, the vacuum fingers 94, 96 can be replaced by a wax which binds the elements when hot but can be softened locally to enable removal of individual elements, for example by means of localised laser heating.

Figure 11A:
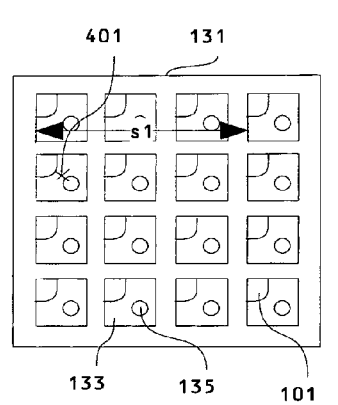
FIG. 11a shows one monolithic light-emitting array structure in plan view.

FIG. 11a shows in plan view one arrangement of the monolithic light-emitting element wafer 131 of light-emitting elements prior to separation of the non-monolithic light-emitting element array wherein each element comprises at least one light-emitting aperture 133 and at least one non-emitting region 135 and typically at least a further non-emitting region 101. The separation s1 of two respective light-emitting elements is marked. The separation s1 is between respective features in the LED elements, rather than between the cut edges of the elements, which may have a slightly different separation s2 as shown in FIG. 1. The edge facets of the light-emitting region (as shown in cross section in FIG. 2) may be formed by means of etching rather than cutting and thus are formed by a mask 62. In this manner, the light-emitting regions can have the same separation s1 so that the separation of the light-emitting regions is constant across the array of light-emitting regions. The centre of mass of the light-emitting area is a specific point 401 for which the weighted centre of the luminance distribution across the area of the device. This can be for example the point which appears to provide the peak output intensity. Preferably, the non-monolithic array of light-emitting elements and the array of optical elements are aligned such that a specific point 403 within the area of the input aperture of an optical element is aligned with a specific point 401 within the area of a respective light-emitting element.

Figure 11B:
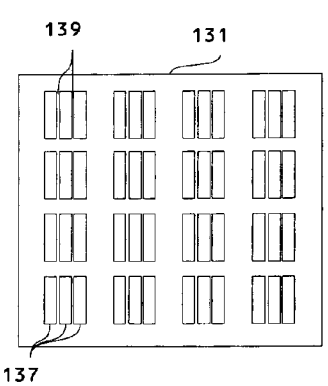
FIG. 11b shows a further monolithic light-emitting array structure in plan view.

The light-emitting elements may comprise multiple sub-regions within a single region as shown for example in FIG. 11b comprising light-emitting sub-elements 137 and non-light-emitting elements 139. The non-emitting regions may for example be the electrodes 7, 9 of FIG. 2. Advantageously, the orientation of the regions 135, 101, 139 is preserved so that a single alignment step to an electrode array can be used, reducing cost and complexity of array assembly.

Figure 11C:
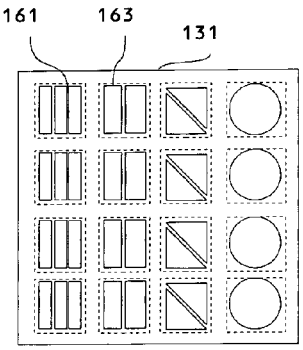
FIG. 11c shows a further monolithic light-emitting array structure in plan view.

FIG. 11c shows that the shape of the light-emitting regions of the light-emitting elements may be varied on the monolithic light-emitting element wafer so that elements 161 have a different shape to elements 163. For example, the electrodes may be positioned at different locations within the aperture of the light-emitting element. Further the elements may be triangular, circular or elliptical for example. The shapes may be arranged on the monolithic wafer such that the array of selectively removed non-monolithic light-emitting elements may comprise different shapes. Advantageously when applied to the non-monolithic wafers of the present embodiments, such an embodiment achieves improved symmetry of the final output illumination in the far field compared to light-emitting arrays in which all the elements have the same shape. Thus some of the light emitting elements may have different shapes of light emitting aperture to others of the light-emitting elements, arranged to provide a more uniform output beam shape.

Figure 11D:
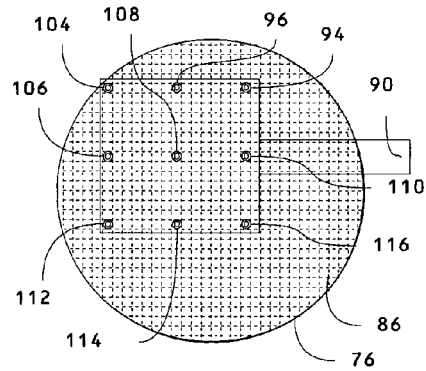
FIG. 11d shows the arrangement in plan view of a wafer and separation apparatus.

The elements 72, 74 form part of the non-monolithic light-emitting element array and may comprise further elements extracted from a single wafer substrate 4 as shown in plan view in FIG. 11d for example by means of fingers 94, 96, 104, 106, 108, 110, 112, 114, 116. The elements are selectively removed so that there is one of each process step for each illumination array.

Figure 11E:
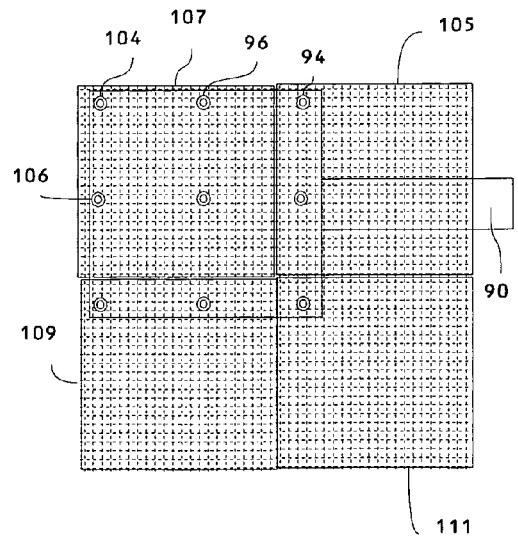
FIG. 11e shows the arrangement in plan view of a further wafer and separation apparatus.

It may be the case that a single wafer is not sufficiently large to provide adequate light output from the array and that the array size has to be extended. In this case, a larger array can advantageously be formed by mounting several wafers together as shown in FIG. 11e. In this case, four separate wafers 105, 107, 109, 111 are aligned together so that the tool 90 can be positioned across the boundary between individual wafers. Thus a non-monolithic array of light-emitting elements may be formed using a first and a second monolithic array, wherein some of the light emitting elements used in the non-monolithic array of light-emitting elements are selectively removed from the first monolithic array of light emitting elements and some of the light emitting elements used in the non-monolithic array of light-emitting elements are selectively removed from the second monolithic array of light emitting elements.

Figure 12A:
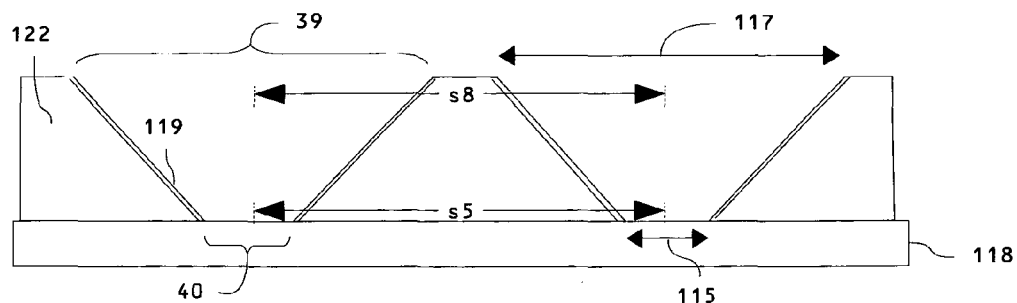
FIG. 12a shows in cross section a monolithic optical element array of optical elements.

FIG. 12a illustrates in cross section an embodiment in which a monolithic optical element array 122 is formed on a substrate 118. Advantageously the substrate 118 may provide increased dimensional stability and may be part of the monolithic optical element array. The array 122 comprises an array of physical input apertures 40 with width 115 and separation s5; and output apertures with width 117 with pyramidal surfaces coated with reflective material 119 between the respective input and output apertures 115, 117.

Two optical elements are shown, but larger arrays of elements would typically be used to achieve high levels of light output. The elements may be arranged as one dimensional or two dimensional arrays. One dimensional arrays may have advantages for mounting to luminaire structures as will be described below, while two dimensional arrays will achieve higher levels of light output. The substrate 118 may comprise an electrode array.

By way of comparison, the prior art fabrication techniques for macroscopic light-emitting elements do not use positional accuracy that can be conveniently tied in with (commensurate with) the tolerances used to fabricate the monolithic wafer. In that case, pick-and-place arrangements are preferable, and so it is desirable to increase the light-emitting device size and device thickness to minimise the number of pick-and-place operations. However, such macroscopic fabrication techniques increase cost and reduce both performance and functionality compared to the present embodiments.

Advantageously, the microscopic non-monolithic light emitting elements from a monolithic light-emitting element wafer achieve optical elements that are relatively thin and small so that mastering and replication techniques that are well suited to the provision of lithographic-like separation tolerances can be used. In particular, equipment with interferometric stages can be used to provide arrays of surface relief structures with high precision. Thus the fabrication process for the microscopic optical element arrays of the present invention have a precision that is commensurate with the fabrication process (of mask 62 in FIG. 1 for example) used to provide the non-monolithic light-emitting elements from the monolithic wafer.

Figure 12B:
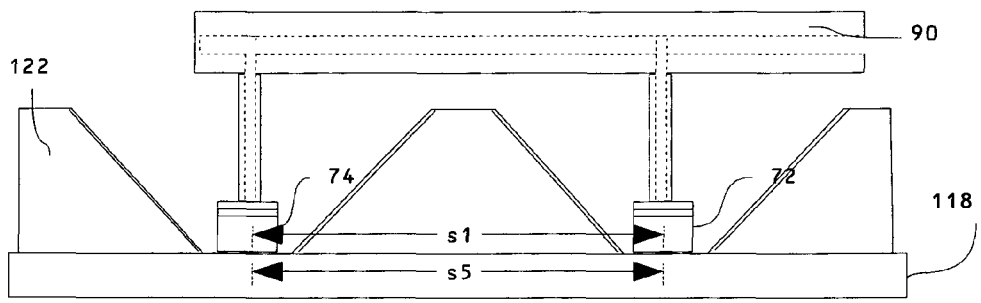
FIG. 12b shows in cross section the assembly of an illumination array apparatus.
Figure 12C:
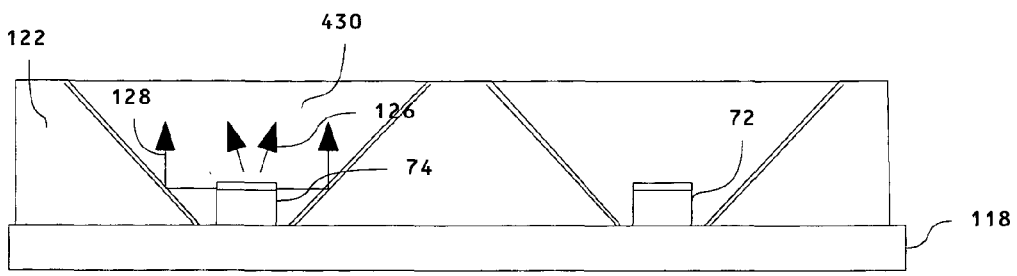
FIG. 12c shows in cross section an illumination array apparatus.
Figure 12D:
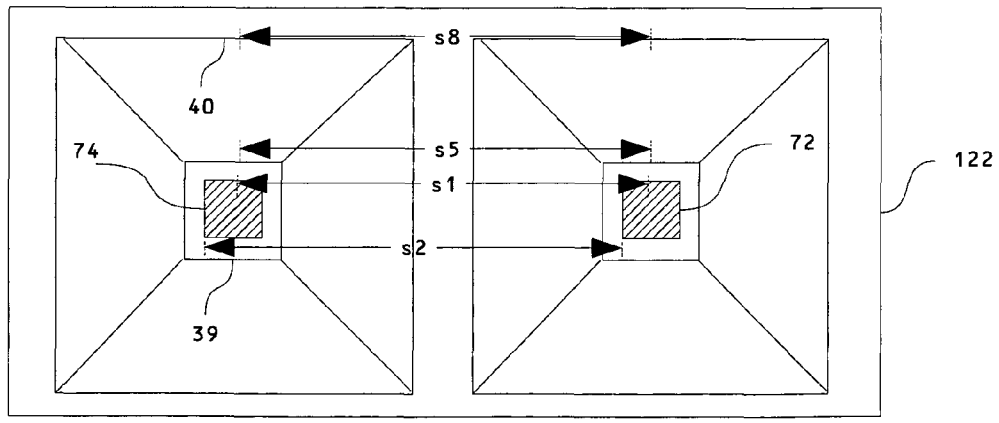
FIG. 12d shows in plan view an illumination array apparatus.
Figure 12E:
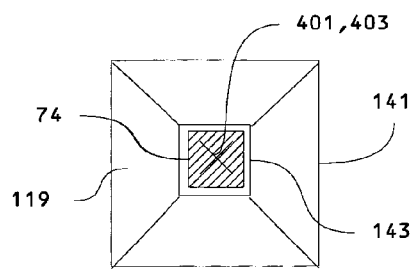
FIG. 12e shows in plan view one light-emitting element and optical element array of an illumination array apparatus.
Figure 12F:
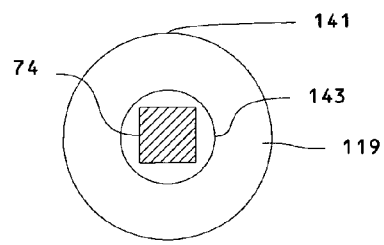
FIG. 12f shows in plan view one light-emitting element and optical element array of an illumination array apparatus
Figure 12G:
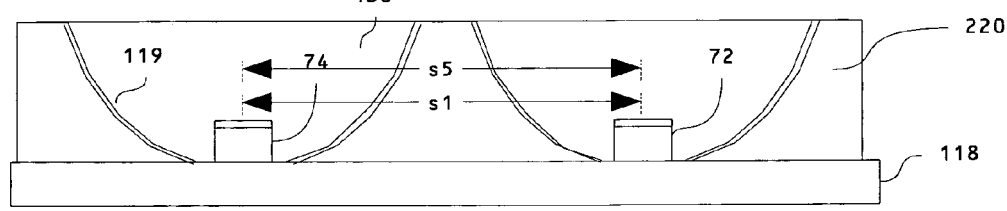
FIG. 12g shows in cross section a further an illumination array apparatus.
Figure 12H:
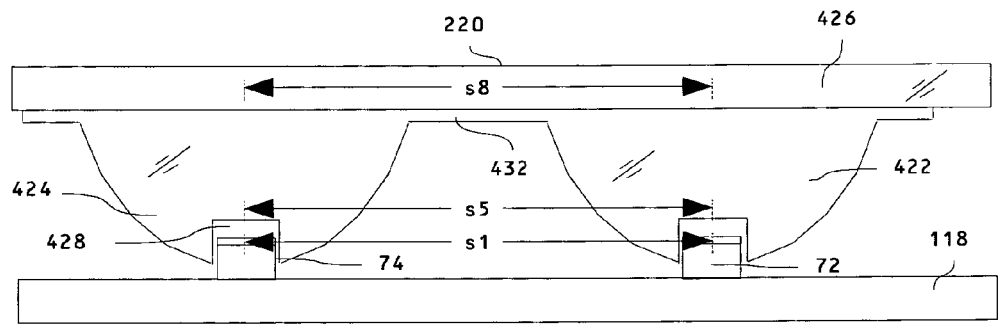
FIG. 12h shows in cross section a further an illumination array apparatus.
Figure 12I:
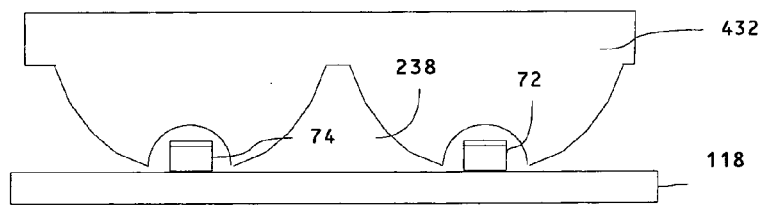
FIG. 12*i* shows one step for the forming of a monolithic optical element array.
Figure 12J:
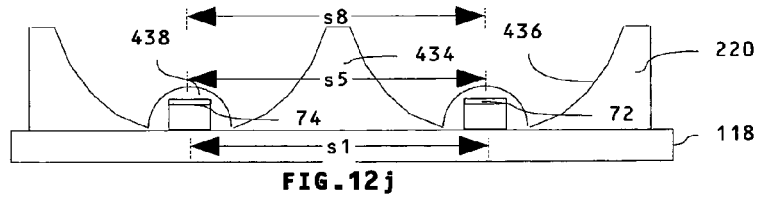
FIG. 12*j* shows a further step for the forming of a monolithic optical element array.
Figure 12K:
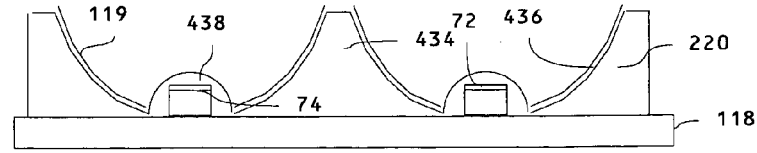
FIG. 12*k* shows a further step for the forming of a monolithic optical element array.
Figure 12L:
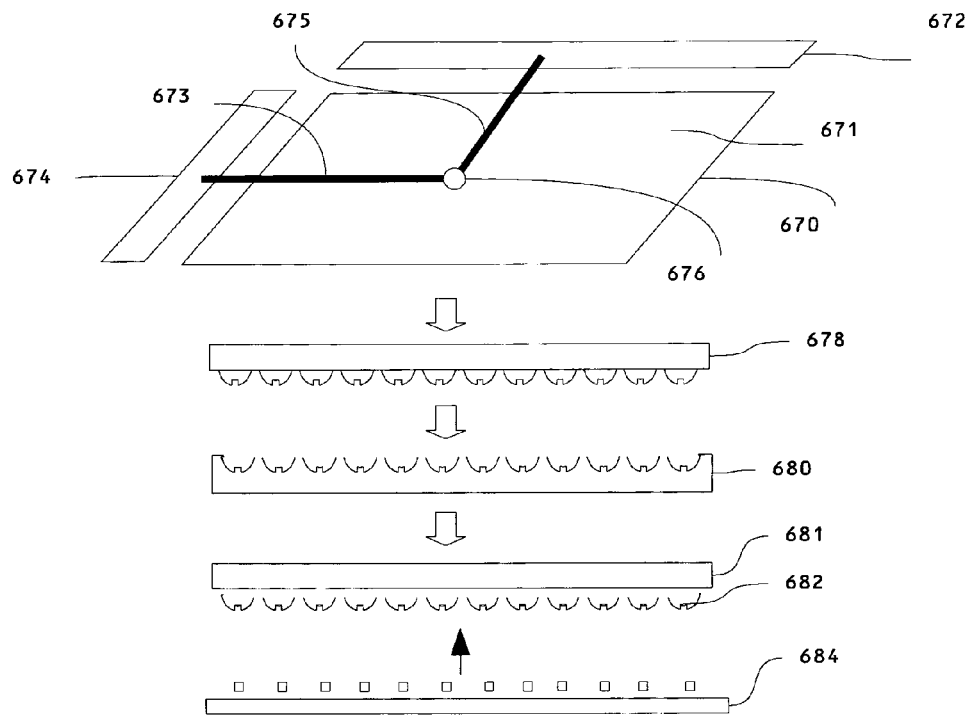
FIG. 12*l* shows a method to form the microscopic illumination arrays of the present embodiments.

FIG. 12l illustrates schematically a microscopic optical element array fabrication method. A surface 670 has a forming material 671 (such as a metal, photoresist or other polymer) on its surface and is addressed by a tool 676 linked by actuators 673, 675 to interferometrically controlled stages 672, 674. The tool may be for example one or more diamonds to sculpt the surface of the forming material 671 in each location in the array of elements. Alternatively, the tool 676 may be a structured light beam used to sculpt directly into the forming material 671, for example by means of laser ablation. Alternatively, the forming material may be illuminated through a mask that has been recorded optically or by electron beam for example using interferometrically controlled stages. A further heating step may be used to partially melt the structure to modify the surface shape. Advantageously the process to master the array of optical elements has similar tolerances to those used to form the light-emitting elements.

The output of the device is a surface structure 678 in the forming material 671. In a first replication step this is replicated to form a tool 680 in a material such as nickel, which may comprise an electroplating step. In a second replication step, the microscopic optical element array 682 with input aperture separation s5 may then be formed by replication from the tool 680 into a material such as by means of UV casting, embossing or other known replication techniques. An optional support substrate 681 may be further provided to provide rigidity and increase dimensional stability of the optical element array. Advantageously the writing pattern may be calibrated with the light-emitting element fabrication process so that the separation s5 produced by the optical element fabrication process is substantially the same as the separation s1 produced by the light-emitting element fabrication process, such as shown in FIG. 12h for example.

Advantageously, multiple surface structures may be combined with high precision of separation across the array. For example, as will be described in FIGS. 26a to 26c, high precision tools for first and second surfaces may be formed and aligned for fabrication of the optical elements. Alternatively, first and second optical element arrays comprising first and second optical surfaces may be formed and subsequently aligned. Such surfaces require high precision of separation in order to achieve accurate alignment across the array of respective surfaces.

Advantageously the microscopic nature of the present embodiments achieves low thickness of the optical surfaces which are well suited to such a microscopic array fabrication process. By way of comparison, such techniques are more difficult to use with optical elements sized for macroscopic LEDs due to the high thickness.

Thus forming the monolithic array of light-emitting elements preferably comprises using an interferometric stage or positioning system commensurate with the accuracy produced by an interferometric stage (for example to produce mask 62) and forming the array of optical elements comprises using an interferometric stage such that the processes are commensurate.

After replication, the surface of the array 682 may be coated with a reflective material so that the structure 122 provides a light deflection function. An alignment step is used to align the array 684 of non-monolithic light-emitting elements from a monolithic array with the optical element array 682, and the elements may be attached.

In FIG. 12b, the tool 90 with mounted elements 72, 74 is aligned with respect to the optical element 122. After alignment step, the vacuum is released with the elements correctly positioned. The elements 72, 74 are attached to the substrate 118 by means of solder pads, solder bumps, thermal conductive adhesive or other bonding method. Alternatively the steps of FIG. 12a and FIG. 12b can be reversed so that the LED elements are aligned to the substrate 118 prior to the application of the elements 122.

The reflective elements provide a function as shown in FIG. 12c. Light rays 126 normal to the surface are unmodified while light rays 128 are deflected out of plane. The distribution of light rays 126,128 is one example of a directional distribution.

FIG. 12d shows in plan view the monolithic optical element array 122 comprising pyramidal reflective structures with input aperture 39 and output aperture 40 that form the optical elements of the monolithic optical element array. The input apertures are aligned with the light-emitting elements 72, 74. In particular, it can be seen that the non-monolithic light-emitting element array 72, 74 and the array of optical elements of the monolithic optical element array are aligned such that the input aperture of a given optical element is aligned with a respective light-emitting element.

As the tolerance of the LED separation s1 and prism separation s5 can be carefully controlled, the light-emitting regions of the LED elements can advantageously fit at the same nominal position within the prism elements so that the light output direction is uniform across the array.

Further, the separation s2 of the cut edges of the elements 72, 74 across the array of light-emitting elements will be similar to the separation s1 and so the light-emitting elements can mechanically fit closely with the input apertures 143 of the prism array, increasing device efficiency.

FIG. 12e shows that preferably the centre of mass 401 of each non-monolithic light-emitting element is preferably aligned with the optical centre 403 of the input aperture so that a specific point, 401, for example the centre of mass of the light emitting aperture of the light emitting elements 74 is aligned with a specific point 403, for example the optical centre of the input aperture 143 for each respective input aperture. Advantageously, the optical output cones from each optical element are thus parallel which optimises the light coupling output within a defined cone angle.

FIG. 12f shows that for a square LED die 72, the apertures 141, 143 can have a circular profile, for conical structures. Such a structure may be mastered by diamond tooling using a rotating diamond. The tight tolerance of the separation s1 across the array for the light-emitting elements and the preservation of the separation s5 in the optical element array mean that a consistent alignment between LED and light deflection optic is preserved across the array of elements, increasing coupling efficiency in a particular direction. The orientation of the input apertures for array 122 can be matched to the orientation of the elements 72, 74 to advantageously optimise the coupling efficiency from the array. Advantageously, the orientation of the elements 72, 74 is preserved from the orientation in the monolithic light-emitting element wafer so that the output is uniform across the array.

FIG. 12g shows schematically another embodiment in which the surface profile of the reflective material 119 of the elements of the monolithic optical element array 220 is modified so as to provide a smaller solid angle of output than that shown in FIG. 12a. Such elements can be fabricated using a shaped diamond imprint at each location in the array or by polymer sculpting as described above. In order to increase the light output of the device, a further material 430 can be applied to the cavity and planarised. Such a material can for example be a silicone. The top surface can also be modified by patterning a structure such as a diffuser, lenses, reflective elements or diffractive elements on the top surface of the filling material to advantageously modify the output directionality.

FIG. 12h shows an alternative monolithic optical element array 220 comprising a substrate 426 and elements 422, 424. In this embodiment, the optical elements 422, 424 are catadioptric. They are formed by means of replication onto a substrate 426. The light-emitting elements 72, 74 may be index matched to the optical elements by means of an adhesive in the cavity 428. In this embodiment, the optical element comprises separate materials, for example the elements 422, 426 may be cast in a low shrinkage UV curable photopolymer, whereas the substrate 426 may be a glass substrate. Residual material 432 may be in found on the surface between the output apertures of the individual elements or can be removed. The separation of the optical elements is fixed at the forming step for the respective optical elements. Thus the separation s5 and s8 of the output and input apertures are fixed when they are formed using processes that have equivalent and calibratable accuracy to the process used to form the non-monolithic light-emitting element array. Advantageously, such an arrangement may provide higher dimensional stability than that of a single material layer. Thus in this embodiment the relative spatial positions of the optical elements in the array of optical elements is provided when the optical elements are formed. Advantageously the elements have separations s5 and s8 that are matched to the separation s1 of the non-monolithic light emitting elements. The optical elements may be a separately fabricated array of optical elements (such as shown in FIG. 26b) which are attached to a substrate to provide for example stabilisation of pitch. Thus the optical elements 422, 424 of the array of optical elements and at least one substrate 426 may form an integrated body, the forming of the integrated body comprising attaching at least the optical elements to the substrate in a manner that preserves the relative spatial positions of the optical elements. Alternatively, the integrated element may be formed by curing a material in contact with the substrate and a shaped tool. Thus at least the optical elements of the array of optical elements and a substrate may form an integrated body, the forming of the integrated body comprising forming at least the optical elements on the substrate. Further elements such as diffusers, and field lenses may further be attached to the substrate 426.

FIG. 12i shows another method to form the monolithic optical element array 220. A shaped microscopic tool 432 is aligned with the elements 72, 74 mounted on a substrate 118 and a material 238 (for example a silicone material) which may be curable used to fill the gap therebetween, as shown in FIG. 12j. The structure has hemispherical structure regions 438 and regions 436 that are coated with a reflective material 119 as shown in FIG. 12k. Thus light is effectively coupled from the light-emitting elements 72, 74 into air in the reflective cavity of the element. Advantageously the light coupling regions are formed in the same step as the reflective surfaces regions.

Advantageously, thin layers of materials for the microscopic elements of the present invention have higher dimensional stability than thicker layers. The relative spatial positions of the optical elements in the array of optical elements is provided when the optical elements are formed. Advantageously the elements have separations s5 and s8 that are matched to the separation s1 of the non-monolithic light emitting elements. The step of aligning the non-monolithic array of light-emitting elements with the array of optical elements is performed at the same time the optical elements are formed by forming the respective optical elements in an aligned fashion with respect to respective light-emitting elements. Advantageously, the number of process steps and thickness is reduced.

Figure 13A:
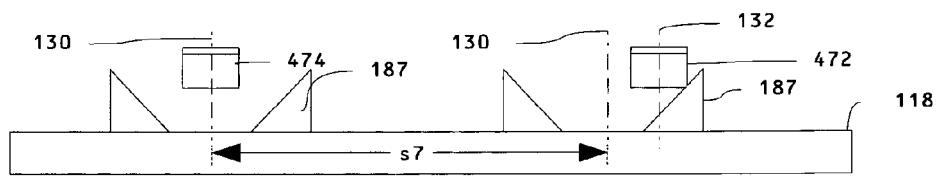
FIG. 13*a* shows the effect of position alignment errors in an illumination array apparatus.

By way of comparison, FIG. 13a shows in cross section the effect of errors that may occur with a known alignment method such as pick and place between elements 472 and 474 and an array of optical elements 187, such as light deflection elements arranged to capture light emitted from the edge of LED elements. Elements 472 and 474 have a poorly controlled separation which varies for each different pair of elements. Element 474 at central position 130 may be well aligned with one of the elements 187, while the element 472 at offset position 132 is not correctly aligned with the structure. Such alignment errors will occur particularly with small size elements 472 and 187. Further, such known 'pick and place' alignment methods are subject to run-out errors, such that while adjacent elements in the centre of an array may align adequately, at the edge of the array the misalignment becomes unacceptable. For example, a pitch error of 10 micrometer in 1 mm may become 100 micrometers over a 10 mm device so that elements at one edge of the array do not fit at all with the respective optical elements. It is the purpose of the present embodiments to reduce the individual LED device size compared with the prior art devices in order to increase overall system efficiency, as well as to provide many other benefits as outlined elsewhere.

Figure 13B:
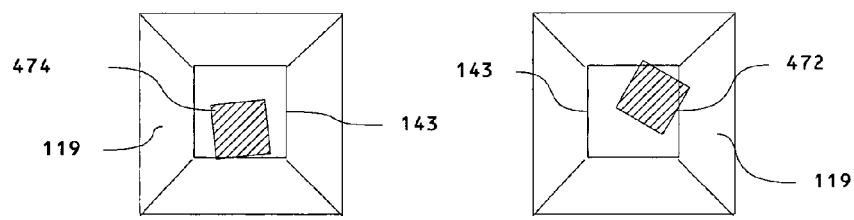
FIG. 13*b* shows the effect of position and orientation alignment errors in an illumination array apparatus.

Further by way of comparison, as shown in FIG. 13b, known pick-and-place alignment methods will suffer from errors in orientation of the LED devices compared to the electrode array and optical element array. Thus element 474 may just fit within input aperture 143 of a first element while element 472 may not fit within the aperture 143 of the adjacent element input aperture due to its different orientation and position. This can lead to optical coupling non-uniformity and misalignment of electrodes so that some devices may not be correctly corrected and yield is reduced. The solid angle of output of the device may increase, so that the output is not as well controlled as the embodiments of the present embodiments. Thus advantageously the present embodiments control the separation and orientation of the light-emitting elements to optimise device efficiency and yield and reduce output solid angle.

In order to achieve such a reduction in size, it is necessary to use many devices to provide the total light flux of the device. For example, a 1×1 mm total emitting LED area may comprise 100 devices each of size 100×100 micrometers, each emitter separated by for example 1 mm in horizontal and vertical directions. By way of comparison, using prior art assembly methods, such an element would require 100 separate alignment steps, each of accuracy of order 5 micrometers or less, with total run-out tolerance of 5 micrometers over the array area in two dimensions, in order to provide adequate overall device light output uniformity. Without this accuracy, misalignments are produced as indicated by FIG. 13a over the total width of the device in which the relative alignment axis 130 with respect to the centre of one structure is different to the relative alignment axis 132 of another device to a second structure. Such a misalignment would cause a difficulty in mechanical mounting, as well as differences in the optical output across the array. The optical output would provide non-uniform illumination output which may be unacceptable in many applications. Alternatively for directional optics, the total output beam shape, or illumination profile, may have undesirable optical profile and increased solid angle.

The inventors have appreciated the unexpected result that device performance, functionality and cost can be significantly improved by reducing LED size rather than increasing it. Such performance increases can only be achieved by achieving high precision alignment in position and orientation between each element of the array. Such precision alignment is achievable at low cost by preserving the separation and orientation of the LED elements (i.e. light-emitting element) from the monolithic light-emitting element array and aligning with a high precision optical element arrays fabricated to similar tolerances with separation substantially the same as separation s1.

The alignment steps can be made between arrays rather than individual elements so that the process uses a reduced number of steps, thus reducing cost. In this way, a single alignment step can be used for each array. The total emission from arrays of microscopic light-emitting devices may be higher than from a single equivalent macroscopic device due to reduction in internal absorption losses so that such an array can be arranged to provide higher efficiency.

Further, the array is comprised of many individual elements from across the width of a wafer. The array of elements may suffer from yield losses, as common in such devices. Advantageously, as the individual LED elements each produce 1% of the total light flux, individual element failures or errors are not as significant as for macroscopic devices.

Figure 14A:
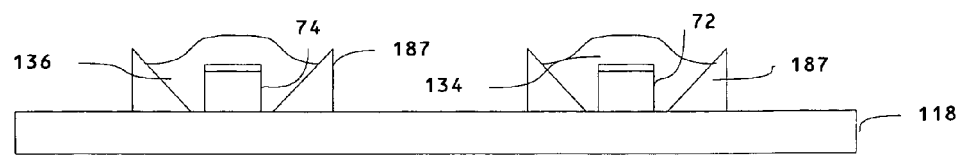
FIG. 14*a* shows in cross section the addition of a phosphor layer to a non-monolithic light-emitting element array.
Figures 31, 32:
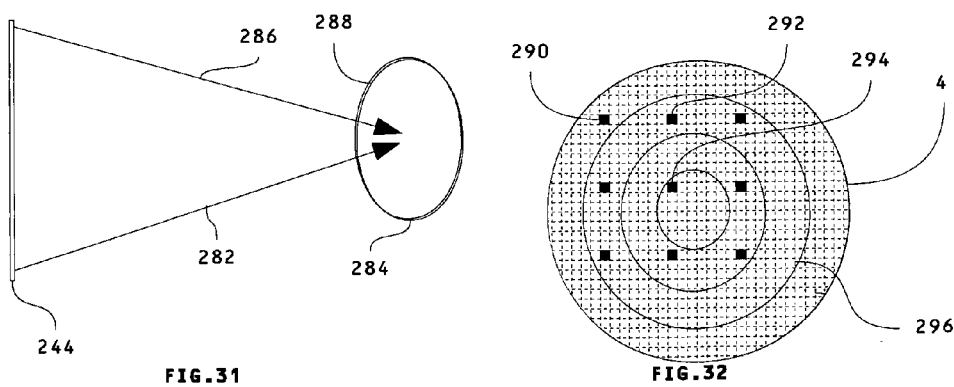
FIG. 31 shows a spot illumination structure.
FIG. 32 shows the selection of a non-monolithic light-emitting element array from a monolithic light-emitting element array with varying light-emitting element properties across the monolithic light-emitting element array.

LED binning is well known in which the output from each LED is measured and used to define which bin the LED should be placed in. For example luminance and colour bins are selected for light source design. The colour uniformity of the device can be enhanced by using elements from various bins, thus reducing cost. For example, blue emitting LEDs can be combined with a high precision phosphor array, for example by printing. In FIG. 14a, the array elements 72, 74 and prism elements 187 are coated with phosphor layers 134 and 136 respectively so that the light-emitting elements further comprise a light wavelength conversion layer. The output wavelength and intensity of each LED element may vary across the wafer, for example due to variations in thicknesses of the epitaxial layers during monolithic wafer growth so for example the colour of element 72 may be slightly different to the colour of element 74 as illustrated in FIG. 32 below. The phosphors may be printed in registration with the alignment of the individual LED and optical elements. The composition of the phosphor may be adjusted across the array area so that the colour output is appropriately modified. The total colour output of the device may be set to be an average of many different arrangements so that the colour can advantageously be statistically controlled at lower cost than conventional binning techniques. Advantageously the outputs of the different colour beams will overlap in the far field so that the colour differences are not visible to users.

Figure 14B:
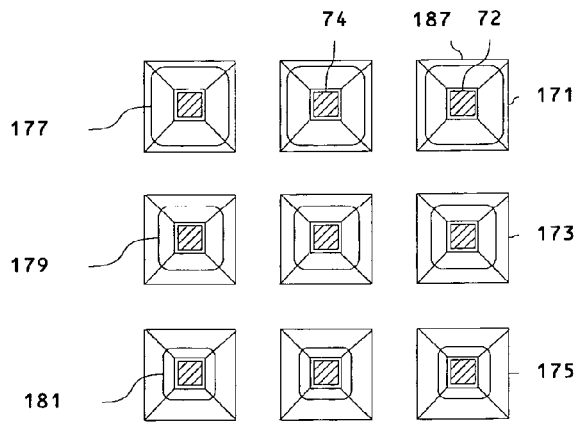
FIG. 14*b* shows in plan view a switchable colour temperature illumination array apparatus.

In FIG. 14b, the output of an illumination array can be controlled by depositing different amounts of phosphor with different elements of the array. Thus for row 171 of an illumination array, phosphor 177 may be added to cover a certain depth in the prism elements 187. In row 173, a reduced amount of phosphor 179 may be introduced and in row 175, even less phosphor 181 may be introduced. In this manner, row 171 will have a colour temperature that is more yellow than rows 173, 175 while row 175 while have a more blue colour than rows 171, 173. By selecting which of the rows is driven, the colour temperature of the final output of the array can be modified. For example, such an arrangement can be used to provide mood lighting so that the colour temperature of the light varies through the day to suit usage. Optionally different phosphors can be used on different emitters and or different amounts of the same phosphor.

Figure 15A:
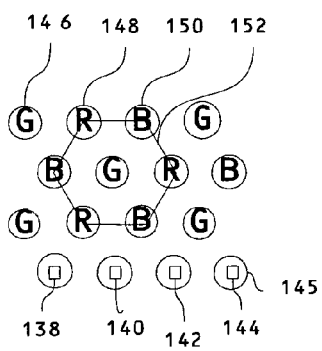
FIG. 15*a* shows one arrangement of coloured light-emitting elements in an illumination array.
Figure 15B:
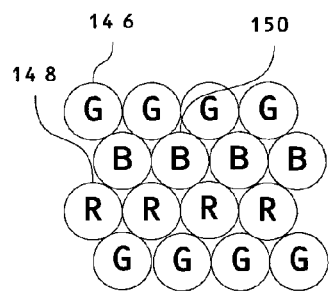
FIG. 15*b* shows a further arrangement of coloured light-emitting elements in an illumination array.
Figure 15C:
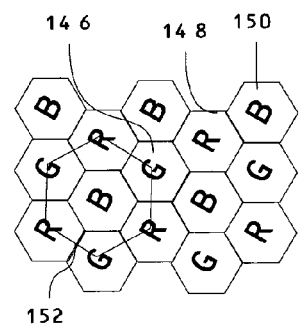
FIG. 15*c* shows a further arrangement of coloured light-emitting elements in an illumination array.

The colour of emission from some of the light-emitting elements may be different to the colour of emission from some others of the light emitting elements. In devices which use separate arrays of for example red, green and blue LEDs, the spatial and angular separation of the light output can be reduced, so that colour non-uniformities are reduced. The LEDs can be arranged so as to minimise the observed luminance differences between the separate elements as shown in FIG. 15. In FIG. 15a, light sources 138, 140, 142, 144 are positioned within light directing optics with an optical element array output aperture 145. The colour of each green 146, red, 148 or blue 150 light-emitting element is marked and the colour arrangement of red and blue elements surrounding a green element by the hexagon 152, providing a hexagonal unit cell. In this case, the array is formed by LED elements from three separate wafers (for red, green and blue peak emission wavelengths) and combined on a single substrate. It may be desirable to use different total number of elements of each colour to optimise white balance and device efficiency. In that case, there may be a non-uniform distribution of the LED elements from a single wafer, although the relative position and orientation of the elements is preserved from the monolithic light-emitting element wafer. FIG. 15b shows a different arrangement of green 146 red 148 and blue 150 elements. In this case, the output aperture is wider for a smaller output solid angle. In FIG. 15*c*, the output apertures are hexagonal to reduce the individual source visibility in a low glare region.

Figure 15D:
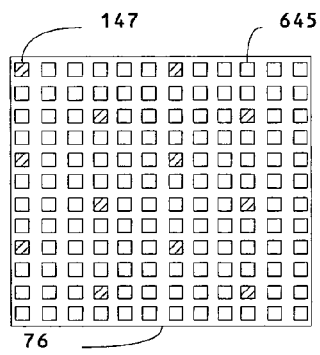
FIG. 15*d* shows a monolithic light-emitting element array and one non-monolithic light-emitting array selected from the monolithic light-emitting array.
Figure 15E:
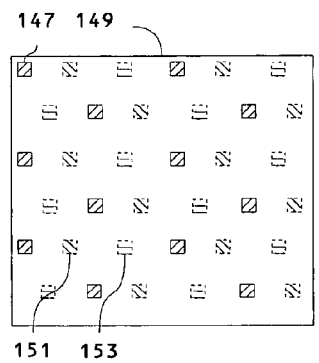
FIG. 15*e* shows an arrangement of a non-monolithic light-emitting array with interlaced non-monolithic light-emitting element arrays.
Figure 15F:
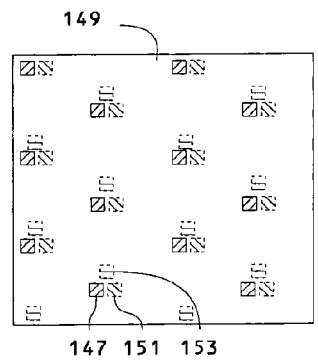
FIG. 15*f* shows a further arrangement of a non-monolithic light-emitting element arrays with interlaced arrays.

FIG. 15*d* shows a monolithic light-emitting element array 76 of light-emitting elements 645. Shaded light-emitting elements 147, for example from a red emission LED wafer are selected as described elsewhere to form a non-monolithic light-emitting element array on a substrate 149 as shown in FIG. 15*e*. Further non-monolithic light-emitting element arrays 151,153 are selected for example from different coloured wafers and interlaced with the array 147 with equal spacing or as shown in FIG. 15*f* as substantially (but not necessarily exactly) contiguous. Thus a combined non-monolithic array of light-emitting elements is formed from a combination of a plurality of non-monolithic arrays of light-emitting element arrays. FIGS. 15*e* and 15*f* thus show examples of interlaced arrays of light-emitting elements. In this manner, multiple colour non-monolithic light-emitting element arrays can be configured to fall within separate optical elements of an optical element array or within a single light directing optical element. In each case, the precision nature of the selection process means that accurate registration between the elements can be achieved across the illumination array while achieving a thin and low cost arrangement. The separation in the monolithic light-emitting element array is less than the separation in the non-monolithic light-emitting element array. The separation may be the same or different in two dimensions.

Figure 15G:
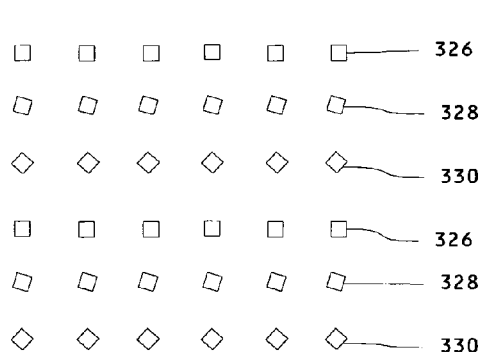
FIG. 15*g* shows a further arrangement of a non-monolithic light-emitting element array wherein the arrays of light-emitting elements have different orientations with respect to the array orientation.

Macroscopic (1 mm×1 mm) square LED chips when directed by optical elements can generate partially square illumination profiles that do not provide the desired lighting geometry, or directional distribution. This effect can be reduced by using diffusers, but results in loss of efficiency. FIG. 15*g* shows an embodiment, in which the light-emitting elements have different orientations across the array so that controlled directional distributions such as symmetric directional distributions can be achieved by the array of optical elements without the need for diffuser elements, thus increasing device efficiency. For illustration, an array of light-emitting elements 326 is interlaced with arrays of elements 328, 330. Three different orientations are shown, but more can be used so that there may exist at least two different orientations of the light-emitting elements with respect to the orientation of the array of light-emitting elements. The final illumination directional distribution is the superposition of the directional distribution from each light-emitting element and respective optical element. The different orientation of the light-emitting elements advantageously achieves a rotationally symmetric directional distribution. This arrangement advantageously enables square light-emitting elements to be used to provide uniformity of illumination without a diffuser. Square devices advantageously enable higher material yields during the fabrication phase. This embodiment has higher efficiency and provides increased uniformity of illumination and directional distribution. Thus some of the light-emitting elements have different orientations of light-emitting aperture to others of the light-emitting elements, arranged to provide a more uniform output beam shape.

Figure 15H:
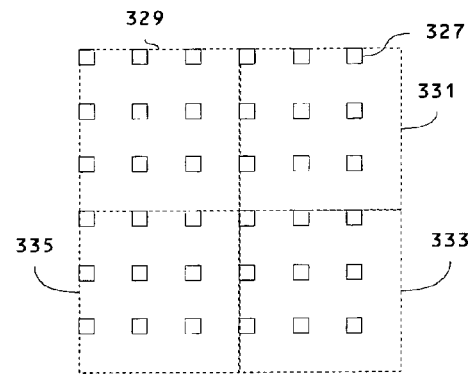
FIG. 15*h* shows contiguous arrays of light-emitting elements.

The arrangement of FIG. 15*g* can be formed from a single monolithic light-emitting element array, in which the orientation of the light-emitting elements is defined to be different across the wafer. The original orientations are preserved in the non-monolithic light-emitting element array. Such an arrangement may reduce the yield from the wafer due to the increased area covered by the rotated elements especially if the wafer is cut in straight lines. Alternatively, the arrangement can be formed by interlacing multiple arrays to increase wafer yield. The pitch of the light-emitting elements in the array may be matched to the orientation of the elements in the final array to enable square elements to be cut on a grid to maximise the yield from the device FIG. 15*h* shows an embodiment comprising multiple arrays 329,331,333,335 of light-emitting elements 327 in which the arrays are contiguous. Such an array is assembled by alignment of multiple arrays, for example by camera and fiducial alignment systems. Advantageously, such contiguous arrays enable the assembly of large arrays of elements fabricated on small wafers with relatively few alignment steps, thus reducing cost. Such arrays can be aligned to high precision, and can be combined with single optical element array so that only one alignment step to the optical element array can be used, thus further reducing cost.

Figure 15I:
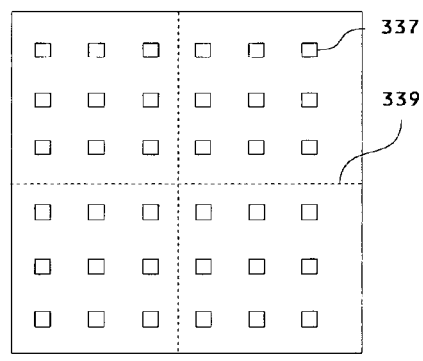
FIG. 15*i* shows the dicing of a non-monolithic light-emitting element array to provide multiple non-monolithic light-emitting element arrays.
Figure 15J:
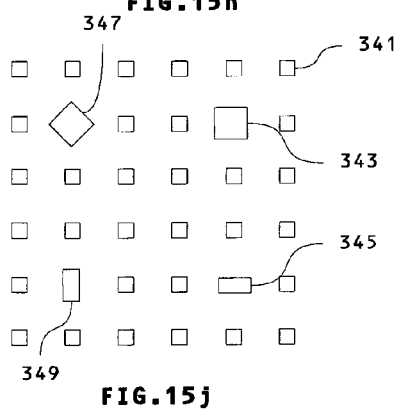
FIG. 15*j* shows a non-monolithic light-emitting element array comprising multiple sizes and shapes of light-emitting elements.
Figure 15K:
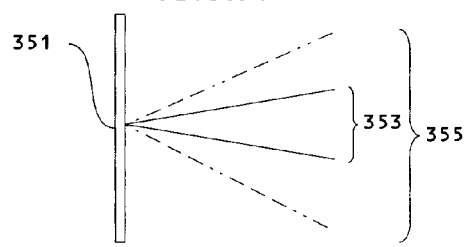
FIG. 15*k* shows a switchable divergence illumination array apparatus.

FIG. 15*i* shows an embodiment in which an array of light-emitting elements 337 is diced along cut lines 339 after fabrication. Cutting may be either before or after each of the steps of attaching electronic and optical element arrays. Such an arrangement can be used to conveniently form many arrays from a single large array, thus reducing array cost. FIG. 15*j* shows an embodiment in which different size light-emitting elements are incorporated. An array of light-emitting elements 341 is combined with an array of larger area elements 343 and an array of extended elements 345. Such an array can conveniently be used to tune the directional distribution of the output when combined with an optical element with a common optical power (or concentration array) across the array as shown FIG. 15*k*. Illumination apparatus 351 comprises an array similar to that shown in FIG. 15*j*. The directional distribution from the elements 341 results in a spot-light type output directional distribution with solid angle 353 (for example to the locus of intensity 50% of the peak intensity) while the directional distribution of the elements 343 achieves a wider angular size of the directional distribution with solid angle 355. The directional distribution of the elements 345 achieves a non-symmetric distribution (not shown). Elements 347 and 349 provide further directional distributions. Each of the elements 343, 345, 347, 349 is from a plurality of light-emitting elements from a monolithic light-emitting element wafer wherein the positions and orientations are preserved. The relative output of the elements can be tuned so that the final directional distribution profile is modified accordingly. Such an array can be used to achieve a wide variation of directional distributions, which may further be switchable as described below. Thus in this embodiment some of the light emitting elements have different shapes of light-emitting aperture to others of the light-emitting elements, arranged to allow provision of a switchable output beam shape in cooperation with switching of the respective light-emitting elements. The switching is in cooperation with switching of the respective light-emitting elements.

The total heat generation from an array of ten by ten 0.1 mm×0.1 mm light-emitting elements would be expected to be substantially the same as a 1×1 mm device, but the heat is generated is distributed over 100 times the area of the prior art device and thus may place less severe restrictions on the heat sinking of the device. In particular, this may be used to reduce the thickness of the device, so that the heat sink has lower physical bulk and can be made more cheaply. Further, the external temperature of the device may be reduced to avoid the risk of burning a user after accidental contact.

Figure 16A:
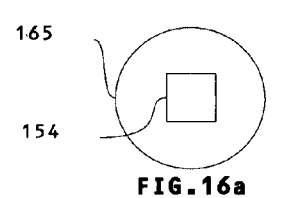
FIG. 16*a* shows a macroscopic LED and optical element in plan view.
Figure 16C:
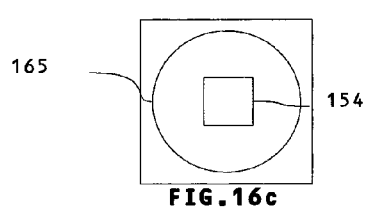
FIG. 16*c* shows an alternative heat sink arrangement for the emitter of FIG. 16*a* in plan view.

By way of comparison, FIG. 16*a* shows a macroscopic LED 154 in plan view, of size for example 1×1 mm together with a catadioptric optical element 165. The LED 154 and optical element 165 are attached to a substrate 156 and cooling structures 158 as shown in side view in FIG. 16*b*. Alternatively the macroscopic LED 154 and element 165 can be attached to a larger substrate 160 and smaller depth cooling structures 162 as shown in FIGS. 16*c* and 16*d*, disadvantageously increasing device area and therefore bulk and cost while still requiring cooling structures.

Figure 16E:
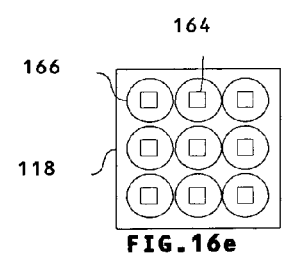
FIG. 16*e* shows a heat sink arrangement for a microscopic non-monolithic light-emitting element array and optical element array in plan view.
Figure 16B:
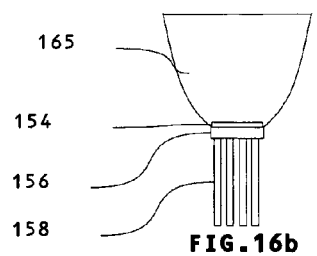
FIG. 16*b* shows a heat sink arrangement for the LED of FIG. 16*a* in cross section.
Figure 16D:
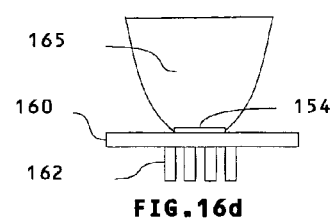
FIG. 16*d* shows the heat sink arrangement for the emitter of FIG. 16*c* in cross section.
Figure 16F:
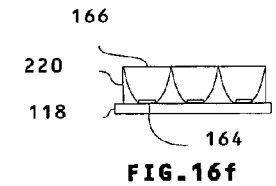
FIG. 16*f* shows a heat sink arrangement for the arrays of FIG. 16*e* in cross section.

FIGS. 16*e* and 16*f* show schematically that for the elements 164 of the present embodiments combined with microscopic optical structures 166 on the array substrate 118, it may be possible to substantially reduce or as shown, remove the need for cooling structures 162 to maintain a low junction temperature of the light-emitting elements for optimum efficiency. Advantageously, the microscopic optical element array is thinner than the prior art macroscopic elements and so advantageously may achieve higher heat dissipation in the forward direction, which may further reduce the heat sinking requirement. This structure advantageously has lower cost and thickness than the macroscopic systems. Further, the operating temperature of the device can be reduced, so that it is less likely to burn a user if it were accidentally touched. The efficiency of transfer of heat from the smaller diode into the substrate can be improved. Further, it may be possible to tolerate a higher thermal resistance between the element and the heatsink layer than possible for the single device.

Figure 17:
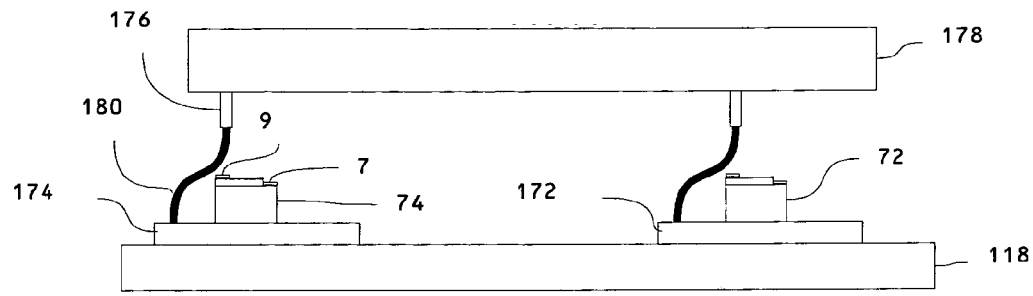
FIG. 17 shows a wire attachment apparatus for a non-monolithic light-emitting element array.
Figure 18:
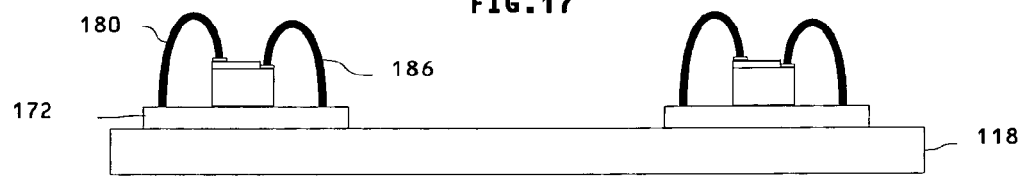
FIG. 18 shows wire bonded non-monolithic light-emitting element array.

FIG. 17 shows a further embodiment. The LED elements 72, 74 are attached as before to a substrate 118, with additional sub-mounts 172,174 between the elements and substrate. The LED elements in this embodiment are of the top electrode type in which contact pads for the electrodes 7, 9 are arranged to provide contact to n-type and p-type layers of the element. A wire mounting tool 178 is arranged with fingers 176 so as to apply connection wires 180 from the sub-mount 174 to the contact pads for the electrodes of the device-74. Simultaneously, a wire 180 is applied between the sub-mount 172 to the electrode 9 of the device 72. As shown in FIG. 18 this is repeated for wires 186 from the respective sub-mounts to electrode 7 of the devices 72, 74. Note that the wires may be attached in multiple sets for mechanical convenience. In this manner, the high positional and orientation precision of the LED elements 72, 74 can also be used to determine the bonding position for the electrodes, thus reducing the number of alignment steps.

The embodiments have the further advantage that the effects of current crowding can be reduced. At the edge of electrodes, care must be taken to ensure that the current density does not exceed a threshold value, otherwise the device efficiency reduces and light hot-spots are created. As the elements are smaller than the typical separation of the electrodes in known devices, the current density at each electrode can be reduced while the total flux of the whole array is constant. In particular, the current density may be substantially proportional to the edge length of the electrodes. As the elements 72, 74 are small, and less current is required per element, the relative edge length of the electrodes per unit area may be reduced, so that the overall electrode size as a function of device area may be reduced, increasing overall output per unit area of wafer. In particular, electrode designs which may not be possible with macroscopic chips may be acceptable for the array elements of the embodiments. Advantageously if the elements have the precision of separation s1, the electrode and bonding pad sizes can be reduced, increasing the proportion of light emitting area.

Figure 19:
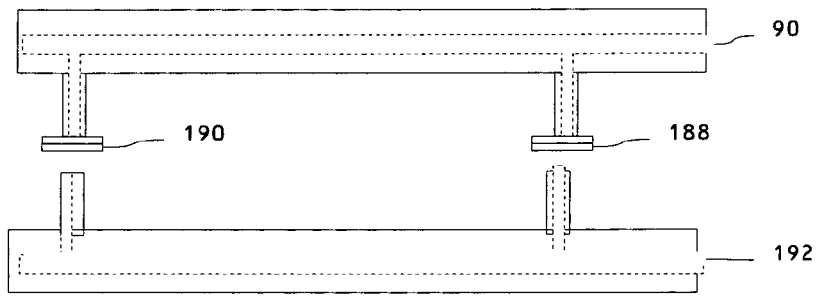
FIG. 19 shows a flip chip handling apparatus.

FIG. 19 shows an example of a thin-film flip chip selection method. In this case, the LED element needs to be inverted prior to mounting to the substrate 118 or sub-mounts 172 so that the electrodes 7, 9 of FIG. 2 are placed down onto the electrode array. Light-emitting elements 188,190 are made in a similar manner to elements 72, 74. After processing of the wafer, the sapphire substrate may be removed by laser processing and the rear surface roughened as is known. It may be desirable to invert the elements 188, 190 during handling. In that case, a second tool 192 with vacuum fingers, comprising an array of machined tubes, may be brought against the elements 188,190 and a vacuum applied to the fingers as described previously. The vacuum can then be removed from the tool 90 and the elements are then held in a flipped orientation. The elements are then mounted onto the substrate 118, including the electrode connection, for example by means of solder bumps. It may be possible to then undertake the roughening step when the elements have been mounted on the substrate 118, so as to increase the forward light coupling efficiency. Such elements further increase the output coupling from the device while reducing the separation of the active layer from the thermal heatsinking layer, improving heat coupling efficiency. Advantageously such elements have thin film flip chip properties combined with the properties of non-monolithic light-emitting element arrays of the present embodiments.

Figures 20A, 20B:
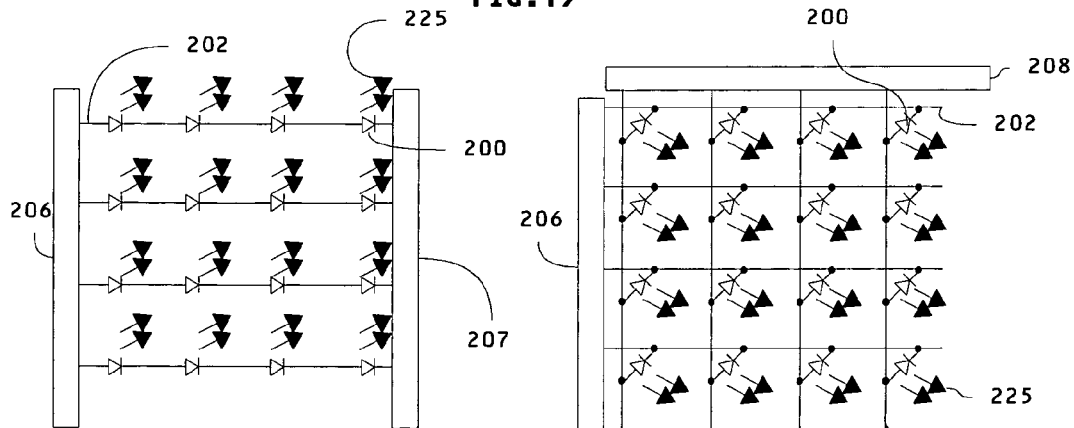
FIG. 20*a* shows a first addressing scheme for a non-monolithic light-emitting element illumination array.
FIG. 20*b* shows a further addressing matrix for a non-monolithic light-emitting element illumination array.

An array addressing arrangement is shown in FIG. 20*a*. An array of light-emitting elements 200, of for example LEDs is arranged in rows and comprises further electrodes 202 and drive electronics 206, 207. For illustrative purposes four light-emitting elements are shown in each row, but this can be any number. Such an arrangement allows the LEDs to be driven in series and addressable as individual rows producing light 225. The polarity of the LEDs in adjacent rows may be alternated so that more than one row can be connected in series; advantageously this may be used to match the series LED voltage drops to the power supply.

A further array addressing arrangement is shown in FIG. 20*b*, for illustrative purposes showing a 4×4 array. An array of LED elements 200 of the embodiment arranged in rows and columns comprises further electrodes 202, 204 and drive electronics 206, 208. The sharp threshold nature of the light output with voltage input of the individual elements means that they can be multiplexed. By applying suitable time varying control voltages to the rows and columns, each LED can advantageously be individually addressed for a period of time, to provide varying optical power for different elements in the array. Thus the illumination apparatus may thus comprise at least one drive circuit arranged to control the emission of at least some of the light-emitting elements different to the others of the light emitting elements. The at least one drive circuit may comprise row and column drive circuits that are arranged to individually control the emission of each light-emitting element. This can advantageously be used to provide a display type function.

This arrangement can be used to optimise the uniformity of the output of the individual elements, in order to overcome differences in the device characteristics across the array. The array can be used to correct differences in the ageing properties of different elements in the array. As described below, such elements can be used in combination with light directing optics to provide dappling of output, or for high resolution dynamic contrast effects in LCD backlighting. Further, such elements can be used to provide user tunable spotlighting functions such as structured lighting effects.

Figure 21:
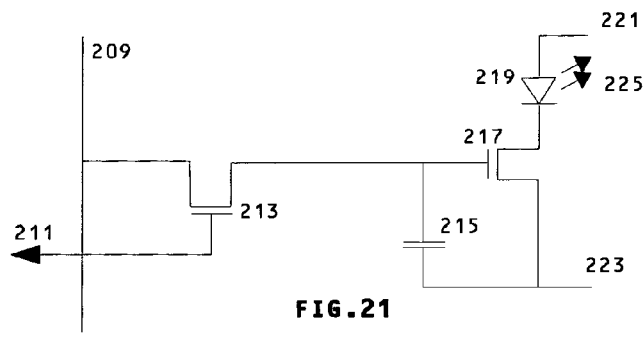
FIG. 21 shows an addressing circuit for each element of an illumination array.

Alternatively the array of LEDs may be controlled by addressing electrodes and additional circuitry at the pixels, as shown for example in FIG. 21. A source signal line 209 and gate line 211 connected to transistor 213 transfers the LED control voltage onto capacitor 215. The drive transistor 217 then operates the LED 219 when connected across voltage

Figure 22:
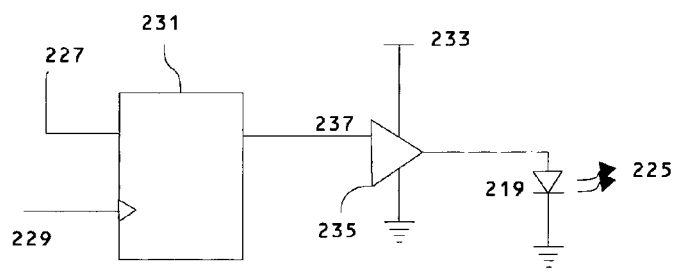
FIG. 22 shows an addressing circuit for each element of an illumination array.

221, and common 223, which emits light 225. One further circuit that could be used at each pixel is illustrated in FIG. 22. Control data 227, which may be analogue or digital, is latched by latch 231 and clock signal 229. The output 237 of the latch 231 is fed to the amplifier 235 with source 233 which drives LED 219 in response to data 227. Advantageously FIG. 21 and FIG. 22 enable the LED 219 to emit for longer that the addressing period compared to the arrangements of FIGS. 20a and 20b. FIG. 21 is advantageously suitable for implementation in a thin film transistor electrode array while FIG. 22 is suitable for implementation in a crystalline electrode array where more complex circuit functionality can be provided, for example polycrystalline or crystalline silicon.

Figure 23:
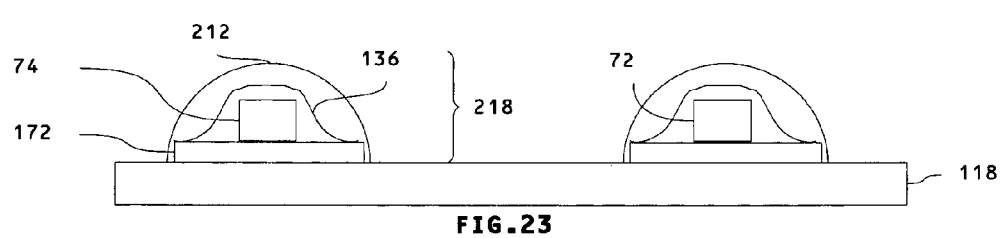
FIG. 23 shows a method to efficiently extract light from an array of non-monolithic light-emitting elements.

FIG. 23 shows an array of mounted illumination elements 218 comprising non-monolithic light-emitting elements 72, 74 mounted on carriers 172 with phosphor layer 136 and hemispherical structures 212. The structures 212 do not provide any substantial light directing property for the output of the LED but serve to increase the light coupling efficiency into air from the light-emitting elements. Such structures may be used in cooperation with microscopic optical element arrays of the present embodiments. Thus refractive structures may be aligned with at least some of the optical elements of the optical array and the light-emitting elements of the non-monolithic array of light-emitting elements.

Figure 24:
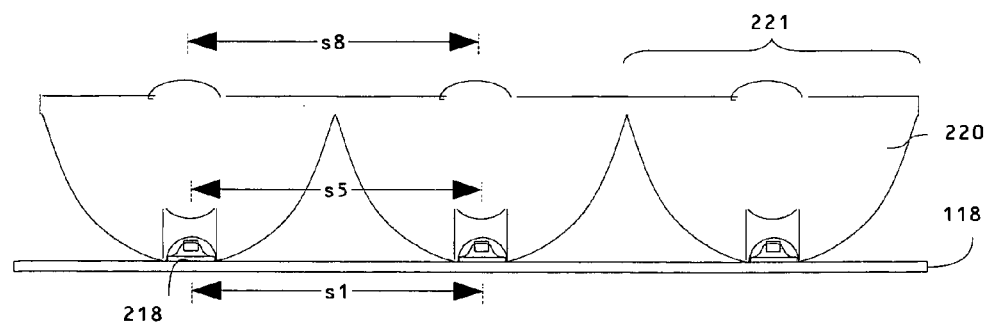
FIG. 24 shows an illumination apparatus comprising a microscopic non-monolithic light-emitting element array and an aligned microscopic catadioptric optic element array.

FIG. 24 shows the addition of a catadioptric monolithic optical element array 220 to the array of mounted illumination elements 218. Array 220 comprises an array of light directing elements to reduce the output solid angle compared to the solid angle of the light-emitting elements is affixed to the top surface, with input aperture separation s5 and output aperture separation s8 substantially the same as the separation s1 of the LED array elements of the illumination elements 218. By way of comparison 'tube' type luminaires achieve sparkle in light sources but disadvantageously use lighting cavities in building structures. The present embodiments achieve high sparkle and low glare sources from flat structures that can be attached to flat surfaces without recesses, thus reducing installation costs.

The non-monolithic light-emitting element arrays and microscopic optical element array of the present embodiments are well suited to producing directional arrays of devices, as the separation between the adjacent elements is greater than their size. As étendue needs to be conserved during the light directing stage, the area of the source will increase as the solid angle reduces, or directionality increases. Directionality can be defined for example by the inverse angular width of the half brightness cone for a single source of the array. High directionality (small output solid angle) achieves increased 'sparkle' lighting effects with low glare, while low directionality (high output solid angle) achieves flatter Lambertian type illumination with less sparkle and increased source glare from high angles.

Thus the minimum separation s1 of the light-emitting elements 72, 74 can be determined from the directionality output needed in a particular axis. Advantageously, the thickness of the optical elements 220 is reduced compared to macroscopic optical elements, so that the material cost is reduced. Further, such elements have the same total output area as for known light-directing optics, so that an array with total area substantially the same for a given directionality property is achieved.

It may be desirable to provide a uniform appearance of a directional light source for example for the cosmetic appearance of glare when switched on or of the lamp structure when switched off. The illumination uniformity across the aperture 221 may be low for optical elements such as catadioptric optic arrays. In particular, the output apertures may be circular while the array may be square, so that gaps are present between the output apertures. However, as the size of the output aperture 221 is small compared to known elements, the visual effect of the non-uniformity is reduced. By way of comparison, prior art light sources may require diffusers that hide visual appearance of the illumination non-uniformities at the output aperture. Diffusers reduce directionality and cause light losses so are undesirable. The non-monolithic light-emitting element array and monolithic optical element array 220 advantageously has high directionality and high visual uniformity across the output aperture of the array and has high output efficiency compared to known arrays, while having low cost.

FIG. 25a shows an alternative arrangement of the light directing elements in which the optical element array 220 is formed within a single monolithic substrate with at least one additional mechanical registration feature 228. The array 220 comprises transparent material 222 separated from a support material 224 by a reflective layer 119. The alignment features 226,228 are arranged on substrate 118 and array 220 respectively to achieve mechanical alignment of the two elements as shown in FIG. 25b. In this way, the alignment of the two elements can be determined at the time of fabrication of the tool element, rather than requiring a separate high precision alignment element, advantageously reducing cost and complexity of alignment of the optical element array to the light-emitting array.

The array 220 of FIG. 25a can be conveniently formed for example as shown in FIG. 26. Shaped tools such as nickel tools 234 and 236 mastered with high precision equivalent to the precision used during the fabrication and extraction of the non-monolithic light-emitting element array, are aligned and filled with a curable material 238. As shown in FIG. 26b, after release of the tools, the surface of the reflective part of the optical element is optionally coated with reflective material 240 and a further supporting layer 242 may be added if necessary as shown in FIG. 26c to add rigidity to the structure. The separation s5 of the input apertures is controlled, by means of calibration where necessary, to be substantially the same as the separation s1 of the respective array of non-monolithic light-emitting elements. Thus an optical element array may be formed wherein the relative spatial positions of the optical elements in the array of optical elements is provided when the optical elements are formed. Further, the array of optical elements may be a monolithic array of optical elements.

FIG. 26d shows a further monolithic optical element array 220 in which a flexible and/or transparent section 168 is placed between the adjacent optical elements 201, 203. Thus this array of optical elements is flexible. Advantageously, such a structure can provide device flexibility after mounting of light-emitting elements directly to the array 220. Alternatively, the device can be used to provide switchable beam solid angle as will be described in FIG. 27c.

FIG. 26e shows a further embodiment in which sacrificial elements 243 are introduced between a removable section 169 and the catadioptric elements 201, 203. In each case, the optical element array 220 is aligned to the non-monolithic light-emitting element array with high precision, and attached, for example using an adhesive. The sacrificial elements 243 are then broken and the section 169 is optionally removed. In this manner, a fully flexible array of optical elements can be achieved. Thus flexibility of the array of optical elements is achieved at least in part by forming at least some of the optical elements with sacrificial elements therebetween connecting respective optical elements whilst the relative positions are being provided, and after formation breaking (and optionally removing) at least some of the sacrificial elements. Further the non-monolithic array of light-emitting elements may be flexible, for example using a flexible substrate 118. As described in FIG. 37. Advantageously a flexible illumination structure can be achieved with high precision alignment between the light-emitting elements and respective optical elements across elements of the optical element array. After the step of aligning the non-monolithic array of light-emitting elements with the array of optical elements, the array of optical elements and/or the array of light-emitting elements may be bent, whereby the non-monolithic array of light-emitting elements remains aligned with the array of optical elements even if the relative positions between respective light-emitting elements and/or between respective optical elements has changed due to the bending step. Advantageously, the directionality of the output may be controlled by bending of the light source while maintaining high efficiency of coupling of light from a light-emitting element to the respective optical element. This achieves an output directionality profile that can be adjusted to different structures. The bending may take place at the time of manufacture or may be user controllable, for example by means of manual manipulation. Alternatively, the control of illumination directionality may be adjusted by mechanical actuators and a control system to provide dynamic directionality effects.

Further such directional illumination apparatus comprising array of light-emitting elements and array of optical elements may be produced in a roll. Further, the directional lighting apparatus may be cut to size as required by the application; in this manner, elements of arbitrary shape may be fabricated to advantageously provide aesthetic enhancements.

In the embodiments described above, the LEDs may be mounted on a separate substrate prior to alignment of an optical element array. In that case, the thermal expansion of the LED substrate (118 for example) should be matched to the thermal expansion of the optical element array. Advantageously the substrate such as 426 of FIG. 12h of the monolithic array can be used to provide thermal matching to the substrate 118. Advantageously the material for microscopic optical element arrays that forms the optical surfaces of the array 220 is typically thin so the thermal expansion can be controlled by the substrate 426. Alternatively, attachment of the array 220 to the substrate 118 provides optimum thermal expansion matching. By way of comparison, in macroscopic systems, the high thickness of the optical elements mean that the thermal expansion effects in the optical elements may dominate the alignment characteristics over arrays of large numbers of elements so that the arrays become misaligned as the elements shrink.

Figure 27A:
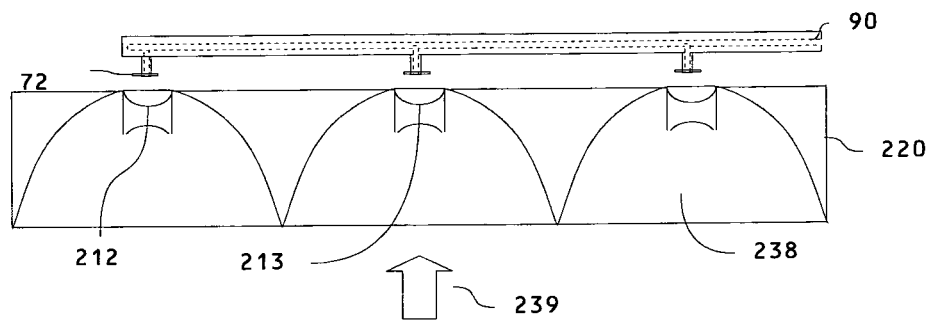
FIG. 27*a* shows an attachment apparatus for a flip chip illumination display apparatus.

FIG. 27a shows an arrangement in which the array of light-emitting elements is mounted directly onto the array of optical elements. The alignment of light-emitting element arrays, optical element arrays and electrode arrays described above are typically achieved in relatively well controlled temperature and humidity conditions to ensure substrate stability of substrates. It may be desirable to use substrate 118 and array 220 with different rates of thermal expansion to reduce device cost and increase flexibility and deformability. Advantageously the dimensional variations during use can be alleviated by bonding the illumination array elements 72, 74 directly to the optical element array prior to attachment to the electrode array substrate. Advantageously, the light-emitting element position will be fixed with respect to the input aperture of the optical element array at the attachment step. The light-emitting elements 72, 74 are attached to hemispherical structures 212,213 mounted in the front of the optical element array 220. Further, such elements can be attached to the rear surface by means of illumination of collimated UV light 239 through the catadioptric optic. In this way the UV light falls in the desired position only.

Figure 27B:
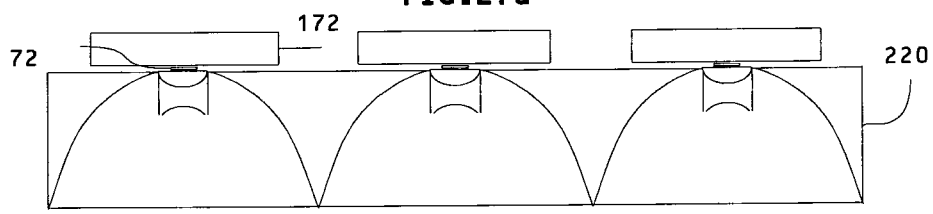
FIG. 27*b* shows a flip chip illumination display apparatus.

After bonding, sub-mounts 172 may be added to provide electrical and thermal contacts as shown in FIG. 27b. A further substrate 118 may then be added if required. Alternatively, the electrode array may be attached directly. The electrode array and the optical element array may advantageously have some flexibility.

In this manner, high uniformity of the device alignment and light output characteristics can be achieved in situations when the thermal expansion of the support, electrode and optical element array substrates are substantially different. In this case, the separation and orientation of the light-emitting elements from the monolithic light-emitting element array is preserved at the time of bonding, although there may be some change of separation and orientation due to thermal shifts during operation. Further, the elements may be deformable so that they no longer lie in a flat plane. However, the advantages of alignment of array achieved by this embodiment are still preserved, providing low alignment cost, low materials cost, high uniformity and low thickness.

Figure 27C:
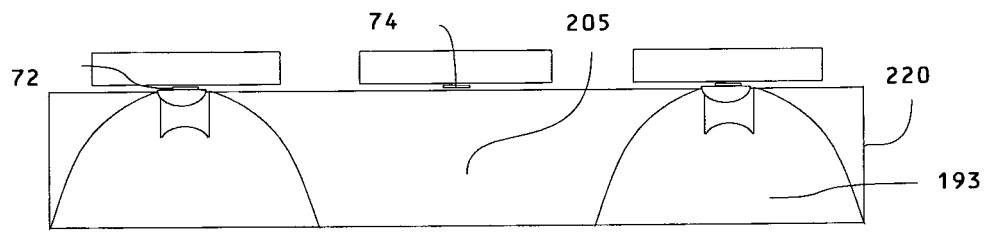
FIG. 27*c* shows an illumination array apparatus in which the number of optical elements in the array is different to the number of light-emitting elements in the array.

In FIG. 27c, a catadioptric element is replaced by a window region 205 with no optical power; in this case the output aperture is defined by the apertures of the other elements in the array. Such an element can be used to achieve an illumination array with first and second directional distributions. Switching between the two directional distributions is controlled by switching the light sources aligned with the respective optical structures (catadioptric elements 193 or window region 205). The separation of the catadioptric elements is controlled during the replication stage so that the array of optical elements remains aligned with the array of light-emitting elements. Alternatively several different optical power catadioptric elements (in which the output aperture shape is a different size (in a given direction) for a given light-emitting element size) could be used in the array to further control the range of directional distributions achieved. Thus in this embodiment some light-emitting elements of the non-monolithic array of light-emitting elements are not aligned with an optical element, arranged to allow provision of a switchable output beam shape in cooperation with switching of the respective light-emitting elements. FIG. 27c shows that the window region forms part of the monolithic optical element array 220 structure and so may incorporate some refractive function to improve light extraction efficiency (such as a patterned diffusing structure on the output surface). The region 205 may further have an air gap between the LED and output surface, or air space between adjacent catadioptric optical elements, in which case an additional hemispherical structure may be incorporated arranged to efficiently couple the light from the LED.

Figure 27D:
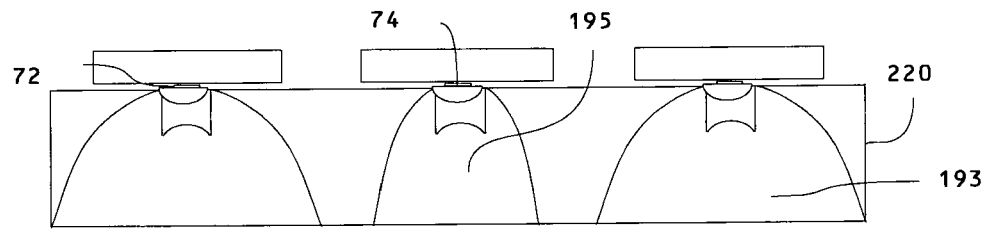
FIG. 27*d* shows an illumination array apparatus in which the size of the output aperture is different across the array of optical elements.

In FIG. 27d, the size of the output aperture and shape of the optical structure of the catadioptric optical element 195 is different to that of the element 193. The structure 193 will typically produce a directional distribution solid angle that is smaller than for the structure 195, due to its larger output aperture size. By switching the respective aligned light-emitting elements, the beam shape can therefore be adjusted. Thus in this embodiment some of the optical elements have different size of output aperture to others of the optical elements, arranged to allow provision of a switchable output beam shape in cooperation with switching of the respective light-emitting elements.

Figure 28:
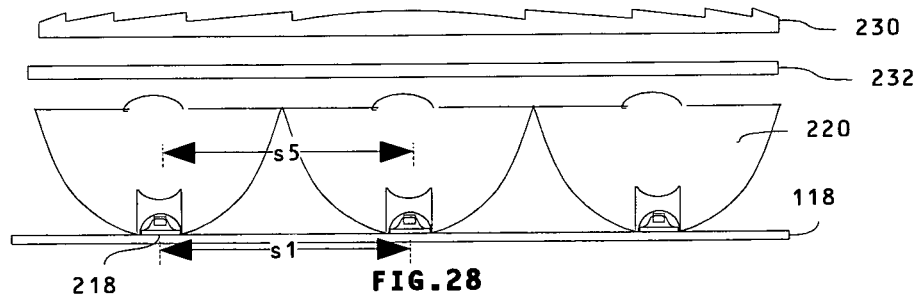
FIG. 28 shows a field optical element for an illumination apparatus.

If the separation s5 of the input apertures of the optical element array 220 is the same as the separation s1 of the light-emitting elements 218 then the direction of the output cones of each device, i.e. the directional distribution optical axis direction will be substantially parallel. Alternatively the separation s5 of the apertures 221 may be slightly smaller than the separation s1 of the light-emitting elements 218 so that the directional distribution optical axis directions of the array are directed towards a common illuminated region, or 'spot' in the far field as shown in FIG. 31. Alternatively as shown in FIG. 28 the separations s1 and s5 are the same and the outputs may be parallel and an additional optical function such as a Fresnel lens 230 may be incorporated in the output of the optical element array. Further a diffuser element 232 may optionally be used to soften the edges of the individual illumination profiles.

If the array of light-emitting elements is translated laterally with respect to the array of optical elements by translating substrate 118 with respect to array 220, then the output beam pointing direction will be changed. In this way, the pointing direction of the optical beam can be controlled by mechanical control of the relative position of the light-emitting element array and optical element array.

Figure 29:
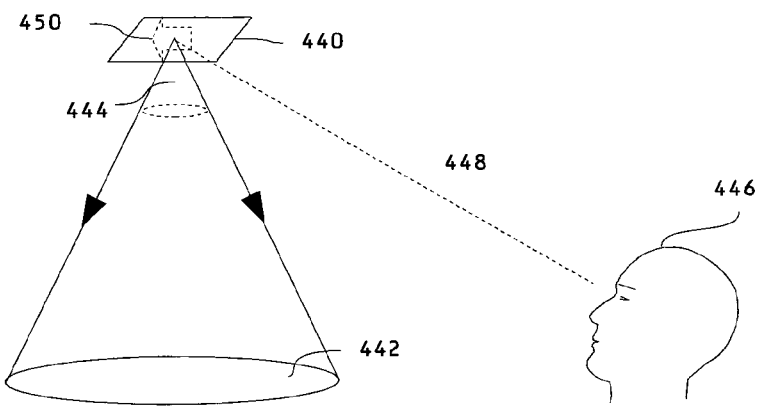
FIG. 29 shows an illumination array apparatus in which a display function is incorporated in a low glare region.

In a further embodiment, a display apparatus can be incorporated into the illumination apparatus as shown in FIG. 29, due to the advantageously small output aperture size of the microscopic elements of the present invention compared to prior art macroscopic optical elements. If the illumination apparatus is Lambertian, then the observer may look directly at the light source, which can be visually uncomfortable. If the light source 440 has a light cone with solid angle 444 to produce an illumination spot 442 representing a high glare region, then the stray light 448 representing a low glare region can be set at a visibly comfortable intensity for an observer 446. The low glare region will typically be the range of observation angles for which the light source luminance is visible and less than a maximum comfortable level, for example greater than 10 candelas per square meter and preferably greater than 100 candelas per square meter; and less than 5000 candelas per square meter and preferably less than 1000 candelas per square meter.

Thus, if the output intensity distribution across the light source 440 is modulated with an intensity structure 450 (shown in this example as an emergency escape direction arrow), then the light can provide a residual display function with higher resolution than prior art systems. Such an illumination apparatus can be used for example for emergency lighting, for product placement or other information purpose. If the sources are coloured rather than white sources, then the output can be a coloured image. Advantageously, if the number of elements that are switched off to provide this function is small, then the total intensity and colour of the output spot 442 will only be slightly reduced in illumination power, and should have nominally an un-patterned intensity profile as it is in the far field of the output of the illumination array. Thus the illumination apparatus provides a high glare region and a low glare region and the light-emitting elements are driven so as to provide a display function that is visible in the low glare region.

Figure 30A:
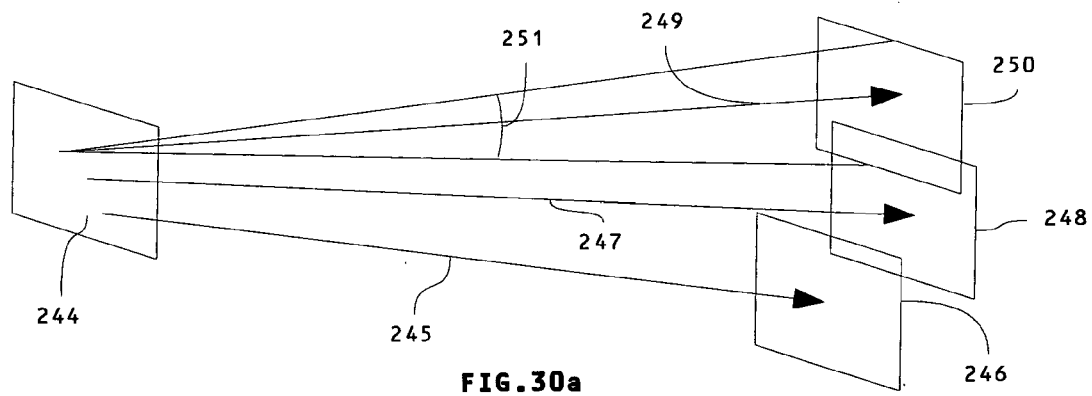
FIG. 30*a* shows the formation of an array of illumination spots comprising an illumination structure.

In a further embodiment, a structured illumination region comprising an array of illumination spots is formed from a directional light source array 244 comprising at least one non-monolithic light-emitting element array and optical element array as shown in FIG. 30a. Each light-emitting element cooperates with a respective aligned optical element to produce an element directional distribution with a respective solid angle and optical axis direction (which may be the direction of peak luminance). The aligned arrays of light-emitting elements and optical elements cooperate to produce an array directional distribution. As will be described below the element directional distributions and array directional distributions can be the same or different, depending on the application. The intersection of a directional distribution with a surface at a defined distance forms an illumination spot, comprising illumination spots 246, 248, 250. Rays 245, 247 and 249 represent the optical axis of the respective directional distributions. The cone angle 251 of the directional distributions may be the different, achieved for example by varying the size of the light-emitting elements or optical power of the optical elements across the width of the array, but typically will be the same.

Figure 30B:
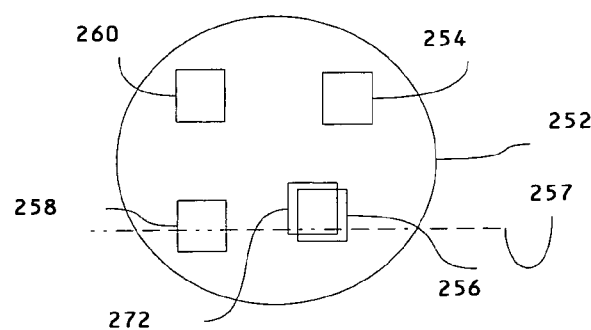
FIG. 30*b* shows an illumination structure.

The optical axis directions of the respective directional distributions are controlled by means of relative alignment of light-emitting elements and output apertures across the array or by means of a field optical element as shown in FIG. 28. The catadioptric elements of the optical element array may use non-imaging optical techniques such that the shape of the spot has some resemblance to the shape of the light-emitting element, or may be modified by means of diffusers for example. If the elements of the array are arranged for example as shown in FIG. 15g, the shape of the individual spots is rotated with respect to each other. Alternatively, the light-emitting elements may be circular to provide more circular output structures from the illumination device. In FIG. 30b, the total illuminated spot 252 is shown, together with some separate spots 254, 256, 258, 260, and 272. The intensity of each of the regions 254-260, each comprising a superposition of spots from individual light-emitting elements.

Figure 30C:
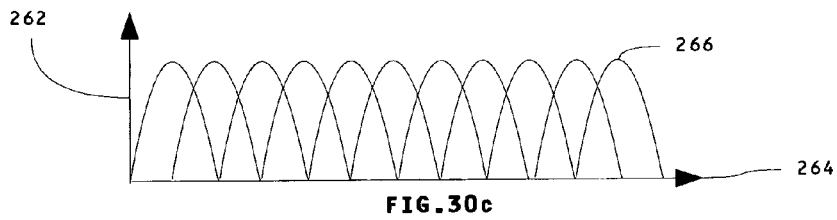
FIG. 30*c* shows a cross section of an array of illumination structures.

FIG. 30c shows a plot of the output if all of the light-emitting elements are driven with the same intensity 262 along a line 257 across the spot plane 264. In the microscopic illumination systems of the above embodiments if a single light-emitting element is faulty or has a different colour output or different intensity output, the change to the total illumination pattern will be small so that advantageously the overall error in the distribution is low. By way of comparison, arrays using small numbers of macroscopic elements are very susceptible to individual LED errors. Advantageously, non-uniformities can be minimised in the present embodiments. Further, the output of individual light-emitting elements can be tuned to provide a uniform intensity by means for example of a calibration of output intensity and electrical control of light-emitting element outputs across the array. Advantageously, the redundancy tolerance of the device is relaxed so that the assembly yield is increased and cost reduced.

Figure 30D:
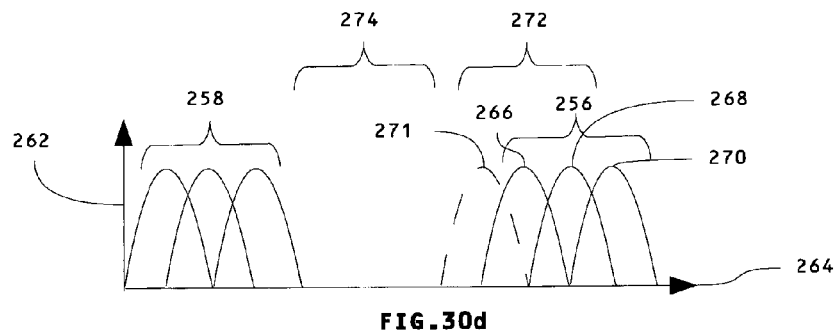
FIG. 30*d* shows position addressed illumination structures.

FIG. 30d shows a further embodiment in which the illumination spot 252 is modified. For example, composite spot 256 in FIG. 30b is formed by superposition of spots 266,268 and 270, separated from adjacent composite spot 258 by gap 274. By switching off spot 270 and switching on spot 271, the position of composite spot 256 moves to a new composite spot 272 position. In this way, the output intensity profile of the illumination region can be adjusted in response to electronic signals applied to the light-emitting element array. For example, it may be desirable to provide a wide range of illumination profile 252 during certain times of day, or for certain operations, while at other times, it may be desirable to direct light only to regions where it is required, thus saving the energy consumption of directing light to unwanted regions of a room. Further, the position of the output can be modified to track the movement of a person around a room, so the light is only positioned where they are working. This intelligent illumination system can enhance the function or mood of the lighting environment while conserving energy.

Figure 30E:
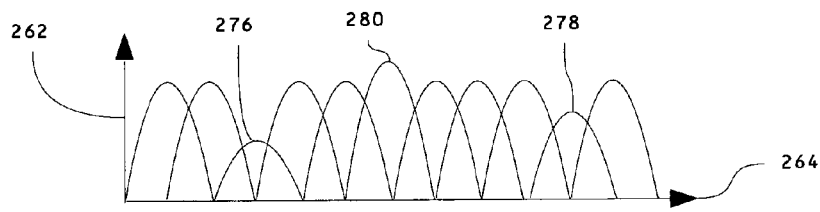
FIG. 30*e* shows intensity addressed illumination structures.

FIG. 30e shows another function achieved by the microscopic illumination apparatus of the present embodiments. In this case, spot intensity may be modified so that for example spots 276, 278 and 280 have intensities varying with time. The illumination apparatus may therefore comprise a controller arranged to provide a temporal variation of light output from of at least some of the light-emitting elements different from some other of the light-emitting elements so as to provide a time varying directional illumination output. This arrangement can advantageously be used to simulate dappled lighting. This arrangement may advantageously provide enhanced levels of enjoyment in a lighting environment.

Figure 30F:
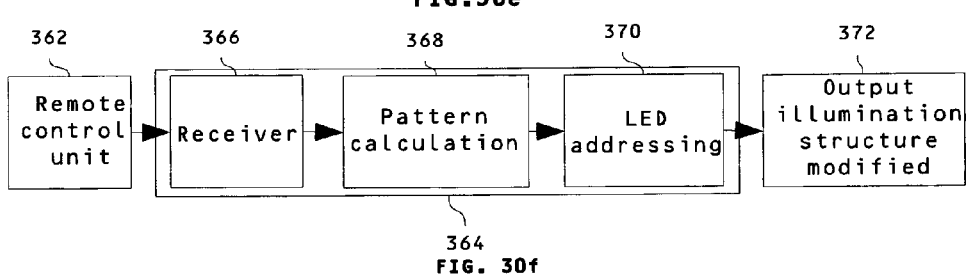
FIG. 30*f* shows a control system for an addressable illumination structure formed by an illumination apparatus.

FIG. 30f shows one control system to set the output of the light source array. A remote control unit 362 may be a handheld infra-red controller for example, or may be a remote sensor such as a camera and associated image processing equipment to determine the position of moving objects in the room. A signal processing system 364 which may be embodied in a microprocessor system comprises a signal receiver 366, an illumination pattern calculation system 368 and an LED addressing system 370. Such an arrangement is used to direct the optical output 372 of the illumination array as described above. Advantageously such a system can be used to conserve energy or increase the visual comfort or mood of a lighting environment.

Further, the colour temperature of the spots may be varied as illustrated in FIG. 31 by substantially each of the spots from the illumination apparatus 244. Separate light-emitting elements may output central rays 282, 286 to spots 284, 288 respectively from two different positions in the source or at the same angle for spots at infinity. In one embodiment, the light-emitting elements are divided into three groups, each group with a different colour temperature, for example from three different interlaced arrays of light-emitting elements. The spot profiles of each group are substantially identical, although within a group the elements may have different spot functions as shown in FIG. 30b. During the daytime, the colour temperature (white light spectral distribution) may be modified to give a bluer colour while in the evening the colour temperature may reduce, representing warmer colours. The illumination apparatus may thus produce different colours of emission that use different spectral distributions of white emission. Such an arrangement is difficult to reproduce with known systems as the eye is very sensitive to variations in colour temperature across the spot plane with small numbers of light-emitting elements. In this embodiment, many individual light sources are used so that the intensity profile for each colour can advantageously be more easily matched across the spot 284, 288 as small errors from individual light-emitting elements are not directly visible.

Such an arrangement may further be achieved by selecting light-emitting elements from across a non-uniform monolithic light-emitting element wafer 4 as shown in FIG. 32. Such a wafer has a change in colour temperature with radial position 296 for example. Thus the colour temperature of light-emitting element 290 will be different from 292 and 294. The final colour temperature of spots can be selected by tuning the output with calibrated output chromaticity. As the spots overlap, advantageously the variation of colour with position is minimised. Alternatively, the phosphor composition may be varied across the aperture of the light-emitting element array so that for example three different phosphor coating layers with different emission wavelengths or thicknesses are positioned across the array, in a similar manner to that shown in FIG. 14b.

Figure 33A:
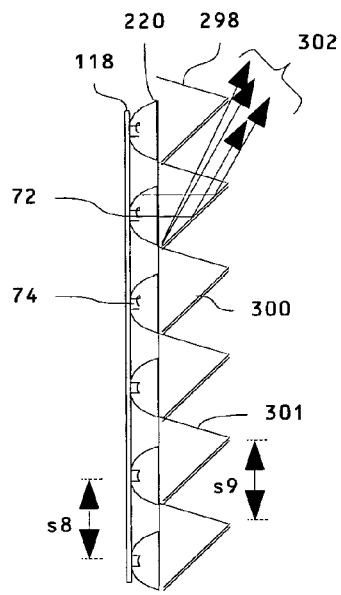
FIG. 33*a* shows a prismatic light directing apparatus in cooperation with an array illumination apparatus.

FIG. 33a shows a further embodiment wherein an uplighter (or downlighter) is formed by combining the directional light source comprising light-emitting element elements 72, 74, substrate 118, and optical element array 220 with an array of light deflection prisms 298. Thus prism elements 298 are aligned with the output aperture of the optical elements to provide deflection of the light emitted by the light-emitting elements and redirected by the optical element array 220. The prism elements 298 have a pitch s9 in a first direction and output apertures of the optical element array 220 have a pitch s8 in a first direction and the pitch of the prism elements s9 is substantially the same as the pitch s9 of the output apertures of the optical element array in said first direction. Advantageously, the microscopic optical element array 220 of the present invention can be fabricated with substantially the same techniques as the prism array so that the pitch of the two elements can be closely matched.

Light rays from light source 72 are incident on the internal prism surface 300 at which they undergo total internal reflection or reflection from a metal layer and are output at the surface 301. The light rays are then directed close to parallel to the surface of the luminaire in ray bundle 302. Such an arrangement advantageously can be flat mounted on a wall and used to illuminate surfaces not normal to the output of the optical element array 220, such as ceilings and floors. The prism elements are thus arranged to deflect the light such as to provide an uplighter (or inverted, as a downlighter). The user will not see significant light from the ray bundle 302 so the glare of the source in the forward direction is minimised. Such a source can be achieved with low profile and has high efficiency and can conveniently be mounted on walls with minimal or no recess.

Figures 33B, 34:
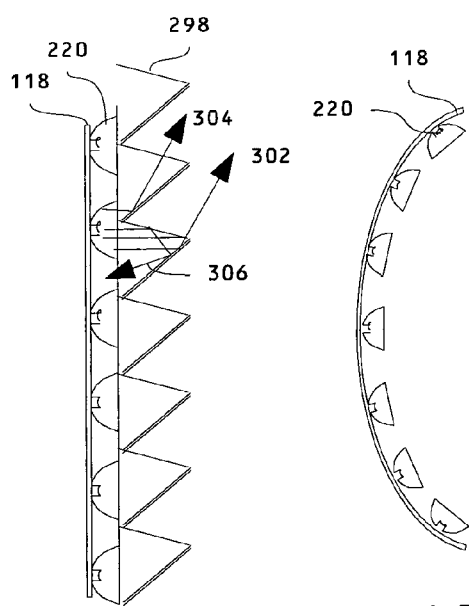
FIG. 33*b* shows the illumination errors that may occur with a prismatic light directing apparatus.
FIG. 34 shows a curved illumination array apparatus.

By way of comparison, FIG. 33b shows the difficulty that can be encountered with light-emitting element arrays and optical element arrays that do not have the precision of the microscopic arrays of the present embodiments. If the source separation and alignment to the prism elements is not well controlled, then the output illumination direction will be different across the width of the source and not matched to the input aperture of the prism array. While rays 302 and 304 are correctly outputted, rays 306 can be internally reflected at the output facet of the prism array. Such rays will be absorbed in the structure, or may be emitted at undesirable angles. Further, the brightness of the illumination profile will vary across its area, providing non-ideal illumination profiles.

Figure 35:
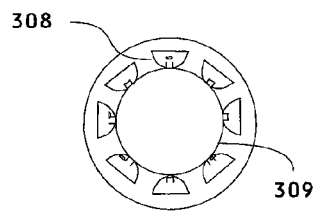
FIG. 35 shows a circular illumination array apparatus.
Figure 36:
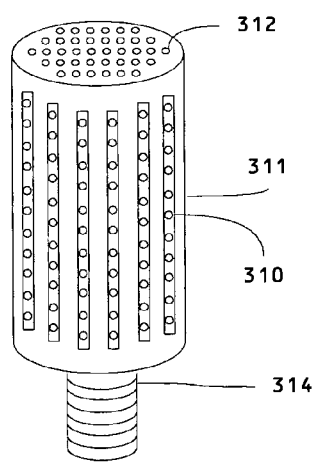
FIG. 36 shows a luminaire.
Figure 37:
FIG. 37 shows a deformable illumination array apparatus.

FIG. 34 shows that if a curved substrate 118 is used then more complex illumination devices can be constructed with a modified directional output. Further, devices can be formed such as circular light-emitting elements 308 on supporting substrate 309 shown in FIG. 35 or light bulb type arrangements as shown in FIG. 36 comprising electrical fittings, strip elements 310, support substrate 311 and area elements 312 and electrical fitting 314. Such a bulb can incorporate a further diffuser where necessary, although such a diffuser will reduce efficiency. As discussed previously, the separation of the light-emitting elements can be adjusted to be below the resolution threshold of the eye for cases in which the bulb can be seen directly. In a further embodiment as shown in FIG. 37, the substrate 118 can be formed from a deformable material such that the direction of output of the device can be varied after fabrication. In this manner, advantageously the optimum light distribution in an environment can be controlled by mechanical arrangement of the array of lights, in order to achieve the most flexible lighting arrangement. Such an arrangement can advantageously be formed by the thin devices embodiments. Such elements can advantageously be used to provide luminaire functions but with low profiles. Such elements can be combined with other luminaire designs such as tubes or further reflectors. Advantageously, with a low profile, such elements can be fitted to rooms where otherwise it would not be possible, or it would be costly to fit recessed luminaires.

Figure 38:
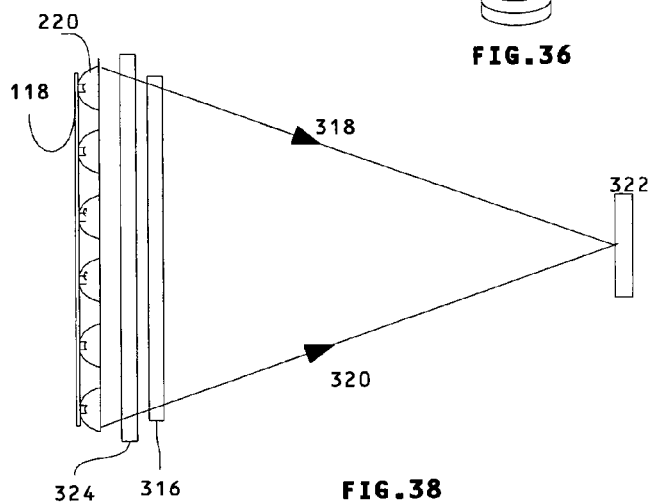
FIG. 38 shows a privacy display apparatus.

FIG. 38 shows a display backlight of a further embodiment. The illumination apparatus comprising substrate 118 with mounted light-emitting elements and microscopic optical element array, 220 is arranged to direct light through a transmissive display device 316 along rays for example 318, 320 to a common viewing region 322 so as to provide a pupillated privacy function. If an observer's eyes are in the region 322 then the display can be seen, while if the observer's eyes are outside the region 322 then no image can be seen on the display. Such an arrangement advantageously achieves an efficient privacy display with high uniformity and low backlight thickness. Advantageously, such elements can also be combined with layers 324 such as brightness enhancement films, reflective films and diffusers to provide high brightness and uniformity backlights with increased levels of gain (directionality) and high efficiency of coupling of light in the forward direction compared to conventional backlights. Multiple arrays can be arranged so that the area of the backlight is scaled.

Figure 39:
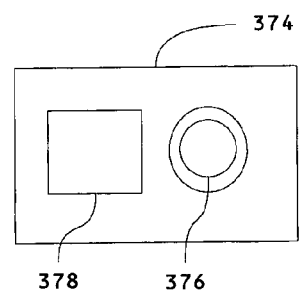
FIG. 39 shows a camera flash light apparatus.

The illumination arrays can be used in a wide variety of devices requiring thin, directional light sources with high efficiency such as flash lights for cameras and cell phones as shown in FIG. 39. Cell phone 374 has a camera lens 376 surrounded by an illumination array 378 forming a flash light. Advantageously, the output of the illumination array can be matched to the capture angle of the capture lens so that the light is efficiently directed. The low thickness of the elements is particularly advantageous for mobile applications, and the array can be formed into a surface of the device, while achieving high uniformity and directionality.

Figure 40:
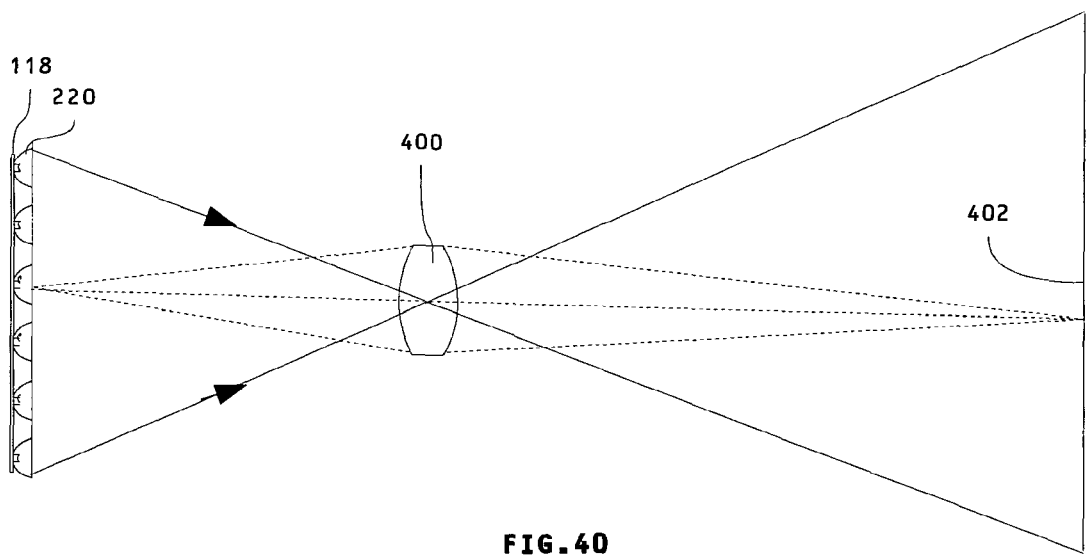
FIG. 40 shows a projection illumination apparatus

FIG. 40 shows an embodiment of a projection illumination apparatus, using the illumination apparatus comprising substrate 118 with mounted light-emitting elements and optical element array, 220 of the present embodiments. Each light-emitting element and optical element directs light towards the entrance pupil of a projection lens 400 to optimise coupling efficiency through the system. In turn, the projection lens 400 directs light from each position in the array to a corresponding position in the far field, for example a wall 402. Thus a projection lens 400 is arranged to receive light from at least some of the output apertures of the optical element array 220 and to provide an image 402 of the respective output apertures. Advantageously the illumination array of the present embodiments has relatively high resolution compared to known light source arrays, so that some display function can be incorporated in the output of the system, for example for dappled lighting, emergency signage, directed lighting or product placement applications. An optional transmissive spatial light modulator (not shown) can be inserted between the light source and the projection lens to provide an increased illumination spot resolution, but with lower efficiency.

Figure 41:
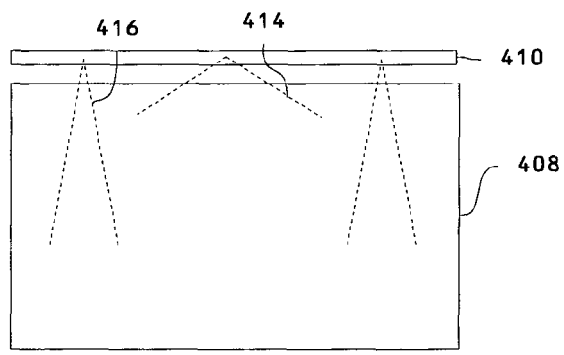
FIG. 41 shows an edge lit waveguide backlight apparatus.
Figure 42:
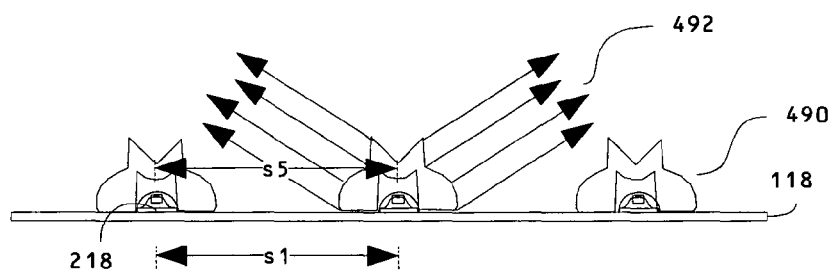
FIG. 42 shows an annular output type illumination array apparatus.

FIG. 41 shows in plan view an embodiment comprising a waveguide backlight for illuminating for example a liquid crystal display. A waveguide 408 is illuminated along one side by an illumination element comprising light sources and aligned light directing elements. The directionality of the light sources can be adjusted so that some sources have a narrow divergence 416 to direct light to the far side of the waveguide while other sources have wide divergence 414 to illuminate regions close to the light source. In this manner, the area and uniformity of the light source can be increased. FIG. 42 shows an embodiment in which a microscopic "bat-wing" catadioptric optical element array 490 is used with output rays 492 in a solid angle in an annular ring rather than in a single forward direction. Such elements advantageously achieve very thin structures and higher uniformity compared to prior art devices and so are well suited to illumination of large area panels with high uniformity. Such structures can also be used for addressable backlights, for instance to increase display contrast.

In the above embodiments, the light-emitting elements of the array of light-emitting elements are LEDs. However, this need not be the case, and in other embodiments other types of light-emitting elements may be used, for example electroluminescent elements.

In addition to the foregoing embodiments, additional embodiments of the invention include, but are not limited to aligning refractive structures with at least some of the optical elements of the optical array and the light-emitting elements of the non-monolithic array of light-emitting elements and the non-monolithic array of light-emitting elements and the array of optical elements are aligned such that a specific point within the area of the input aperture of an optical element is aligned with a specific point within the area of a respective light-emitting element, the specific point within the area of the input aperture is the optical centre of the input aperture, the specific point within the area of the light-emitting element is the centre of mass of the light emitting area of the light-emitting element, the alignment of the specific points is within a tolerance of plus or minus 50% of the maximum width or diameter of the light emitting elements, the alignment of the specific points is within a tolerance of plus or minus 25% of the maximum width or diameter of the light emitting elements.

Also, additional embodiments of the invention include, but are not limited to forming the monolithic array of light-emitting elements comprises using an interferometric stage, forming the array of optical elements comprises using an interferometric stage.

In addition, additional embodiments of the invention include, but are not limited to some of the light-emitting elements have different shapes of light emitting aperture to others of the light-emitting elements, arranged to provide a more uniform output beam shape, some of the light-emitting elements have different orientations of light emitting aperture to others of the light-emitting elements, arranged to provide a more uniform output beam shape, some of the light-emitting elements have different shapes of light emitting aperture to others of the light-emitting elements, arranged to allow provision of a switchable output beam shape in cooperation with switching of the respective light-emitting elements, and some of the light-emitting elements have different sizes of light emitting aperture to others of the light-emitting elements, arranged to allow provision of a switchable output beam size in cooperation with switching of the respective light-emitting elements.

Moreover, additional embodiments of the invention include, but are not limited to some of the optical elements have different size of output aperture to others of the optical elements, arranged to allow provision of a switchable output beam shape in cooperation with switching of the respective light-emitting elements, and some light-emitting elements of the non-monolithic array of light-emitting elements are not aligned with any of the optical elements of the array of optical elements, arranged to allow provision of a switchable output beam shape in cooperation with switching of the respective light-emitting elements.

According to additional embodiments, the illumination apparatus provides a high glare region and a low glare region and the light-emitting elements are driven so as to provide a display function that is visible in the low glare region, prism elements are aligned with the output aperture of the optical elements to provide deflection of the light emitted by the light-emitting elements and redirected by the optical elements, the prism elements and output apertures of the optical element array have a pitch in a first direction and the pitch of the prism elements is the same as the pitch of the output apertures of the optical element array in said first direction, the prism elements are arranged to deflect the light such as to provide an uplighter or downlighter.

Furthermore, additional embodiments include, but are not limited to the array of light-emitting elements and the array of optical elements are aligned such that a specific point within the area of the input aperture of an optical element is aligned with a specific point within the area of a respective light-emitting element, the specific point within the area of the input aperture is the optical centre of the input aperture, the specific point within the area of the light-emitting element is the centre of mass of the light emitting area of the light-emitting element, the alignment of the specific points is within a tolerance of plus or minus 50% of the maximum width or diameter of the light emitting elements, the alignment of the specific points is within a tolerance of plus or minus 25% of the maximum width or diameter of the light emitting elements.

Another embodiment of the invention includes, but is not limited to forming the monolithic wafer comprises using an interferometric stage, forming the array of optical elements comprises using an interferometric stage, and the flexibility of the array of optical elements was achieved at least in part by forming at least some of the optical elements with sacrificial elements therebetween connecting respective optical elements whilst the relative positions were being provided, and after formation at least some of the sacrificial elements were broken.

The prism elements and output apertures of the optical element array in accordance with an embodiment have a pitch in a first direction and the pitch of the prism elements is the same as the pitch of the output apertures of the optical element array in said first direction, the prism elements are arranged to deflect the light such as to provide an uplighter or downlighter.

The array of light-emitting elements in accordance with an embodiment are formed using a first and a second monolithic wafer, wherein some of the light emitting elements used in the array of light-emitting elements are from the first monolithic wafer and some of the light emitting elements used in the array of light-emitting elements are from the second monolithic wafer.

In accordance with another embodiment, an illumination apparatus is provided that includes, but is not limited to a plurality of light-emitting elements arranged in an array and a plurality of optical elements arranged in an array. The light-emitting element array is aligned with the optical element array such that the light-emitting elements are aligned with the optical elements. Each light-emitting element has a maximum width or diameter less than or equal to 300 micrometers or each light-emitting element has a maximum width or diameter less than or equal to 200 micrometers or each light-emitting element has a maximum width or diameter less than or equal to 100 micrometers, or the separation of at least two pairs of adjacent light-emitting elements within the light-emitting array is the same.

In addition, an embodiment of the invention includes, but is not limited to an orientation of at least two of the light-emitting elements within the light-emitting array is the same, there exist at least two different orientations of the light-emitting elements with respect to the orientation of the array of light-emitting elements, at least one direction the separation of the centres of the light-emitting elements is greater than twice the size of the light-emitting elements.

Furthermore, an embodiment of the invention includes, but is not limited to the light-emitting elements further comprise a light wavelength conversion layer, the colour of emission from some of the light-emitting elements is different to the colour of emission from some others of the light emitting elements, the different colours of emission use different spectral distributions of white emission the light-emitting elements are inorganic light-emitting diodes, or the light-emitting elements are organic small-molecule light-emitting diodes or organic polymer light-emitting diodes.

An apparatus is also provided in accordance with an embodiment of the invention that includes, but is not limited to at least one drive circuit arranged to control the emission of at least some of the light-emitting elements different to the others of the light emitting elements, the at least one drive circuit comprises row and column drive circuits that are arranged to individually control the emission of each light-emitting element, a controller arranged to provide a temporal variation of light output from of at least some of the light-emitting elements different from some other of the light-emitting elements so as to provide a time varying directional illumination output, or a projection lens arranged to receive light from at least some of the output apertures of the optical element array and to provide an image of the respective output apertures.

While at least one exemplary embodiment has been presented in the foregoing summary and detailed description, it should be appreciated that a vast number of variations exist. It should also be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing an exemplary embodiment, it being understood that various changes may be made in the function and arrangement of elements described in an exemplary embodiment without departing from the scope as set forth in the appended claims and their legal equivalents.

The invention claimed is:

1. A method of manufacturing an illumination apparatus; the method comprising:
   forming a monolithic array of light-emitting elements;
   selectively removing a plurality of light-emitting elements from the monolithic array in a manner that preserves the relative spatial position of the selectively removed light-emitting elements;
   forming a non-monolithic array of light-emitting elements with the selectively removed light-emitting elements by mounting the selectively removed light-emitting elements on a substrate in a manner that preserves the relative spatial position of the selectively removed light-emitting elements; and
   separately forming an integrated optical body comprising an array of catadioptric optical elements; and
   aligning the substrate comprising the non-monolithic array of light-emitting elements with the integrated body comprising the array of catadioptric optical elements;
   wherein the plurality of light-emitting elements that are selectively removed from the monolithic array are selected such that, in at least one direction, for at least one pair of the selectively removed light-emitting elements in the at least one direction, for each respective pair there is at least one respective light-emitting element that is not selected that was positioned in the monolithic array between the pair of selectively removed light-emitting elements in the at least one direction.

2. A method according to claim 1, wherein the forming of the integrated optical body comprises attaching at least the catadioptric optical elements to an optical substrate in a manner that preserves the relative spatial positions of the optical elements.

3. A method according to claim 1, wherein the forming of the integrated optical body comprises forming at least the catadioptric optical elements on an optical substrate.

4. A method according to claim 1, wherein the step of selectively removing a plurality of light-emitting elements from the monolithic array in a manner that preserves the relative spatial position of the selectively removed light-emitting elements further comprises removing the plurality of light-emitting elements from the monolithic array in a manner that preserves the relative orientation of the selectively removed light-emitting elements.

5. A method according to claim 1, wherein the non-monolithic array of light-emitting elements and the array of optical elements are aligned such that a given optical element is aligned with a respective light-emitting element.

6. A method according to claim 1, wherein the optical elements are such that an optical element of the array of optical elements that is aligned with a light-emitting element of the non-monolithic array of light-emitting elements directs light emitted by the light-emitting element into a smaller solid angle than that at which the light is emitted by the light-emitting element.

7. A method according to claim 1, wherein the area of the output aperture of at least one optical element is at least four times the area of the light emitting aperture of the respective light-emitting element with which the optical element is aligned.

8. A method according to claim 7, wherein the area of the output aperture is at least ten times the area of the respective light emitting aperture.

9. A method according to claim 1, wherein the non-monolithic array of light-emitting elements and the array of optical elements are aligned such that the input aperture of a given optical element is aligned with a respective light-emitting element;
   wherein the non-monolithic array of light-emitting elements and the array of optical elements are aligned such that a specific point within the area of the input aperture of an optical element is aligned with a specific point within the area of a respective light-emitting element;
   wherein the specific point within the area of the input aperture is the optical centre of the input aperture;
   wherein the specific point within the area of the light-emitting element is the centre of mass of the light emitting area of the light-emitting element.

10. A method according to claim 9, wherein the alignment of the specific points is within a tolerance of plus or minus 10% of the maximum width or diameter of the light emitting elements.

11. A method according to claim 1, wherein each optical element has an output aperture of maximum width or diameter less than or equal to 4 mm.

12. A method according to claim 11, wherein each optical element has an output aperture of maximum width or diameter less than or equal to 3 mm.

13. A method according to claim 12, wherein each optical element has an output aperture of maximum width or diameter less than or equal to 2 mm.

14. A method according to claim 1, wherein each light-emitting element has a maximum width or diameter less than or equal to 300 micrometers.

15. A method according to claim 14, wherein each light-emitting element has a maximum width or diameter less than or equal to 200 micrometers.

16. A method according to claim 15, wherein each light-emitting element has a maximum width or diameter less than or equal to 100 micrometers.

17. A method according to claim 1, wherein each optical element has a maximum height of less than or equal to 5 mm.

18. A method according to claim 17, wherein each optical element has a maximum height of less than or equal to 3 mm.

19. A method according to claim 18, wherein each optical element has a maximum height of less than or equal to 1.5 mm.

20. A method according to claim 1, wherein the array of optical elements is flexible.

21. A method according to claim 20, wherein the flexibility of the array of optical elements is achieved at least in part by forming at least some of the optical elements with sacrificial elements therebetween connecting respective optical elements whilst the relative positions are being provided, and after formation breaking at least some of the sacrificial elements.

22. A method according to claim 1, wherein the non-monolithic array of light-emitting elements is flexible.

23. A method according to claim 22, further comprising, after the step of aligning the non-monolithic array of light-emitting elements with the array of optical elements, bending the array of optical elements and/or the array of light-emitting elements, whereby the non-monolithic array of light-emitting elements remains aligned with the array of optical elements even if the relative positions between respective light-emitting elements and/or between respective optical elements has changed due to the bending step.

24. A method according to claim 1, further comprising forming an array of electrode connections and aligning the array of electrode connections with the non-monolithic array of light-emitting elements.

25. A method according to claim 1, wherein a combined non-monolithic array of light-emitting elements is formed from a combination of a plurality of non-monolithic arrays of light-emitting element arrays.

26. A method according to claim 1, wherein the non-monolithic array of light-emitting elements is formed using a first and a second monolithic array, wherein some of the light emitting elements used in the non-monolithic array of light-emitting elements are selectively removed from the first monolithic array of light emitting elements and some of the light emitting elements used in the non-monolithic array of light-emitting elements are selectively removed from the second monolithic array of light emitting elements.

27. An illumination apparatus, comprising:
   a plurality of light-emitting elements from a monolithic wafer mounted on a substrate and arranged in an array with their original monolithic wafer positions and orientations relative to each other preserved; and
   a separate integrated optical body comprising a plurality of catadioptric optical elements arranged in an array;
   wherein the substrate comprising the light-emitting element array is aligned with the integrated optical body comprising the catadioptric optical element array such that the light-emitting elements are aligned with the catadioptric optical elements;

wherein in at least one direction, for at least one pair of the plurality of light-emitting elements in the at least one direction, for each respective pair there was at least one respective light-emitting element in the monolithic wafer that was positioned in the monolithic wafer between the pair of light-emitting elements in the at least one direction and that is not positioned between them in the array of light-emitting elements.

28. An apparatus according to claim 27, wherein the forming of the integrated optical body having comprised attaching at least the catadioptric optical elements to an optical substrate in a manner that preserved the relative spatial positions of the optical elements.

29. An apparatus according to claim 27, wherein the forming of the integrated optical body having comprised forming at least the catadioptric optical elements on an optical substrate.

30. An apparatus according to claim 27, wherein the array of light-emitting elements and the array of optical elements are aligned such that a given optical element is aligned with a respective light-emitting element.

31. An apparatus according to claim 27, wherein the optical elements are such that an optical element of the array of optical elements that is aligned with a light-emitting element of the array of light-emitting elements directs light emitted by the light-emitting element into a smaller solid angle than that at which the light is emitted by the light-emitting element.

32. An apparatus according to claim 27, wherein the area of the output aperture of at least one optical element is at least four times the area of the light emitting aperture of the respective light-emitting element with which the optical element is aligned.

33. An apparatus according to claim 32, wherein the area of the output aperture is at least ten times the area of the respective light emitting aperture.

34. An apparatus according to claim 27, further comprising refractive structures aligned with at least some of the optical elements of the optical array and the light-emitting elements of the array of light-emitting elements.

35. An apparatus according to claim 27, wherein the array of light-emitting elements and the array of optical elements are aligned such that the input aperture of a given optical element is aligned with a respective light-emitting element;

wherein the array of light-emitting elements and the array of optical elements are aligned such that a specific point within the area of the input aperture of an optical element is aligned with a specific point within the area of a respective light-emitting element;

wherein the specific point within the area of the input aperture is the optical centre of the input aperture;

wherein the specific point within the area of the light-emitting element is the centre of mass of the light emitting area of the light-emitting element.

36. An apparatus according to claim 35, wherein the alignment of the specific points is within a tolerance of plus or minus 10% of the maximum width or diameter of the light emitting elements.

37. An apparatus according to claim 27, wherein each optical element has an output aperture of maximum width or diameter less than or equal to 4 mm.

38. An apparatus according to claim 37, wherein each optical element has an output aperture of maximum width or diameter less than or equal to 3 mm.

39. An apparatus according to claim 38, wherein each optical element has an output aperture of maximum width or diameter less than or equal to 2 mm.

40. An apparatus according to claim 27, wherein each light-emitting element has a maximum width or diameter less than or equal to 300 micrometers.

41. An apparatus according to claim 40, wherein each light-emitting element has a maximum width or diameter less than or equal to 200 micrometers.

42. An apparatus according to claim 41, wherein each light-emitting element has a maximum width or diameter less than or equal to 100 micrometers.

43. An apparatus according to claim 27, wherein each optical element has a maximum height of less than or equal to 5 mm.

44. An apparatus according to claim 43, wherein each optical element has a maximum height of less than or equal to 3 mm.

45. An apparatus according to claim 44, wherein each optical element has a maximum height of less than or equal to 1.5 mm.

46. An apparatus according to claim 27, wherein the array of optical elements is flexible.

47. An apparatus according to claim 27, wherein the array of light-emitting elements is flexible.

48. An apparatus according to claim 47, wherein, after the array of light-emitting elements was aligned with the array of optical elements, the array of optical elements and/or the array of light-emitting elements was bent, whereby the array of light-emitting elements remained aligned with the array of optical elements even if the relative positions between respective light-emitting elements and/or between respective optical elements had changed due to the bending.

49. An apparatus according to claim 27, wherein some of the light-emitting elements have different shapes of light emitting aperture to others of the light-emitting elements, arranged to provide a more uniform output beam shape.

50. An apparatus according to claim 27, wherein some of the light-emitting elements have different orientations of light emitting aperture to others of the light-emitting elements, arranged to provide a more uniform output beam shape.

51. An apparatus according to claim 27, wherein some of the light-emitting elements have different shapes of light emitting aperture to others of the light-emitting elements, arranged to allow provision of a switchable output beam shape in cooperation with switching of the respective light-emitting elements.

52. An apparatus according to claim 27, wherein some of the light-emitting elements have different sizes of light emitting aperture to others of the light-emitting elements, arranged to allow provision of a switchable output beam size in cooperation with switching of the respective light-emitting elements.

53. An apparatus according to claim 27 wherein some of the optical elements have different size of output aperture to others of the optical elements, arranged to allow provision of a switchable output beam shape in cooperation with switching of the respective light-emitting elements.

54. An apparatus according to claim 27, wherein some light-emitting elements of the array of light-emitting elements are not aligned with any of the optical elements of the array of optical elements, arranged to allow provision of a switchable output beam shape in cooperation with switching of the respective light-emitting elements.

55. An apparatus according to claim 27, wherein the illumination apparatus provides a high glare region and a low glare region and the light-emitting elements are arranged to be driven so as to provide a display function that is visible in the low glare region.

56. An apparatus according to claim 27 wherein prism elements are aligned with the output aperture of the optical elements to provide deflection of the light emitted by the light-emitting elements and redirected by the optical elements;
   wherein the prism elements and output apertures of the optical element array have a pitch in a first direction and the pitch of the prism elements is the same as the pitch of the output apertures of the optical element array in said first direction;
   wherein the prism elements are arranged to deflect the light such as to provide an uplighter or downlighter.

57. An apparatus according to claim 27, further comprising an array of electrode connections aligned with the array of light-emitting elements.

58. An apparatus according to claim 27, comprising a combined array of light-emitting elements formed from a combination of a plurality of arrays of light-emitting element arrays.

* * * * *